US012765004B2

(12) United States Patent
Shin et al.

(10) Patent No.: US 12,765,004 B2
(45) Date of Patent: Oct. 13, 2026

(54) SEMICONDUCTOR DEVICE THAT INCLUDES A MULTI-BRIDGE CHANNEL FIELD EFFECT TRANSISTOR

(71) Applicant: SAMSUNG ELECTRONICS CO., LTD., Suwon-si (KR)

(72) Inventors: Jong Min Shin, Suwon-si (KR); Heon Jong Shin, Suwon-si (KR); June Young Park, Suwon-si (KR); Jae Ran Jang, Suwon-si (KR); Sang Hee Lee, Suwon-si (KR); Kerm Rim, Suwon-si (KR); Sung Gyu Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 18/438,920

(22) Filed: Feb. 12, 2024

(65) Prior Publication Data

US 2025/0056843 A1 Feb. 13, 2025

(30) Foreign Application Priority Data

Aug. 8, 2023 (KR) ........................ 10-2023-0103325

(51) Int. Cl.
*H10D 30/43* (2025.01)
*H10D 30/01* (2025.01)
(Continued)

(52) U.S. Cl.
CPC ....... *H10D 30/6757* (2025.01); *H10D 30/014* (2025.01); *H10D 30/43* (2025.01);
(Continued)

(58) Field of Classification Search
CPC .. H10D 30/014; H10D 30/43; H10D 30/6735; H10D 30/6757; H10D 62/121;
(Continued)

(56) References Cited

U.S. PATENT DOCUMENTS 10,879,176 B2 12/2020 Lin et al.
11,217,528 B2 1/2022 Peng et al.
(Continued)

FOREIGN PATENT DOCUMENTS

KR 10-2021-0122659 A 10/2021

OTHER PUBLICATIONS

EP 1st office action and Search Report issued in corresponding application No. EP 24 167 061.1 on Sep. 25, 2024.

*Primary Examiner* — Jeff W Natalini
*Assistant Examiner* — Ian Isaac Degrasse
(74) *Attorney, Agent, or Firm* — MORGAN, LEWIS & BOCKIUS LLP

(57) ABSTRACT

A semiconductor device includes: a lower interlayer insulating layer; first and second active patterns on the lower interlayer insulating layer; a gate electrode on the first and second active patterns; a first source region on a first side of the gate electrode; a second source region on a second side of the gate electrode; a third source region on the first side of the gate electrode; a drain region on the second side of the gate electrode; a first contact adjacent to the gate electrode, and connected to the first and third source regions; a second contact adjacent to the gate electrode, and connected to the second source region; a third contact adjacent to the gate electrode, and connected to the drain region; a lower wiring layer inside the lower interlayer insulating layer; and a through via connecting the lower wiring layer with the first contact.

20 Claims, 63 Drawing Sheets

(51) Int. Cl.

| | |
|---|---|
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |
| ***H10D 84/83*** | (2025.01) |
| ***H10W 20/20*** | (2026.01) |
| ***H10W 20/43*** | (2026.01) |

(52) U.S. Cl.
CPC ....... *H10D 30/6735* (2025.01); *H10D 62/121* (2025.01); *H10D 62/151* (2025.01); *H10D 64/017* (2025.01); *H10D 84/0149* (2025.01); *H10D 84/038* (2025.01); *H10D 84/83* (2025.01); *H10W 20/20* (2026.01); *H10W 20/43* (2026.01)

(58) Field of Classification Search
CPC ............... H10D 62/151; H10D 64/017; H10D 84/0149; H10D 84/038; H10D 84/83; H10W 20/20; H10W 20/43
See application file for complete search history.

(56) References Cited

U.S. PATENT DOCUMENTS

| | | | | |
|---|---|---|---|---|
| 11,387,181 | B2 | 7/2022 | Chou et al. | |
| 2019/0067290 | A1 | 2/2019 | Wang et al. | |
| 2020/0303551 | A1 * | 9/2020 | Chen .................. | H10D 30/6211 |
| 2021/0028112 | A1 * | 1/2021 | Kim ..................... | H10D 86/215 |
| 2021/0043649 | A1 * | 2/2021 | Park ....................... | H10B 43/27 |
| 2021/0134721 | A1 * | 5/2021 | Chiang ................ | H10D 62/121 |
| 2021/0305381 | A1 * | 9/2021 | Chiang .............. | H10D 30/6729 |
| 2021/0343645 | A1 | 11/2021 | Peng et al. | |
| 2021/0358902 | A1 | 11/2021 | Kang et al. | |
| 2022/0237359 | A1 | 7/2022 | Peng et al. | |
| 2022/0399224 | A1 | 12/2022 | Xie et al. | |
| 2023/0178549 | A1 * | 6/2023 | Suk ...................... | H10D 64/017 257/369 |
| 2023/0215927 | A1 | 7/2023 | Jin et al. | |
| 2024/0072117 | A1 | 2/2024 | Kim et al. | |

* cited by examiner

SEMICONDUCTOR DEVICE THAT INCLUDES A MULTI-BRIDGE CHANNEL FIELD EFFECT TRANSISTOR

CROSS-REFERENCE TO RELATED APPLICATION

This application claims priority under 35 USC § 119 to Korean Patent Application No. 10-2023-0103325 filed on Aug. 8, 2023 in the Korean Intellectual Property Office, the disclosure of which is incorporated by reference herein in its entirety.

TECHNICAL FIELD

Embodiments of present inventive concept relate to a semiconductor device and more particularly, to a semiconductor device that includes a multi-bridge channel field effect transistor (MBCFET™).

DISCUSSION OF THE RELATED ART

As one of the scaling techniques for increasing a density of an integrated circuit device, a multi-gate transistor for forming a silicon body, which has a fin shape or a nanowire shape on a substrate, and for forming a gate on a surface of the silicon body has been under development.

Since this multi-gate transistor uses a three-dimensional channel, it may be easy to scale the multi-gate transistor. In addition, even though a gate length of the multi-gate transistor is not increased, a current control capability may be increased. In addition, a short channel effect (SCE) in which a potential of a channel region is affected by a drain voltage may be effectively suppressed.

SUMMARY

According to embodiments of the present inventive concept, a semiconductor device includes: a lower interlayer insulating layer; first and second active patterns extended in a first horizontal direction on the lower interlayer insulating layer, wherein the second active pattern is spaced apart from the first active pattern in a second horizontal direction that is different from the first horizontal direction; a gate electrode extended in the second horizontal direction on the first and second active patterns; a first source region disposed on a first side of the gate electrode and disposed on the first active pattern; a second source region disposed on a second side of the gate electrode, which opposes the first side of the gate electrode in the first horizontal direction, and disposed on the first active pattern; a third source region disposed on the first side of the gate electrode and disposed on the second active pattern; a drain region disposed on the second side of the gate electrode and disposed on the second active pattern; a first contact extended on the first side of the gate electrode in the second horizontal direction, wherein the first contact is connected to each of the first and third source regions; a second contact extended on the second side of the gate electrode in the second horizontal direction, wherein the second contact is connected to the second source region; a third contact extended on the second side of the gate electrode in the second horizontal direction, wherein the third contact is spaced apart from the second contact in the second horizontal direction, and the third contact is connected to the drain region; a lower wiring layer disposed inside the lower interlayer insulating layer, wherein the lower wiring layer extends in the first horizontal direction between the first active pattern and the second active pattern, wherein at least a portion of the lower wiring layer protrudes from an upper surface of the lower interlayer insulating layer in a vertical direction below the first contact; and a through via disposed between the first source region and the third source region, wherein the through via connects the lower wiring layer with the first contact, wherein each of the second contact and the third contact is electrically insulated from the lower wiring layer between the second source region and the drain region.

According to embodiments of the present inventive concept, a semiconductor device includes: a lower interlayer insulating layer; first and second active patterns extended in a first horizontal direction on the lower interlayer insulating layer, wherein the second active pattern is spaced apart from the first active pattern in a second horizontal direction that is different from the first horizontal direction; first to fourth gate electrodes extended in the second horizontal direction on the first and second active patterns, wherein the first to fourth gate electrodes are sequentially spaced apart from one another in the first horizontal direction; a gate cut extended in the first horizontal direction between the first active pattern and the second active pattern, wherein the gate cut separates each of the first to fourth gate electrodes in the second horizontal direction; a first source region disposed on the first active pattern and between the first gate electrode and the second gate electrode; a second source region disposed on the first active pattern and between the second gate electrode and the third gate electrode; a first drain region disposed on the first active pattern and between the third gate electrode and the fourth gate electrode; a third source region disposed on the second active pattern and between the first gate electrode and the second gate electrode; a second drain region disposed on the second active pattern and between the second gate electrode and the third gate electrode; a fourth source region disposed on the second active pattern and between the third gate electrode and the fourth gate electrode; a first contact extended in the second horizontal direction between the first gate electrode and the second gate electrode, wherein the first contact is connected to each of the first and third source regions; a second contact extended in the second horizontal direction between the second gate electrode and the third gate electrode, wherein the second contact is connected to the second source region; a third contact extended in the second horizontal direction between the third gate electrode and the fourth gate electrode, wherein the third contact is connected to the first drain region; a fourth contact extended in the second horizontal direction between the second gate electrode and the third gate electrode, wherein the fourth contact is spaced apart from the second contact in the second horizontal direction, and the fourth contact is connected to the second drain region; a fifth contact extended in the second horizontal direction between the third gate electrode and the fourth gate electrode, wherein the fifth contact is spaced apart from the third contact in the second horizontal direction, and the fifth contact is connected to the fourth source region; a lower wiring layer disposed inside the lower interlayer insulating layer, wherein the lower wiring layer is extended in the first horizontal direction below the gate cut; and a through via crossing the gate cut, wherein the through via connects the lower wiring layer with the first contact, wherein each of the second contact and the fourth contact is electrically insulated from the lower wiring layer between the second gate electrode and the third gate electrode, and wherein each of the third contact and the fifth contact is electrically insulated from the lower wiring layer between the third gate electrode and the fourth gate electrode.

According to embodiments of the present inventive concept, a semiconductor device includes: a lower interlayer insulating layer; first and second active patterns extended in a first horizontal direction on the lower interlayer insulating layer, the second active pattern spaced apart from the first active pattern in a second horizontal direction different from the first horizontal direction; a first plurality of nanosheets stacked to be spaced apart from each other in a vertical direction on the first active pattern; a second plurality of nanosheets stacked to be spaced apart from each other in the vertical direction on the second active pattern; a gate electrode extended in the second horizontal direction, which is different from the first horizontal direction, on the first and second active patterns, wherein the gate electrode at least partially surrounds the first and second plurality of nanosheets; a gate cut extended in the first horizontal direction between the first active pattern and the second active pattern, wherein the gate cut separates the gate electrode in the second horizontal direction; a first source region disposed on a first side of the gate electrode on the first active pattern; a second source region disposed on a second side of the gate electrode, which opposes the first side of the gate electrode in the first horizontal direction, on the first active pattern; a third source region disposed on the first side of the gate electrode on the second active pattern; a drain region disposed on the second side of the gate electrode on the second active pattern; a first contact extended on the first side of the gate electrode in the second horizontal direction, wherein the first contact is connected to each of the first and third source regions; a second contact extended on the second side of the gate electrode in the second horizontal direction, wherein the second contact is connected to the second source region; a third contact extended on the second side of the gate electrode in the second horizontal direction, wherein the third contact is spaced apart from the second contact in the second horizontal direction, and is connected to the drain region; a lower wiring layer disposed inside the lower interlayer insulating layer, wherein the lower wiring layer extends in the first horizontal direction between the first active pattern and the second active pattern, wherein at least a portion of the lower wiring layer protrudes from an upper surface of the lower interlayer insulating layer in the vertical direction below the first contact, wherein the lower wiring layer overlaps each of the first and second active patterns in the vertical direction; a through via disposed between the first source region and the third source region, wherein the through via is integrally formed with the first contact, wherein the through via crosses the gate cut, and connects the lower wiring layer with the first contact; a lower insulating layer disposed between the upper surface of the lower interlayer insulating layer and a lower surface of each of the first and second active patterns, the lower insulating layer being in contact with the lower wiring layer; and a field insulating layer disposed on the upper surface of the lower interlayer insulating layer, wherein the field insulating layer at least partially surrounds each of sidewalls of the lower insulating layer, sidewalls of the first active pattern and sidewalls of the second active pattern, wherein each of the second contact and the third contact is electrically insulated from the lower wiring layer between the second source region and the drain region, and wherein an upper surface of the lower insulating layer is formed to be higher than an upper surface of the lower wiring layer between the first source region and the third source region.

BRIEF DESCRIPTION OF THE DRAWINGS

The above and features of the present inventive concept will become more apparent by describing in detail embodiments thereof with reference to the attached drawings, in which.

DETAILED DESCRIPTION OF THE EMBODIMENTS

As shown, a semiconductor device according to embodiments of the present inventive concept includes a multi-bridge channel field effect transistor (MBCFET™) that includes nanosheets by way of example, but the present inventive concept is not limited thereto. In embodiments of the present inventive concept, the semiconductor device may include a fin-type transistor (FinFET), which includes a channel region of a fin-pattern shape, a tunneling transistor (tunneling FET) or a three-dimensional (3D) transistor. In addition, the semiconductor device according to embodiments of the present inventive concept may include a bipolar junction transistor or a laterally diffused metal oxide semiconductor (LDMOS) transistor.

Hereinafter, the semiconductor device according to embodiments of the present inventive concept will be described with reference to FIGS. 1 to 7.

Figure 1:
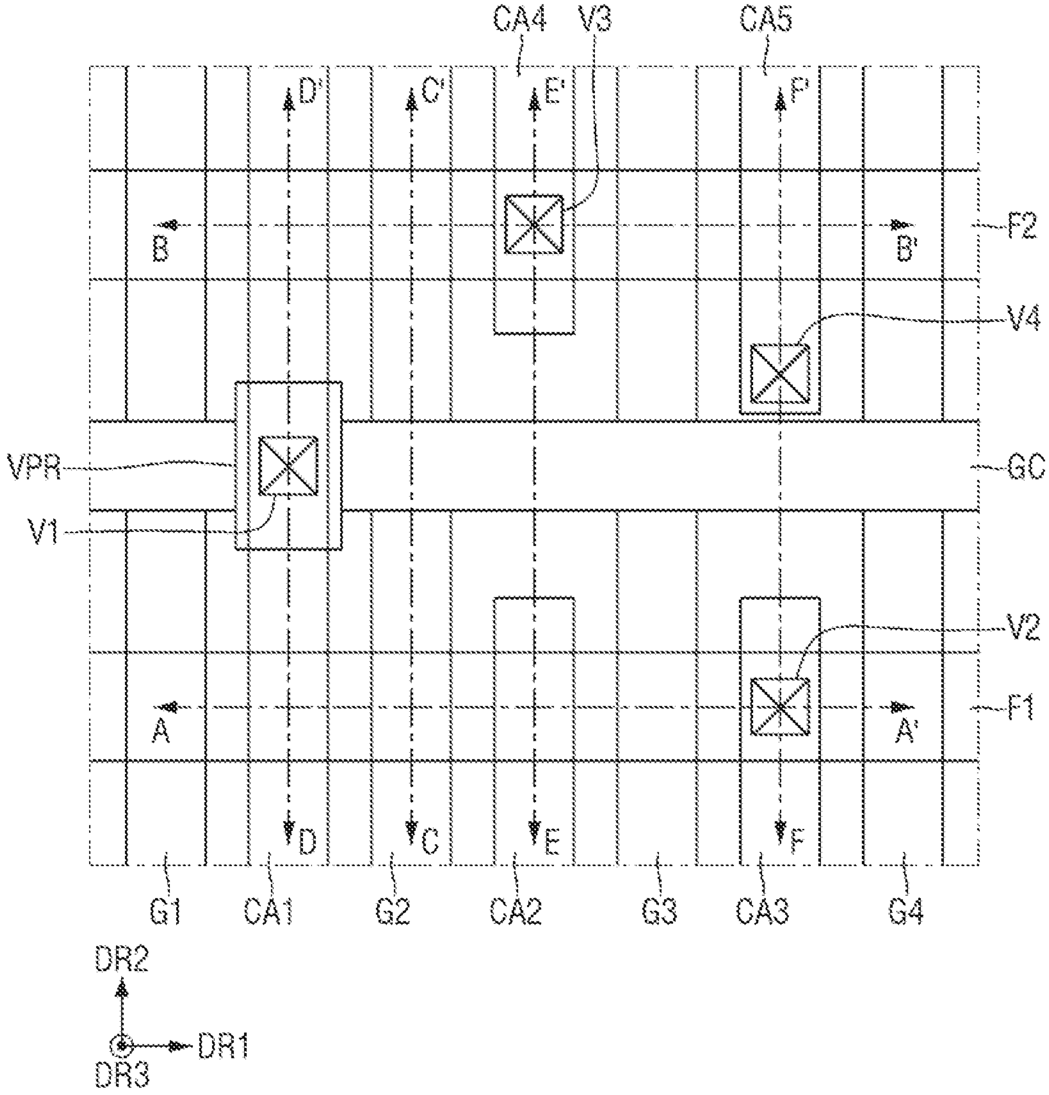
FIG. 1 is a layout view illustrating a semiconductor device according to embodiments of the present inventive concept.
Figure 2:
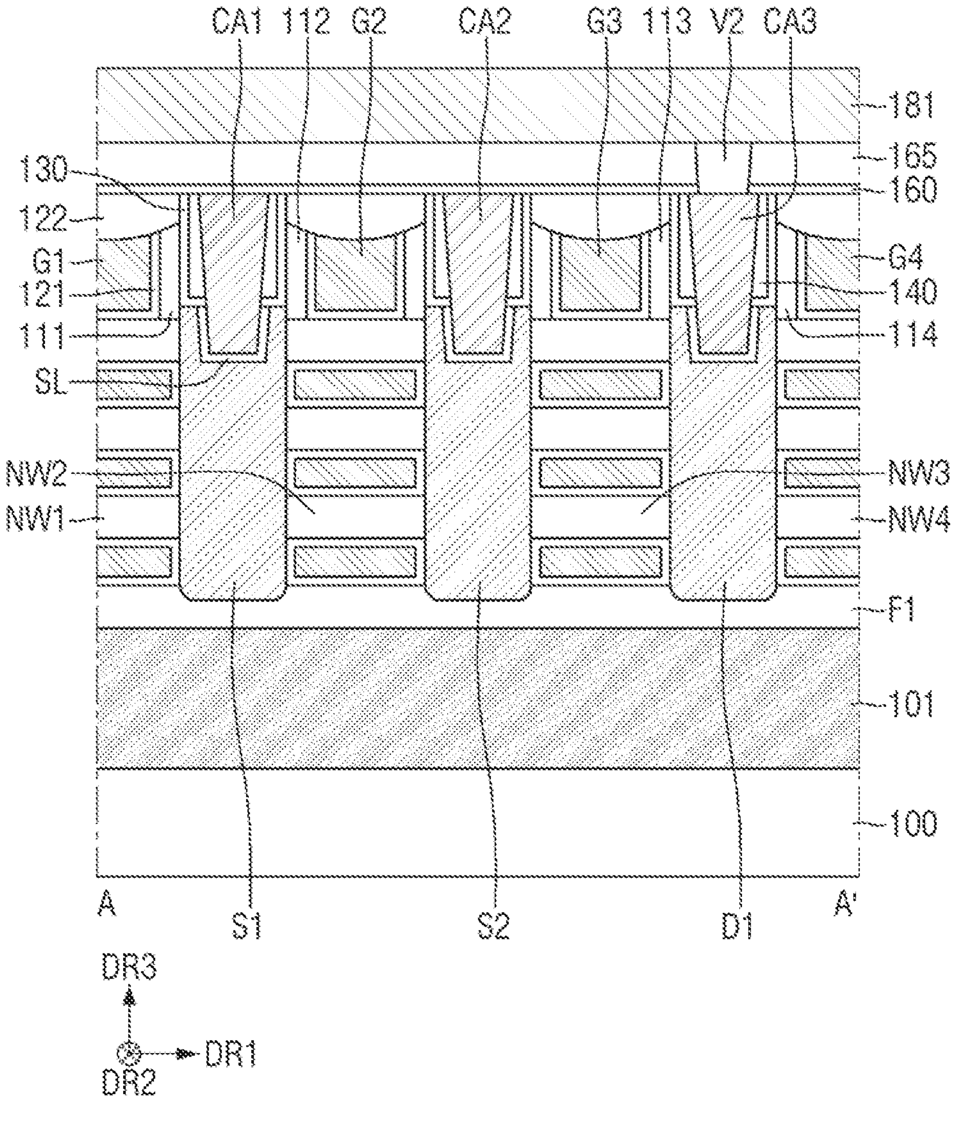
FIG. 2 is a cross-sectional view taken along line A-A' of FIG. 1.
Figure 3:
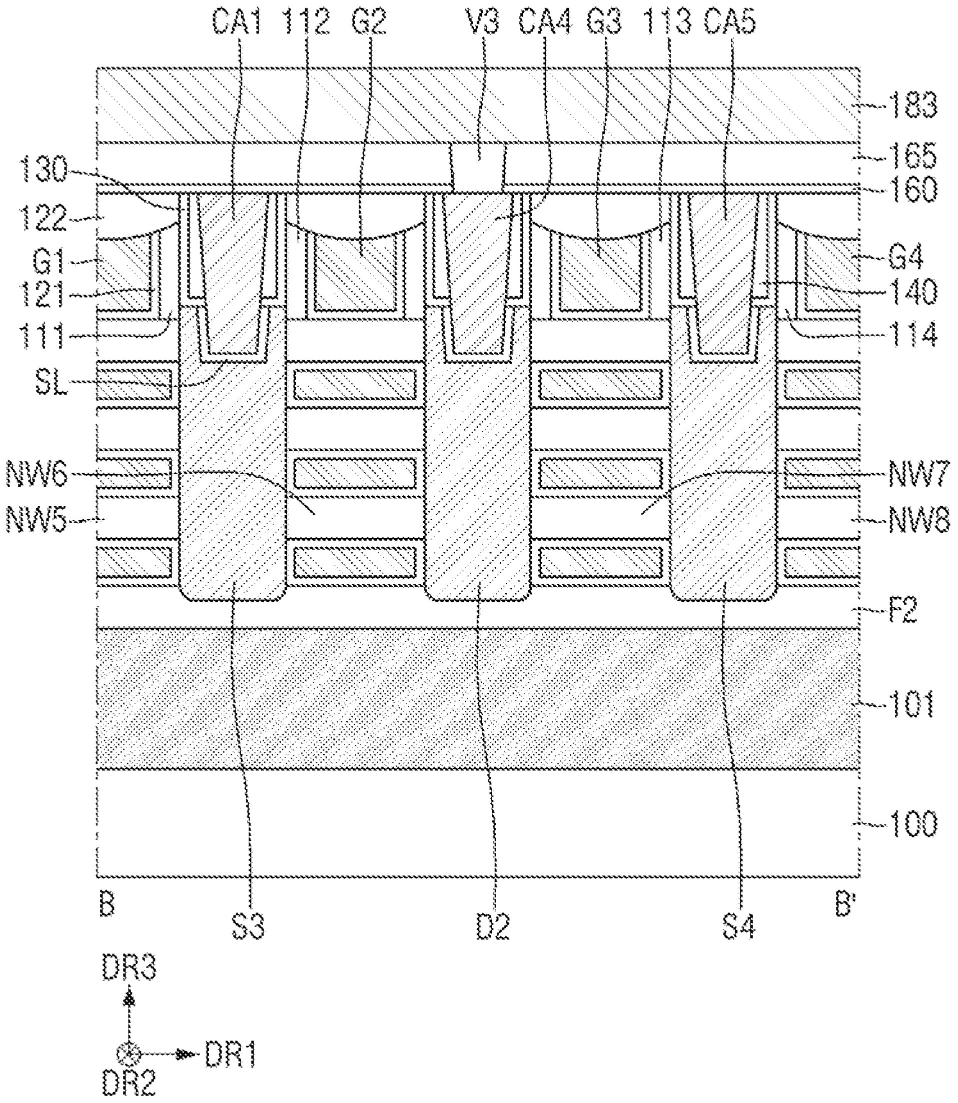
FIG. 3 is a cross-sectional view taken along line B-B' of FIG. 1.
Figure 4:
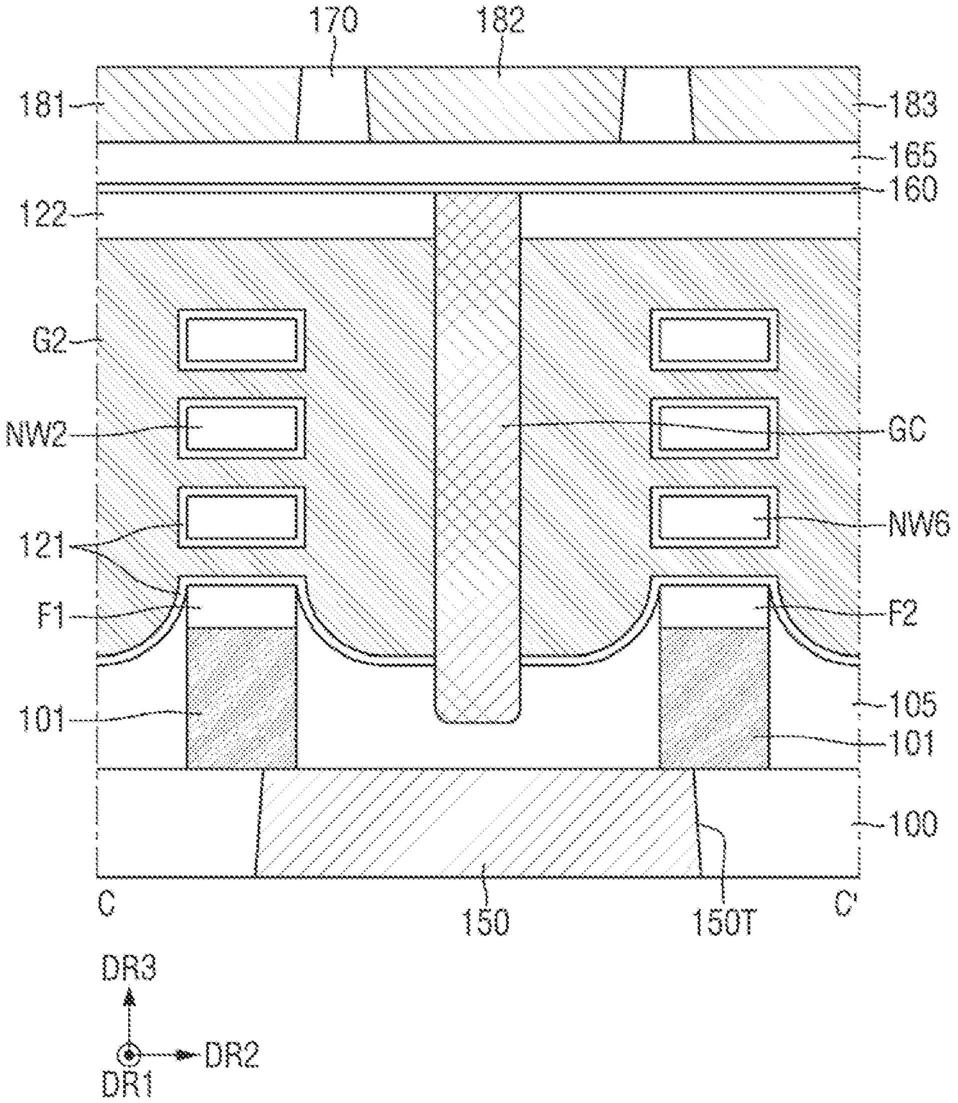
FIG. 4 is a cross-sectional view taken along line C-C' of FIG. 1.
Figure 5:
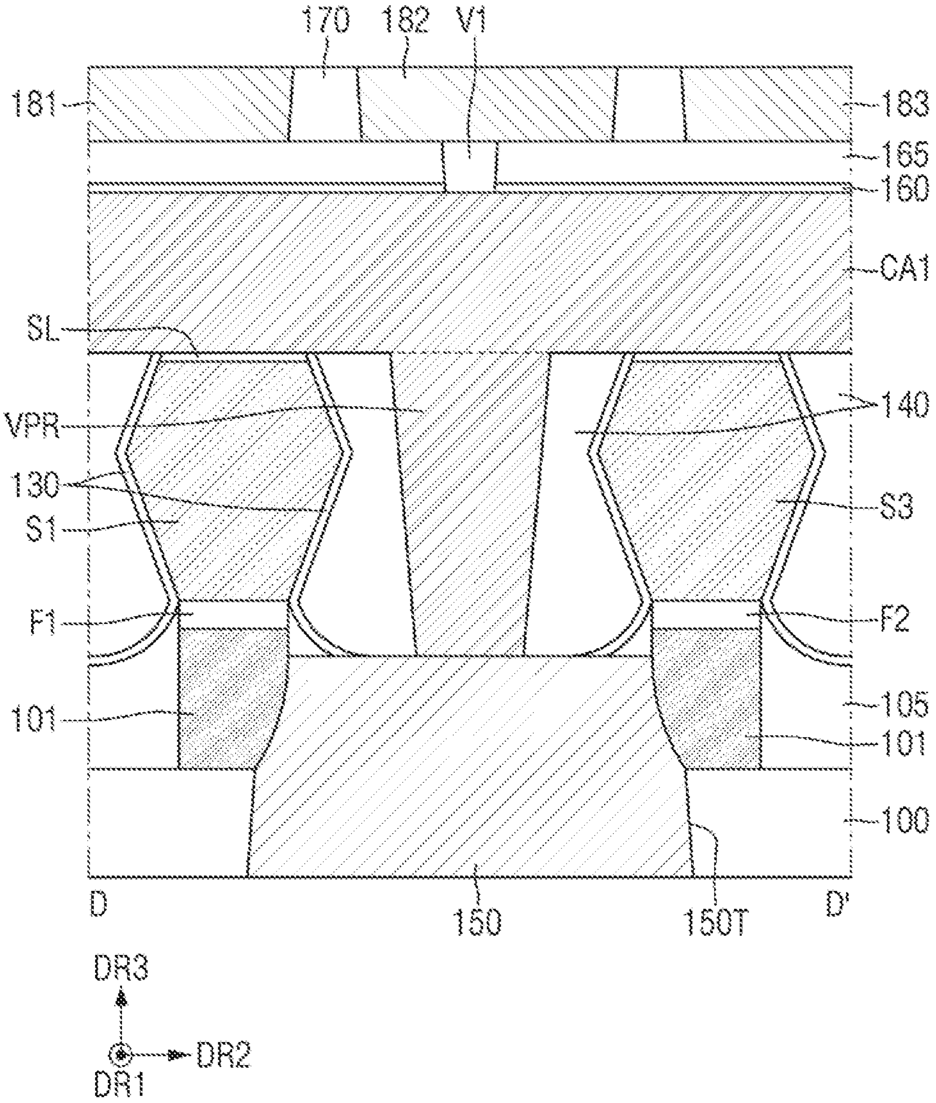
FIG. 5 is a cross-sectional view taken along line D-D' of FIG. 1.
Figure 6:
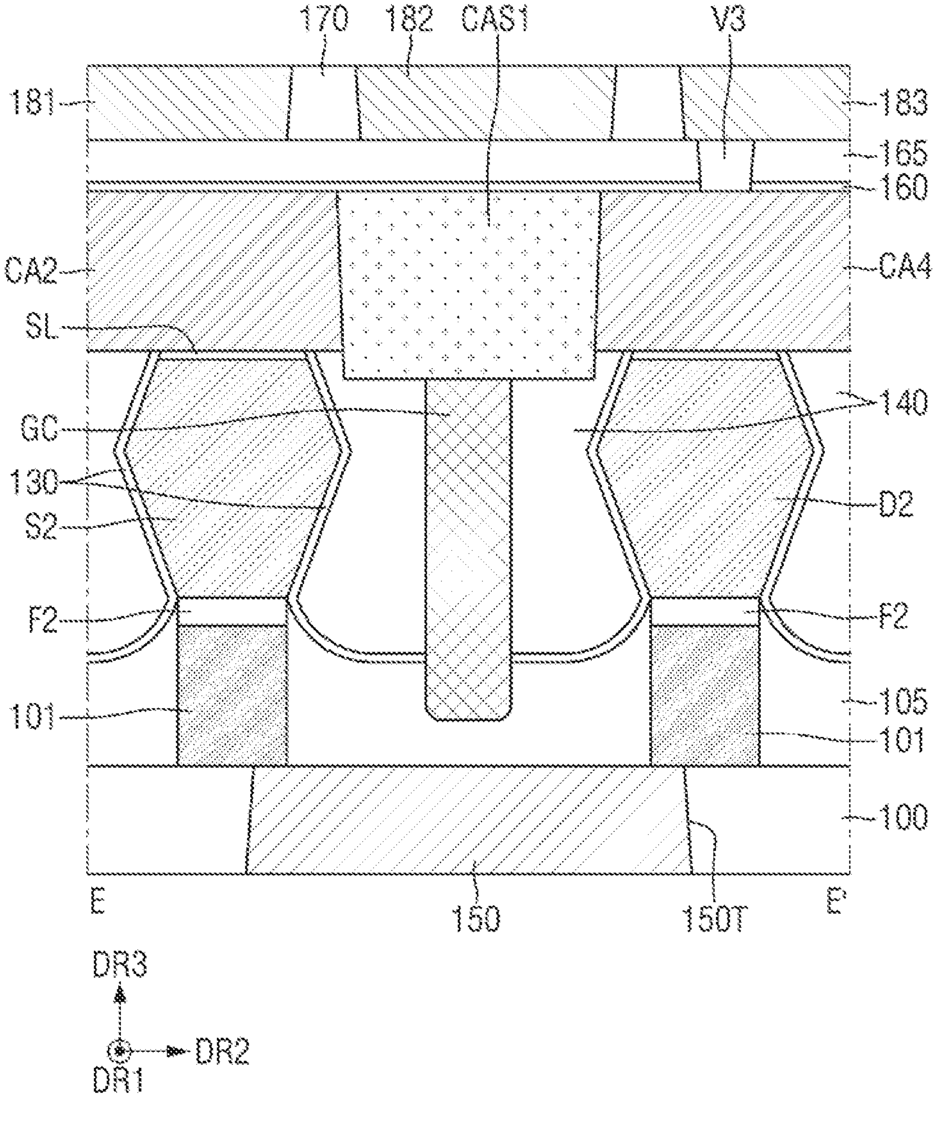
FIG. 6 is a cross-sectional view taken along line E-E' of FIG. 1.
Figure 7:
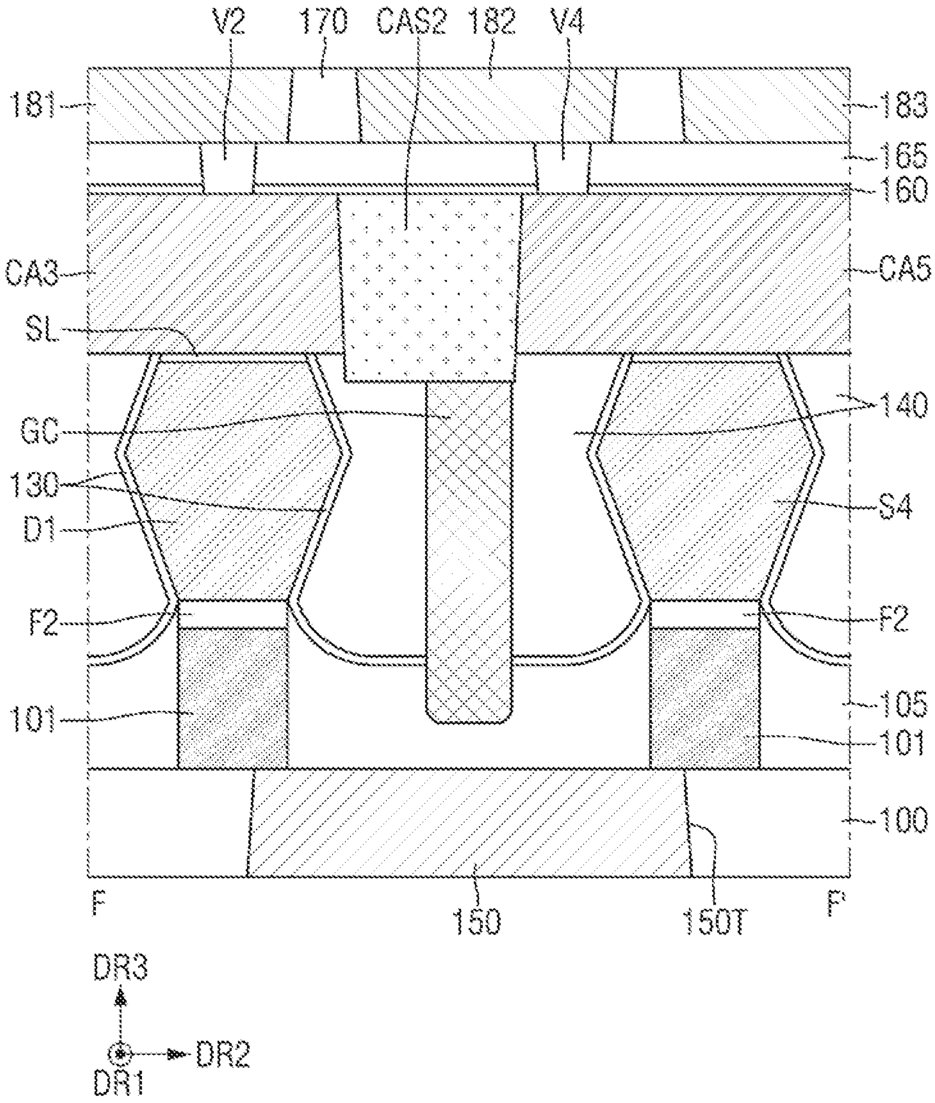
FIG. 7 is a cross-sectional view taken along line F-F' of FIG. 1.

FIG. 1 is a layout view illustrating a semiconductor device according to embodiments of the present inventive concept. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIG. 5 is a cross-sectional view taken along line D-D' of FIG. 1. FIG. 6 is a cross-sectional view taken along line E-E' of FIG. 1. FIG. 7 is a cross-sectional view taken along line F-F' of FIG. 1.

Referring to FIGS. 1 to 7, the semiconductor device according to embodiments of the present inventive concept includes a lower interlayer insulating layer 100, first and second active patterns F1 and F2, a lower insulating layer 101, a field insulating layer 105, first to eighth plurality of nanosheets NW1 to NW8, first to fourth gate electrodes G1 to G4, first to fourth gate spacers 111 to 114, a gate insulating layer 121, a capping pattern 122, first to fourth source regions S1 to S4, first and second drain regions D1 and D2, a first etch stop layer 130, a first upper interlayer insulating layer 140, a gate cut GC, first to fifth contacts CA1 to CA5, first and second contact separation layers CAS1 and CAS2, a through via VPR, a lower wiring layer 150, a second etch stop layer 160, a second upper interlayer insulating layer 165, first to fourth vias V1 to V4, a third upper interlayer insulating layer 170, and first to third upper wiring layers 181, 182 and 183.

The lower interlayer insulating layer 100 may include at least one of, for example, silicon oxide, silicon nitride, silicon oxynitride or a low dielectric constant material. The low dielectric contact material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyClo-TetraSiloxane (OMCTS), HexaMethylDiSiloxane (HMDS), TriMethylSilyl Borate (TMSB), DiAcetoxyDitertiaryButoxySiloxane (DADBS), TriMethylSilil Phosphate (TMSP), PolyTetraFluoroEthylene (PTFE), Tonen SilaZen (TOSZ), Fluoride Silicate Glass (FSG), polyimide nanofoams such as polypropylene oxide, Carbon Doped silicon Oxide (CDO), Organo Silicate Glass (OSG), SiLK, Amorphous Fluorinated Carbon, silica aerogels, silica xerogels, mesoporous silica or their combination, but the present inventive concept is not limited thereto.

Hereinafter, each of a first horizontal direction DR1 and a second horizontal direction DR2 may be a direction that is parallel with an upper surface of the lower interlayer insulating layer 100. The second horizontal direction DR2 may be defined as a direction that is different from the first horizontal direction DR1. A vertical direction DR3 may be a direction that is perpendicular to each of the first horizontal direction DR1 and the second horizontal direction DR2. For example, the vertical direction DR3 may be a direction that is perpendicular to the upper surface of the lower interlayer insulating layer 100.

Each of the first and second active patterns F1 and F2 may be extended in the first horizontal direction DR1 on the upper surface of the lower interlayer insulating layer 100. The second active pattern F2 may be spaced apart from the first active pattern F1 in the second horizontal direction DR2. For example, each of the first and second active patterns F1 and F2 may include silicon, but the present inventive concept is not limited thereto. In embodiments of the present inventive concept, each of the first and second active patterns F1 and F2 may include silicon germanium, indium antimonide, lead telluride, indium arsenide, indium phosphide, gallium arsenide or gallium antimonide.

The lower insulating layer 101 may be disposed on the upper surface of the lower interlayer insulating layer 100. The lower insulating layer 101 may protrude in the vertical direction DR3 from the upper surface of the lower interlayer insulating layer 100. For example, the lower insulating layer 101 may be disposed between the upper surface of the lower interlayer insulating layer 100 and a lower surface of the first active pattern F1. The lower insulating layer 101 may be disposed between the upper surface of the lower interlayer insulating layer 100 and a lower surface of the second active pattern F2. For example, sidewalls of the lower insulating layer 101 may be aligned with each of sidewalls of the first active pattern F1 and sidewalls of the second active pattern F2. The lower insulating layer 101 may include an insulating material. The lower insulating layer 101 may include a material different from that of the field insulating layer 105. For example, the lower insulating layer 101 may include a material having an etch selectivity with respect to the field insulating layer 105.

The field insulating layer 105 may be disposed on the upper surface of the lower interlayer insulating layer 100. The field insulating layer 105 may at least partially surround the sidewalls of the lower insulating layer 101, the sidewalls of the first active pattern F1 and the sidewalls of the second active pattern F2. For example, at least a portion of each of the first and second active patterns F1 and F2 may protrude in the vertical direction DR3 more than an upper surface of the field insulating layer 105, but the present inventive concept is not limited thereto. The field insulating layer 105 may include, for example, an oxide layer, a nitride layer, an oxynitride layer or their combination layer.

The first to fourth plurality of nanosheets NW1, NW2, NW3 and NW4 may be disposed on the first active pattern F1, respectively. The second plurality of nanosheets NW2 may be spaced apart from the first plurality of nanosheets NW1 in the first horizontal direction DR1. The third plurality of nanosheets NW3 may be spaced apart from the second plurality of nanosheets NW2 in the first horizontal direction DR1. The fourth plurality of nanosheets NW4 may be spaced apart from the third plurality of nanosheets NW3 in the first horizontal direction DR1.

The fifth to eighth plurality of nanosheets NW5, NW6, NW7 and NW8 may be disposed on the second active pattern F2, respectively. The sixth plurality of nanosheets NW6 may be spaced apart from the fifth plurality of nanosheets NW5 in the first horizontal direction DR1. The seventh plurality of nanosheets NW7 may be spaced apart from the sixth plurality of nanosheets NW6 in the first horizontal direction DR1. The eighth plurality of nanosheets NW8 may be spaced apart from the seventh plurality of nanosheets NW7 in the first horizontal direction DR1. Each of the fifth to eighth plurality of nanosheets NW5, NW6, NW7 and NW8 may be spaced apart from each of the first to fourth plurality of nanosheets NW1, NW2, NW3 and NW4 in the second horizontal direction DR2.

Each of the first to eighth plurality of nanosheets NW1 to NW8 may include a plurality of nanosheets that are stacked and spaced apart from each other in the vertical direction DR3. Although FIGS. 1 to 3 show that each of the first to eighth plurality of nanosheets NW1 to NW8 includes three nanosheets that are stacked and spaced apart from one another in the vertical direction DR3, this is for convenience of description and the present inventive concept is not limited thereto. In embodiments of the present inventive concept, each of the first to eighth plurality of nanosheets NW1 to NW8 may include four or more nanosheets stacked and spaced apart from one another in the vertical direction DR3.

For example, each of the first to eighth plurality of nanosheets NW1 to NW8 may include silicon (Si), but the present inventive concept is not limited thereto. In embodiments of the present inventive concept, each of the first to eighth plurality of nanosheets NW1 to NW8 may include silicon germanium (SiGe).

Each of the first to fourth gate electrodes G1, G2, G3 and G4 may be extended in the second horizontal direction DR2 on the first active pattern F1, the second active pattern F2 and the field insulating layer 105. The second gate electrode G2 may be spaced apart from the first gate electrode G1 in the first horizontal direction DR1. The third gate electrode G3 may be spaced apart from the second gate electrode G2 in the first horizontal direction DR1. The fourth gate electrode G4 may be spaced apart from the third gate electrode G3 in the first horizontal direction DR1.

The first gate electrode G1 may at least partially surround each of the first plurality of nanosheets NW1 and the fifth plurality of nanosheets NW5. The second gate electrode G2 may at least partially surround each of the second plurality of nanosheets NW2 and the sixth plurality of nanosheets NW6. The third gate electrode G3 may at least partially surround each of the third plurality of nanosheets NW3 and the seventh plurality of nanosheets NW7. The fourth gate electrode G4 may at least partially surround each of the fourth plurality of nanosheets NW4 and the eighth plurality of nanosheets NW8.

Each of the first to fourth gate electrodes G1, G2, G3 and G4 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or their combination. Each of the first to fourth gate electrodes G1, G2, G3 and G4 may include a conductive metal oxide, a conductive metal oxynitride or the like, and may include an oxidized form of the above-described materials.

The first gate spacer 111 may be extended in the second horizontal direction DR2 and along both sidewalls of the first gate electrode G1 on an upper surface of the uppermost nanosheet of the first plurality of nanosheets NW1, an upper surface of the uppermost nanosheet of the fifth plurality of nanosheets NW5 and the field insulating layer 105. The second gate spacer 112 may be extended in the second horizontal direction DR2 and along both sidewalls of the second gate electrode G2 on an upper surface of the uppermost nanosheet of the second plurality of nanosheets NW2, an upper surface of the uppermost nanosheet of the sixth plurality of nanosheets NW6 and the field insulating layer 105. The third gate spacer 113 may be extended in the second horizontal direction DR2 and along both sidewalls of the third gate electrode G3 on an upper surface of the uppermost nanosheet of the third plurality of nanosheets NW3, an upper surface of the uppermost nanosheet of the seventh plurality of nanosheets NW7 and the field insulating layer 105. The fourth gate spacer 114 may be extended in the second horizontal direction DR2 and along both sidewalls of the fourth gate electrode G4 on an upper surface of the uppermost nanosheet of the fourth plurality of nanosheets NW4, an upper surface of the uppermost nanosheet of the eighth plurality of nanosheets NW8 and the field insulating layer 105.

Each of the first to fourth gate spacers 111, 112, 113 and 114 may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or a combination thereof, but the present inventive concept is not limited thereto.

The gate insulating layer 121 may be disposed between the first gate electrode G1 and the first gate spacer 111. The gate insulating layer 121 may be disposed between the second gate electrode G2 and the second gate spacer 112. The gate insulating layer 121 may be disposed between the third gate electrode G3 and the third gate spacer 113. The gate insulating layer 121 may be disposed between the fourth gate electrode G4 and the fourth gate spacer 114. The gate insulating layer 121 may be disposed on the sidewalls of each of the first to fourth gate electrodes G1, G2, G3 and G4 in the first horizontal direction DR1. The gate insulating layer 121 may be disposed between each of the first to fourth gate electrodes G1, G2, G3 and G4 and each of the first and second active patterns F1 and F2. The gate insulating layer 121 may be disposed between each of the first to fourth gate electrodes G1, G2, G3 and G4 and the field insulating layer 105. For example, the gate insulating layer 121 may extend along a side surface of the first to fourth gate electrodes G1, G2, G3, and G4.

The gate insulating layer 121 may be disposed between the first gate electrode G1 and each of the first and fifth plurality of nanosheets NW1 and NW5. The gate insulating layer 121 may be disposed between the second gate electrode G2 and each of the second and sixth plurality of nanosheets NW2 and NW6. The gate insulating layer 121 may be disposed between the third gate electrode G3 and each of the third and seventh plurality of nanosheets NW3 and NW7. The gate insulating layer 121 may be disposed between the fourth gate electrode G4 and each of the fourth and eighth plurality of nanosheets NW4 and NW8.

The gate insulating layer 121 may include at least one of, for example, silicon oxide, silicon oxynitride, silicon nitride, and/or a high dielectric constant material having a dielectric constant greater than that of the silicon oxide. The high dielectric constant material may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

The semiconductor device according to embodiments of the present inventive concept may include a negative capacitance (NC) FET based on a negative capacitor. For example, the gate insulating layer 121 may include a ferroelectric material layer having ferroelectric characteristics and a paraelectric material layer having paraelectric characteristics.

The ferroelectric material layer may have a negative capacitance, and the paraelectric material layer may have a positive capacitance. For example, when two or more capacitors are connected in series, and the capacitance of each capacitor has a positive value, the total capacitance is more reduced than the capacitance of each individual capacitor. In addition, when at least one of capacitances of two or more capacitors connected in series has a negative value, the total capacitance may have a positive value and may be greater than an absolute value of each individual capacitance.

When a ferroelectric material layer having a negative capacitance and a paraelectric material layer having a positive capacitance are connected in series, the total capacitance value of the ferroelectric material layer and the paraelectric material layer, which are connected in series, may be increased. Based on the total capacitance value that is increased, a transistor having a ferroelectric material layer may have a subthreshold swing (SS) less than about 60 mV/decade at about a room temperature.

The ferroelectric material layer may have ferroelectric characteristics. The ferroelectric material layer may include at least one of, for example, hafnium oxide, hafnium zirconium oxide, barium strontium titanium oxide, barium titanium oxide, and/or lead zirconium titanium oxide. In this case, for example, the hafnium zirconium oxide may be a material doped with zirconium (Zr) in hafnium oxide. For another example, the hafnium zirconium oxide may be a compound of hafnium (Hf), zirconium (Zr) and oxygen (O).

The ferroelectric material layer may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). A type of the dopant included in the ferroelectric material layer may be varied depending on the ferroelectric material of the ferroelectric material layer.

For example, when the ferroelectric material layer includes hafnium oxide, the dopant included in the ferroelectric material layer may include at least one of gadolinium (Gd), silicon (Si), zirconium (Zr), aluminum (Al), and/or yttrium (Y).

When the dopant is aluminum (Al), the ferroelectric material layer may include aluminum of about 3 at % to about 8 at % (atomic %). In this case, a ratio of the dopant may be a ratio of aluminum to a sum of hafnium and aluminum.

When the dopant is silicon (Si), the ferroelectric material layer may include silicon of about 2 at % to about 10 at %. When the dopant is yttrium (Y), the ferroelectric material layer may include yttrium of about 2 at % to about 10 at %. When the dopant is gadolinium (Gd), the ferroelectric material layer may include gadolinium of about 1 at % to about 7 at %. When the dopant is zirconium (Zr), the ferroelectric material layer may include zirconium of about 50 at % to about 80 at %.

The paraelectric material layer may have paraelectric characteristics. The paraelectric material layer may include at least one of, for example, silicon oxide or metal oxide having a high dielectric constant. For example, the metal oxide included in the paraelectric material layer may include, but is not limited to, at least one of hafnium oxide, zirconium oxide, and/or aluminum oxide.

The ferroelectric material layer and the paraelectric material layer may include the same material as each other. Although the ferroelectric material layer has ferroelectric characteristics, the paraelectric material layer might not have ferroelectric characteristics. For example, when the ferroelectric material layer and the paraelectric material layer include hafnium oxide, a crystal structure of hafnium oxide included in the ferroelectric material layer is different from that of hafnium oxide included in the paraelectric material layer.

The ferroelectric material layer may have a thickness having ferroelectric characteristics. The thickness of the ferroelectric material layer may be, for example, about 0.5 nm to about 10 nm, but the present inventive concept is not limited thereto. Since a threshold thickness indicating ferroelectric characteristics may be varied depending on each ferroelectric material, the thickness of the ferroelectric material layer may be varied depending on the ferroelectric material.

For example, the gate insulating layer 121 may include one ferroelectric material layer. For example, the gate insulating layer 121 may include a plurality of ferroelectric material layers that are spaced apart from each other. The gate insulating layer 121 may have a stacked layer structure in which a plurality of ferroelectric material layers and a plurality of paraelectric material layers are alternately stacked on one another.

The capping pattern 122 may be extended in the second horizontal direction DR2 and may be disposed on each of the first to fourth gate electrodes G1 to G4, the gate insulating layer 121 and the first to fourth gate spacers 111, 112, 113 and 114. The capping pattern 122 may include at least one of, for example, silicon nitride (SiN), silicon oxynitride (SiON), silicon oxide ($SiO_2$), silicon carbonitride (SiCN), silicon oxycarbonitride (SiOCN) or a combination thereof, but the present inventive concept is not limited thereto.

The first source region S1 may be disposed on the first active pattern F1 and may be disposed between the first gate electrode G1 and the second gate electrode G2. The second source region S2 may be disposed on the first active pattern F1 and may be disposed between the second gate electrode G2 and the third gate electrode G3. The first drain region D1 may be disposed on the first active pattern F1 and may be disposed between the third gate electrode G3 and the fourth gate electrode G4. The third source region S3 may be disposed on the second active pattern F2 and may be disposed between the first gate electrode G1 and the second gate electrode G2. The second drain region D2 may be disposed on the second active pattern F2 and may be disposed between the second gate electrode G2 and the third gate electrode G3. The fourth source region S4 may be disposed on the second active pattern F2 and may be disposed between the third gate electrode G3 and the fourth gate electrode G4.

For example, each of the first to fourth source regions S1, S2, S3 and S4 and the first and second drain regions D1 and D2 may be in contact with the gate insulating layer 121, but the present inventive concept is not limited thereto. In embodiments of the present inventive concept, an inner spacer may be disposed between each of the first to fourth source regions S1, S2, S3 and S4 and the first and second drain regions D1 and D2 and the gate insulating layer 121. In this case, the inner spacer may include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or a combination thereof.

The first upper interlayer insulating layer 140 may cover each of the first to fourth source regions S1, S2, S3 and S4 and the first and second drain regions D1 and D2 and may be disposed on the field insulating layer 105. The first upper interlayer insulating layer 140 may at least partially surround sidewalls of each of the first to fourth gate spacers 111, 112, 113 and 114 and the capping pattern 122. For example, an upper surface of the first upper interlayer insulating layer 140 may be formed on the same plane as an upper surface of the capping pattern 122, but the present inventive concept is not limited thereto. The first upper interlayer insulating layer 140 may include at least one of, for example, silicon oxide, silicon nitride, silicon oxynitride and/or a low dielectric constant material.

The first etch stop layer 130 may be disposed between each of the first to fourth source regions S1, S2, S3 and S4 and the first and second drain regions D1 and D2 and the first upper interlayer insulating layer 140. The first etch stop layer 130 may be disposed between the sidewalls of each of the first to fourth gate spacers 111, 112, 113 and 114 and the capping patterns 122, and may be disposed between the sidewalls of each of the first to fourth gate spacers 111, 112, 113 and 114 and the first upper interlayer insulating layer 140. The first etch stop layer 130 may be disposed between the field insulating layer 105 and the first upper interlayer insulating layer 140. For example, the first etch stop layer 130 may be formed to be conformal. The first etch stop layer 130 may include at least one of, for example, aluminum oxide, aluminum nitride, hafnium oxide, zirconium oxide, silicon oxide, silicon nitride, silicon oxynitride and/or a low dielectric constant material.

The gate cut GC may be extended in the first horizontal direction DR1 between the first active pattern F1 and the second active pattern F2. For example, the gate cut GC may separate the first to fourth gate electrodes G1, G2, G3 and G4 from one another in the second horizontal direction DR2. For example, the gate cut GC may be extended from the upper surface of the capping pattern 122 to the inside of the field insulating layer 105. For example, the gate cut GC may extend from the upper surface of the first upper interlayer insulating layer 140 to the inside of the field insulating layer 105.

For example, the gate cut GC may be disposed between the first source region S1 and the third source region S3, between the second source region S2 and the second drain region D2 and between the first drain region D1 and the fourth source region S4. For example, the gate cut GC may be spaced apart from each of the first to fourth source regions S1, S2, S3 and S4 and the first and second drain regions D1 and D2 in the second horizontal direction DR2. The gate cut GC may include one of, for example, silicon nitride (SiN), silicon oxynitride (SiON), silicon oxide ($SiO_2$), silicon oxycarbonitride (SiOCN) or a combination thereof, but the present inventive concept is not limited thereto.

Each of the first to fifth contacts CA1 to CA5 may be disposed inside the first upper interlayer insulating layer 140. The first contact CA1 may be extended in the second horizontal direction DR2 and may be disposed between the first gate electrode G1 and the second gate electrode G2. The first contact CA1 may cross the gate cut GC. For example, the gate cut GC is not disposed in a portion where the first contact CA1 is disposed. For example, the first contact CA1 may separate the gate cut GC in the first horizontal direction DR1. The first contact CA1 may be connected to each of the first source region S1 and the third source region S3.

The second contact CA2 may be extended in the second horizontal direction DR2 and may be disposed between the second gate electrode G2 and the third gate electrode G3. For example, the gate cut GC may be spaced apart from the second contact CA2 in the second horizontal direction DR2. The second contact CA2 may be connected to the second source region S2. The third contact CA3 may be extended in the second horizontal direction DR2 and may be disposed between the third gate electrode G3 and the fourth gate electrode G4. For example, the gate cut GC may be spaced apart from the third contact CA3 in the second horizontal direction DR2. The third contact CA3 may be connected to the first drain region DI.

The fourth contact CA4 may be extended in the second horizontal direction DR2 and may be disposed between the second gate electrode G2 and the third gate electrode G3. The fourth contact CA4 may be spaced apart from the second contact CA2 in the second horizontal direction DR2. For example, the fourth contact CA4 may be spaced apart from the gate cut GC in the second horizontal direction DR2. The fourth contact CA4 may be connected to the second drain region D2. The fifth contact CA5 may be extended in the second horizontal direction DR2 and may be disposed between the third gate electrode G3 and the fourth gate electrode G4. The fifth contact CA5 may be spaced apart from the third contact CA3 in the second horizontal direction DR2. For example, the fifth contact CA5 may be spaced apart from the gate cut GC in the second horizontal direction DR2. The fifth contact CA5 may be connected to the fourth source region S4.

For example, each of the first to fifth contacts CA1 to CA5 may be formed of a single layer. Each of the first to fifth contacts CA1 to CA5 may include a conductive material. For example, each of the first to fifth contacts CA1 to CA5 may include at least one of aluminum (Al), copper (Cu), tungsten (W), cobalt (Co), ruthenium (Ru) and/or molybdenum (Mo).

A silicide layer SL may be disposed between the first contact CA1 and each of the first source region S1 and the third source region S3. The silicide layer SL may be disposed between the second contact CA2 and the second source region S2. The silicide layer SL may be disposed between the third contact CA3 and the first drain region D1. The silicide layer SL may be disposed between the fourth contact CA4 and the second drain region D2. The silicide layer SL may be disposed between the fifth contact CA5 and the fourth source region S4. The silicide layer SL may include, for example, a metal silicide material.

Each of the first contact separation layer CAS1 and the second contact separation layer CAS2 may be disposed inside the first upper interlayer insulating layer 140. For example, each of the first contact separation layer CAS1 and the second contact separation layer CAS2 may be disposed on the gate cut GC. For example, an upper surface of each of the first contact separation layer CAS1 and the second contact separation layer CAS2 may be formed on the same plane as the upper surfaces of the second contact CA2, the third contact CA3, the fourth contact CA4, and the fifth contact CA5. For example, each of the first contact separation layer CAS1 and the second contact separation layer CAS2 may partially penetrate the first upper interlayer insulating layer 140.

The first contact separation layer CAS1 may be disposed between the second contact CA2 and the fourth contact CA4. The first contact separation layer CAS1 may separate the second contact CA2 and the fourth contact CA4 from each other in the second horizontal direction DR2. The second contact separation layer CAS2 may be disposed between the third contact CA3 and the fifth contact CA5. The second contact separation layer CAS2 may separate the third contact CA3 and the fifth contact CA5 from each other in the second horizontal direction DR2. For example, a width of the first contact separation layer CAS1 in the second horizontal direction DR2 may be greater than that of the second contact separation layer CAS2 in the second horizontal direction DR2.

For example, a lower surface of each of the first contact separation layer CAS1 and the second contact separation layer CAS2 may be formed to be lower than lower surfaces of each of the first to fifth contacts CA1 to CA5, but the present inventive concept is not limited thereto. Each of the first contact separation layer CAS1 and the second contact separation layer CAS2 may include a material different from that of the first upper interlayer insulating layer 140. For example, each of the first contact separation layer CAS1 and the second contact separation layer CAS2 may include at least one of, for example, silicon nitride (SiN), silicon oxycarbonitride (SiOCN), silicon boron carbonitride (SiBCN), silicon carbonitride (SiCN), silicon oxynitride (SiON) or a combination thereof.

The through via VPR may be disposed inside the first upper interlayer insulating layer 140. The through via VPR may be disposed between the first gate electrode G1 and the second gate electrode G2. The through via VPR may be disposed between the first source region S1 and the third source region S3. Sidewalls of the through via VPR may be spaced apart from the first etch stop layer 130, which is disposed on sidewalls of each of the first source region S1 and the third source region S3 in the second horizontal direction DR2, in the second horizontal direction DR2. The through via VPR may be disposed below the first contact CA1. The through via VPR may be connected to the lower surface of the first contact CA1. For example, an upper surface of the through via VPR may be in contact with the lower surface of the first contact CA1.

For example, the through via VPR may cross the gate cut GC. The through via VPR is not disposed between the second source region S2 and the second drain region D2. In addition, the through via VPR is not disposed between the first drain region D1 and the fourth source region S4. For example, the through via VPR may be disposed between the first source region S1 and the third source region S3.

For example, the through via VPR may be integrally formed with the first contact CA1. For example, the through via VPR may be formed of a single layer. For example, the through via VPR may include the same material as that of the first contact CA1. For example, the through via VPR may include at least one of, for example, aluminum (Al), copper (Cu), tungsten (W), cobalt (Co), ruthenium (Ru) or molybdenum (Mo). For example, as the through via VPR approaches to the lower surface of the first contact CA1, the width of the through via VPR in the second horizontal direction DR2 may be continuously increased.

A lower wiring trench 150T may be formed inside the lower interlayer insulating layer 100. The lower wiring trench 150T may be extended in the first horizontal direction DR1 between the first active pattern F1 and the second active pattern F2. For example, at least a portion of the lower wiring trench 150T may be formed inside the field insulating layer 105. For example, the lower wiring trench 150T may be formed inside each of the lower interlayer insulating layer 100 and the field insulating layer 105 and may be between the first source region S1 and the third source region S3. For example, both sidewalls of the lower wiring trench 150T in the second horizontal direction DR2 may be defined by the lower interlayer insulating layer 100 and the lower insulating layer 101 between the first source region S1 and the third source region S3. For example, in the remaining region except the region between the first source region S1 and the third source region S3, the lower wiring trench 150T is not formed inside the field insulating layer 105, but the present inventive concept is not limited thereto.

The lower wiring layer 150 may be disposed inside the lower wiring trench 150T. The lower wiring layer 150 may be extended in the first horizontal direction DR1 and may be disposed between the first active pattern F1 and the second active pattern F2. For example, the lower wiring layer 150 may overlap the gate cut GC in the vertical direction DR3. For example, the lower wiring layer 150 may overlap the lower insulating layer 101 in the vertical direction DR3. For example, the lower wiring layer 150 may overlap each of the first active pattern F1 and the second active pattern F2 in the vertical direction DR3. For example, the lower wiring layer 150 may be spaced apart from each of the first active pattern F1 and the second active pattern F2.

For example, at least a portion of the lower wiring layer 150 may protrude in the vertical direction DR3 from the upper surface of the lower interlayer insulating layer 100 between the first source region S1 and the third source region S3. For example, the upper surface of the lower insulating layer 101 may be formed to be higher than the upper surface of the lower wiring layer 150 that is between the first source region S1 and the third source region S3. For example, sidewalls of the lower wiring layer 150 may be in contact with those of the lower insulating layer 101 between the first source region S1 and the third source region S3. For example, the upper surface of the lower wiring layer 150 may be in contact with the field insulating layer 105, the first etch stop layer 130, the first upper interlayer insulating layer 140 and the through via VPR between the first source region S1 and the third source region S3.

For example, the upper surface of the lower wiring layer 150 may be formed on the same plane as the upper surface of the lower interlayer insulating layer 100 below each of the first to fourth gate electrodes G1, G2, G3 and G4. The upper surface of the lower wiring layer 150 may be formed on the same plane as the upper surface of the lower interlayer insulating layer 100 between the second source region S2 and the second drain region D2. The upper surface of the lower wiring layer 150 may be formed on the same plane as the upper surface of the lower interlayer insulating layer 100 between the first drain region D1 and the fourth source region S4.

For example, the upper surface of the lower wiring layer 150 may be in contact with each of a lower surface of the lower insulating layer 101 and a lower surface of the field insulating layer 105 below each of the first to fourth gate electrodes G1, G2, G3 and G4. The upper surface of the lower wiring layer 150 may be in contact with each of the lower surface of the lower insulating layer 101 and the lower surface of the field insulating layer 105 between the first drain region D1 and the fourth source region S4.

For example, the upper surface of the lower wiring layer 150 may be spaced apart from the gate cut GC in the vertical direction DR3 and may be disposed below each of the first to fourth gate electrodes G1, G2, G3 and G4. The upper surface of the lower wiring layer 150 may be spaced apart from the gate cut GC in the vertical direction DR3 between the second source region S2 and the second drain region D2. The upper surface of the lower wiring layer 150 may be spaced apart from the gate cut GC in the vertical direction DR3 between the first drain region D1 and the fourth source region S4.

The lower wiring layer 150 may include a conductive material. For example, the lower wiring layer 150 may be a power rail or a ground rail. Although FIG. 4 to FIG. 7 show that the lower wiring layer 150 is formed of a single layer, the present inventive concept is not limited thereto. In embodiments of the present inventive concept, the lower wiring layer 150 may be formed of a multi-layer. For example, a width of the lower wiring layer 150 in the second horizontal direction DR2 may be continuously increased as the lower wiring layer 150 approaches the lower surface of the lower interlayer insulating layer 100.

For example, the lower wiring layer 150 may be electrically connected to the first contact CA1 through the through via VPR. For example, the lower wiring layer 150 may be electrically insulated from each of the second contact CA2 and the fourth contact CA4 between the second source region S2 and the second drain region D2. For example, the lower wiring layer 150 may be electrically insulated from each of the second contact CA2 and the fourth contact CA4 between the second gate electrode G2 and the third gate electrode G3. In addition, the lower wiring layer 150 may be electrically insulated from each of the third contact CA3 and the fifth contact CA5 between the first drain region D1 and the fourth source region S4. For example, the lower wiring layer 150 may be electrically insulated from each of the third contact CA3 and the fifth contact CA5 between the third gate electrode G3 and the fourth gate electrode G4.

The second etch stop layer 160 may be disposed on the upper surface of each of the first upper interlayer insulating layer 140, the capping pattern 122, the gate cut GC, the first and second contact separation layers CAS1 and CAS2 and the first to fifth contacts CA1 to CA5. Although the second etch stop layer 160 is shown in FIGS. 2 to 7 as being formed of a single layer, the present inventive concept is not limited thereto. In embodiments of the present inventive concept, the second etch stop layer 160 may be formed of a multi-layer. The second etch stop layer 160 may include at least one of, for example, aluminum oxide, aluminum nitride, hafnium oxide, zirconium oxide, silicon oxide, silicon nitride, silicon oxynitride and/or a low dielectric constant material. The second upper interlayer insulating layer 165 may be disposed on the second etch stop layer 160. The second upper interlayer insulating layer 165 may include at least one of, for example, silicon oxide, silicon nitride, silicon oxynitride and/or a low dielectric constant material.

The first via V1 may be connected to the first contact CA1 by passing through the second upper interlayer insulating layer 165 and the second etch stop layer 160 in the vertical direction DR1. The second via V2 may be connected to the third contact CA3 by passing through the second upper interlayer insulating layer 165 and the second etch stop layer 160 in the vertical direction DR3. The third via V3 may be connected to the fourth contact CA4 by passing through the second upper interlayer insulating layer 165 and the second etch stop layer 160 in the vertical direction DR3. The fourth via V4 may be connected to the fifth contact CA5 by passing through the second upper interlayer insulating layer 165 and the second etch stop layer 160 in the vertical direction DR3.

FIGS. 2 to 7 show that each of the first to fourth vias V1, V2, V3 and V4 is formed of a single layer, but this is for convenience of description and the present inventive concept is not limited thereto. In embodiments of the present inventive concept, each of the first to fourth vias V1, V2, V3 and V4 may be formed of a multi-layer. Each of the first to fourth vias V1, V2, V3 and V4 may include a conductive material.

The third upper interlayer insulating layer 170 may be disposed on the second upper interlayer insulating layer 165. The third upper interlayer insulating layer 170 may include at least one of, for example, silicon oxide, silicon nitride, silicon oxynitride or a low dielectric constant material. Each of the first to third upper wiring layers 181, 182 and 183 may be disposed inside the third upper interlayer insulating layer 170. For example, each of the first to third upper wiring layers 181, 182 and 183 may be extended in the first horizontal direction DR1.

For example, the second upper wiring layer 182 may be spaced apart from the first upper wiring layer 181 in the second horizontal direction DR2. The third upper wiring layer 183 may be spaced apart from the second upper wiring layer 182 in the second horizontal direction DR2. For example, the first upper wiring layer 181 may be electrically connected to the third contact CA3 through the second via V2. The second upper wiring layer 182 may be electrically connected to the first contact CA1 through the first via V1. In addition, the second upper wiring layer 182 may be electrically connected to the fifth contact CA5 through the fourth via V4. The third upper wiring layer 183 may be electrically connected to the fourth contact CA4 through the third via V3.

Each of the first to third upper wiring layers 181, 182 and 183 may include a conductive material. Although FIGS. 2 to 7 show that each of the first to third upper wiring layers 181, 182 and 183 is formed of a single layer, the present inventive concept is not limited thereto. In embodiments of the present inventive concept, each of the first to third upper wiring layers 181, 182 and 183 may be formed of a multi-layer. For example, a width of each of the first to third upper wiring layers 181, 182 and 183 in the second horizontal direction DR2 may be continuously reduced as each of the first to third upper wiring layers 181, 182 and 183 approach the upper surface of the second upper interlayer insulating layer 165.

In the semiconductor device according to embodiments of the present inventive concept, the through via VPR is formed only below the contact CA1 that is disposed on two source regions S1 and S3, and the through via VPR is not formed below the remaining contacts CA2, CA3, CA4 and CA5. Therefore, in the semiconductor device according to embodiments of the present inventive concept, the region in which the through via VPR is formed may be minimized, whereby process difficulty may be reduced and the degree of integration of the semiconductor device may be increased.

Hereinafter, a method for fabricating a semiconductor device according to embodiments of the present inventive concept will be described with reference to FIGS. 2 to 56.

FIGS. 8 to 56 are views illustrating intermediate steps of a method for fabricating a semiconductor device according to embodiments of the present inventive concept.

Figure 8:
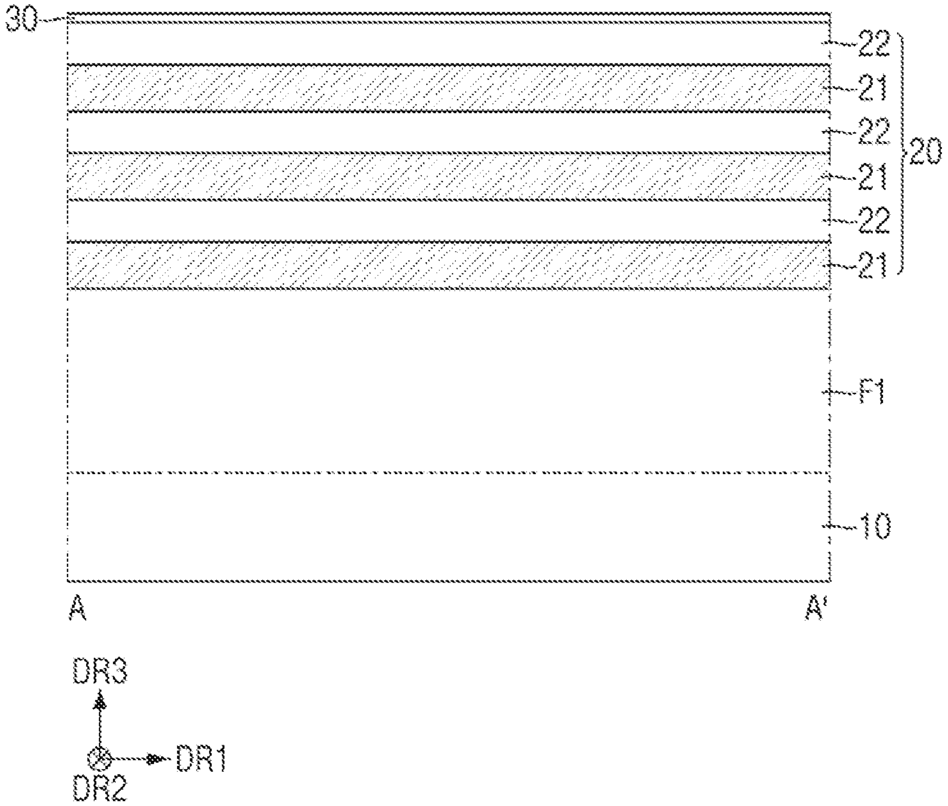
FIGS. 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, and 56 are views illustrating intermediate steps of a method for fabricating a semiconductor device according to embodiments of the present inventive concept.
Figure 9:
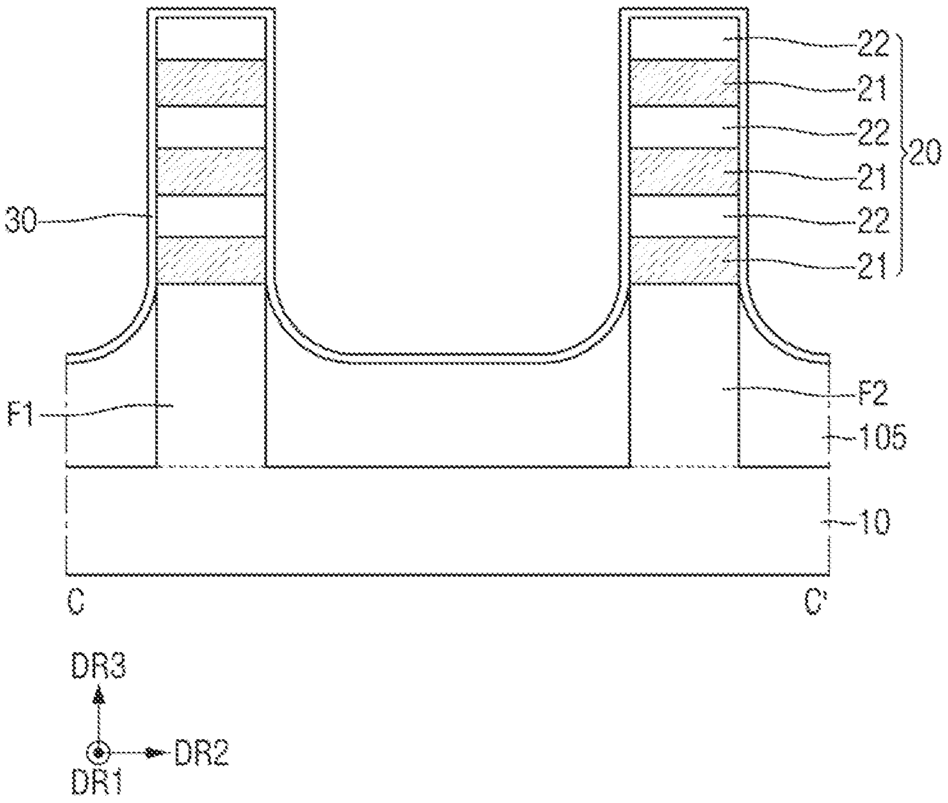

Referring to FIGS. 8 and 9, a stacked structure 20 may be formed on a substrate 10. The substrate 10 may be a silicon substrate or a silicon-on-insulator (SOI). In addition, the substrate 10 may include, for example, silicon germanium, silicon germanium on insulator (SGOI), indium antimonide, lead telluride, indium arsenide, indium phosphide, gallium arsenide and/or gallium antimonide, but the present inventive concept is not limited thereto.

The stacked structure 20 may include a first semiconductor layer 21 and a second semiconductor layer 22, which are alternately stacked on the substrate 10. For example, the first semiconductor layer 21 may be formed on a lowermost portion of the stacked structure 20, and the second semiconductor layer 22 may be formed on an uppermost portion of the stacked structure 20, but the present inventive concept is not limited thereto. In embodiments of the present inventive concept, the first semiconductor layer 21 may be also formed on the uppermost portion of the stacked structure 20. The first semiconductor layer 21 may include, for example, silicon germanium (SiGe). The second semiconductor layer 22 may include, for example, silicon (Si).

Then, a portion of the stacked structure 20 may be etched. A portion of the substrate 10 may be etched while the stacked structure 20 is being etched. A first active pattern F1 and a second active pattern F2 may be respectively formed below the stacked structure 20 on the upper surface of the substrate 10 through the etching process. Each of the first active pattern F1 and the second active pattern F2 may be extended in the first horizontal direction DR1. The second active pattern F2 may be spaced apart from the first active pattern F1 in the second horizontal direction DR2.

Subsequently, a field insulating layer 105 may be formed on the upper surface of the substrate 10. The field insulating layer 105 may surround sidewalls of each of the first active pattern F1 and the second active pattern F2. A pad oxide layer 30 may be formed to cover an upper surface of the field insulating layer 105, the exposed sidewalls of the first active pattern F1, the exposed sidewalls of the second active pattern F2, sidewalls and an upper surface of the stacked structure 20. For example, the pad oxide layer 30 may be formed to be conformal. For example, the pad oxide layer 30 may be conformally formed on the field insulating layer 105, the exposed sidewalls of the first active pattern F1, the exposed sidewalls of the second active pattern F2, sidewalls and an upper surface of the stacked structure 20. The pad oxide layer 30 may include, for example, silicon oxide ($SiO_2$).

Figure 10:
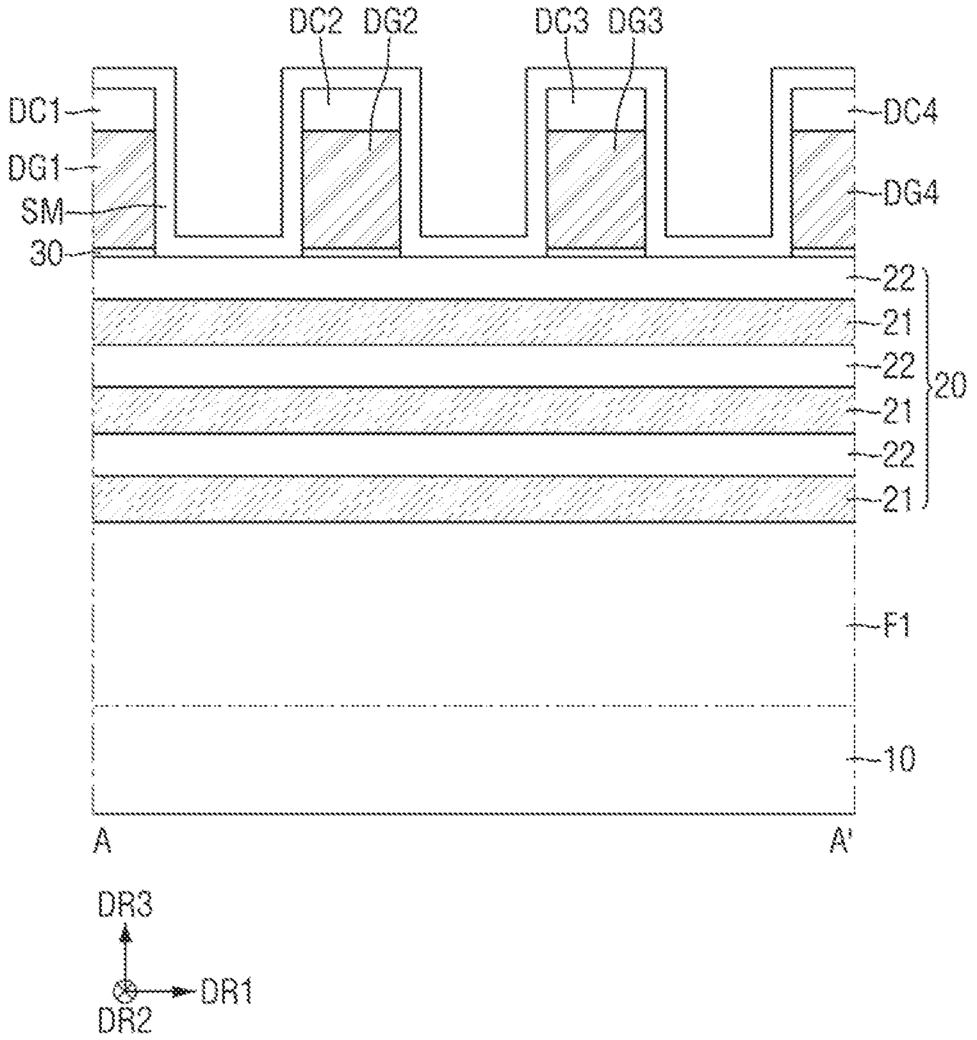
Figure 11:
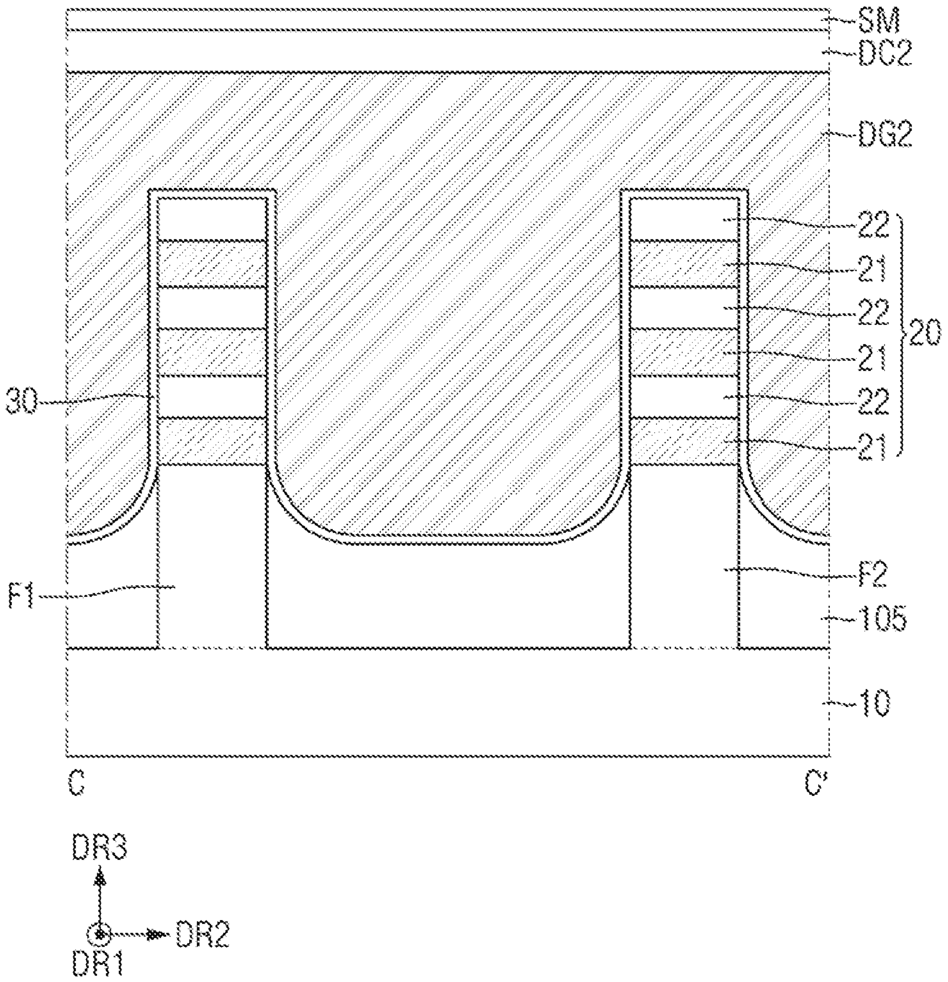

Referring to FIGS. 10 and 11, first to fourth dummy gates DG1, DG2, DG3 and DG4 and first to fourth dummy capping patterns DC1, DC2, DC3 and DC4, which are extended in the second horizontal direction DR2 on the pad oxide layer 30, may be formed on the stacked structure 20 and the field insulating layer 105. The first dummy capping pattern DC1 may be formed on the first dummy gate DG1. The second dummy capping pattern DC2 may be formed on the second dummy gate DG2. The third dummy capping pattern DC3 may be formed on the third dummy gate DG3, and the fourth dummy capping pattern DC4 may be formed on the fourth dummy gate DG4.

The second dummy gate DG2 and the second dummy capping pattern DC2 may be spaced apart from the first dummy gate DG1 and the first dummy capping pattern DC1 in the first horizontal direction DR1. The third dummy gate DG3 and the third dummy capping pattern DC3 may be spaced apart from the second dummy gate DG2 and the second dummy capping pattern DC2 in the first horizontal direction DR1. The fourth dummy gate DG4 and the fourth dummy capping pattern DC4 may be spaced apart from the third dummy gate DG3 and the third dummy capping pattern DC3 in the first horizontal direction DR1.

While the first to fourth dummy gates DG1, DG2, DG3 and DG4 and the first to fourth dummy capping patterns DC1, DC2, DC3 and DC4 are being formed, the remaining pad oxide layer 30, except a portion of which is overlapped with each of the first to fourth dummy gates DG1, DG2, DG3 and DG4 in the vertical direction DR3 on the substrate 10, may be removed.

A spacer material layer SM may be formed to cover sidewalls of each of the first to fourth dummy gates DG1, DG2, DG3 and DG4, sidewalls and an upper surface of each of the first to fourth dummy capping patterns DC1, DC2, DC3 and DC4, the exposed sidewalls and upper surface of the stacked structure 20 and the upper surface of the field insulating layer 105. For example, the spacer material layer SM may be conformally formed on the first to fourth dummy gates DG1, DG2, DG3 and DG4, sidewalls and an upper surface of each of the first to fourth dummy capping patterns DC1, DC2, DC3 and DC4, the exposed sidewalls and upper surface of the stacked structure 20 and the upper surface of the field insulating layer 105. The spacer material layer SM may include at least one of, for example, silicon nitride (SiN), silicon oxycarbonitride (SiOCN), silicon boron carbonitride (SiBCN), silicon carbonitride (SiCN), silicon oxynitride (SiON) or a combination thereof.

Figure 12:
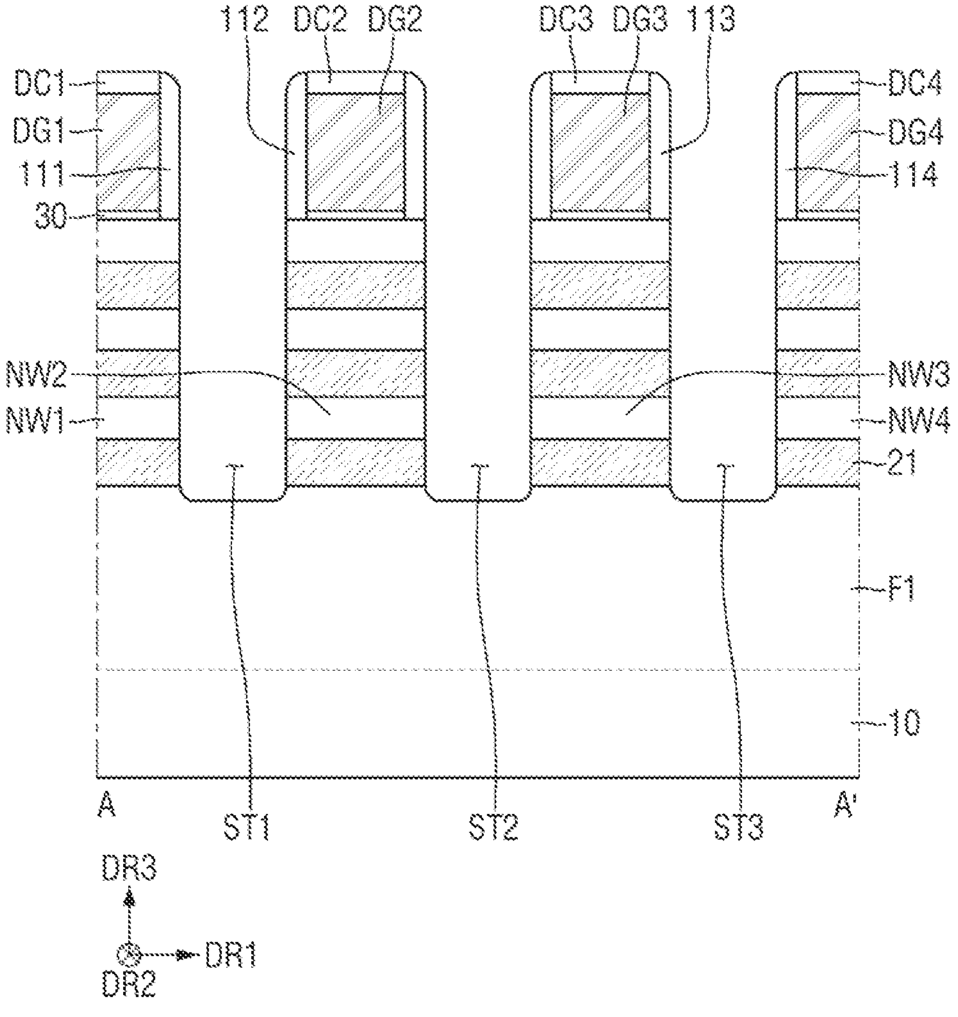
Figure 13:
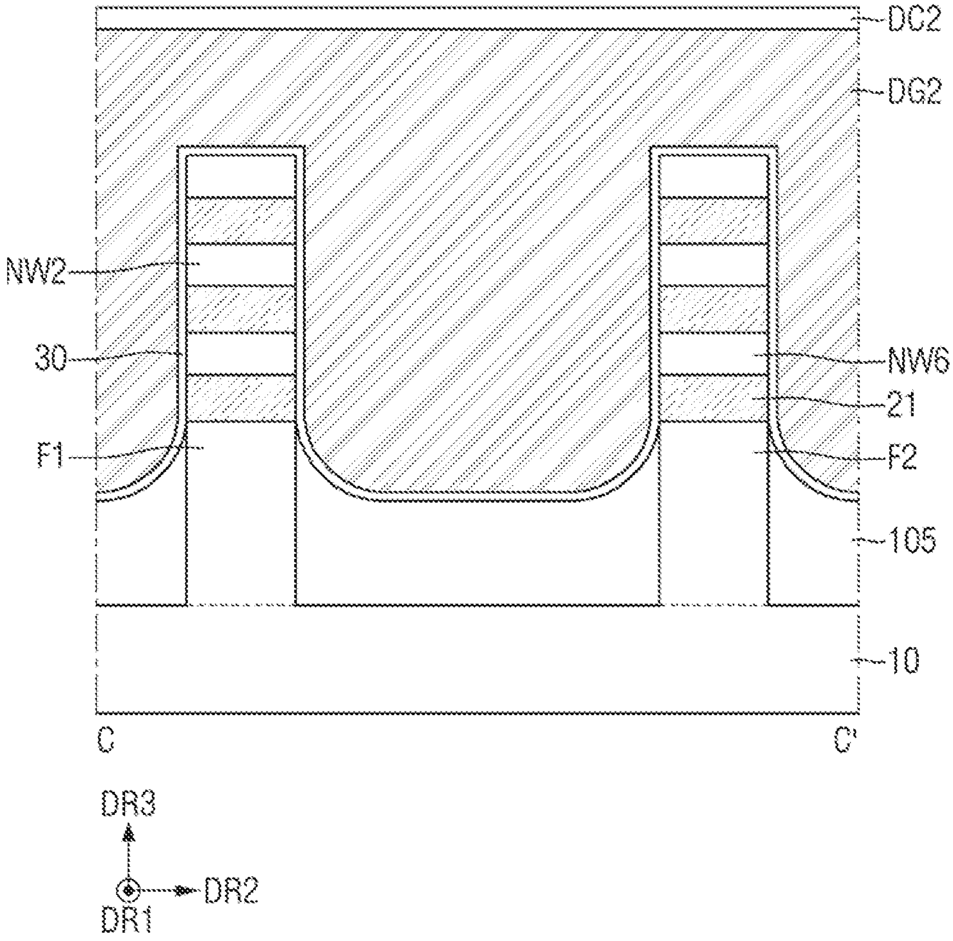
Figure 14:
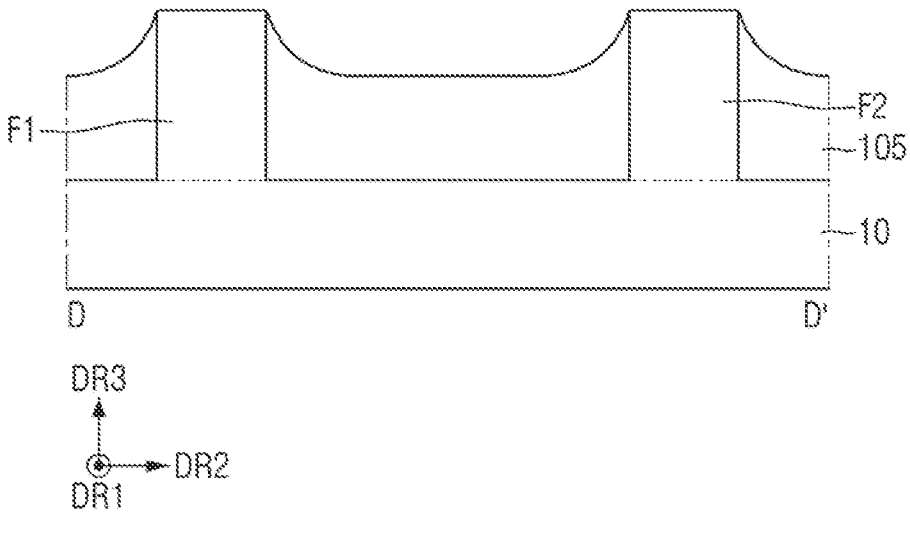

Referring to FIGS. 12 to 14, the stacked structure (20 of FIG. 10) may be etched using the first to fourth dummy gates DG1, DG2, DG3 and DG4 and the first to fourth dummy capping patterns DC1, DC2, DC3 and DC4 as masks to form first to third source/drain trenches ST1, ST2 and ST3. For example, the first source/drain trench ST1 may be formed on the first active pattern F1 between the first dummy gate DG1 and the second dummy gate DG2. The second source/drain trench ST2 may be formed on the first active pattern F1 between the second dummy gate DG2 and the third dummy gate DG3. The third source/drain trench ST3 may be formed on the first active pattern F1 between the third dummy gate DG3 and the fourth dummy gate DG4. For example, each of the first to third source/drain trenches ST1, ST2 and ST3 may be extended into the first active pattern F1. Source/drain trenches having a shape similar to each of the first to third source/drain trenches ST1 to ST3 may be formed on the second active pattern F2.

While the first to third source/drain trenches ST1, ST2 and ST3 are being formed, a portion of each of the spacer material layer (SM of FIG. 10) and the first to fourth dummy capping patterns DC1, DC2, DC3 and DC4, which are formed on the upper surface of each of the first to fourth dummy capping patterns DC1, DC2, DC3 and DC4, may be etched. The spacer material layer (SM of FIG. 10) remaining on the sidewalls of each of the first to fourth dummy gates DG1, DG2, DG3 and DG4 may be first to fourth gate spacers 111, 112, 113 and 114.

After the first to third source/drain trenches ST1, ST2 and ST3 are formed, a second semiconductor layer (22 of FIG. 10) remaining below each of the first to fourth dummy gates DG1, DG2, DG3 and DG4 may be first to eighth plurality of nanosheets (NW1 to NW8 of FIGS. 2 and 3).

Figure 15:
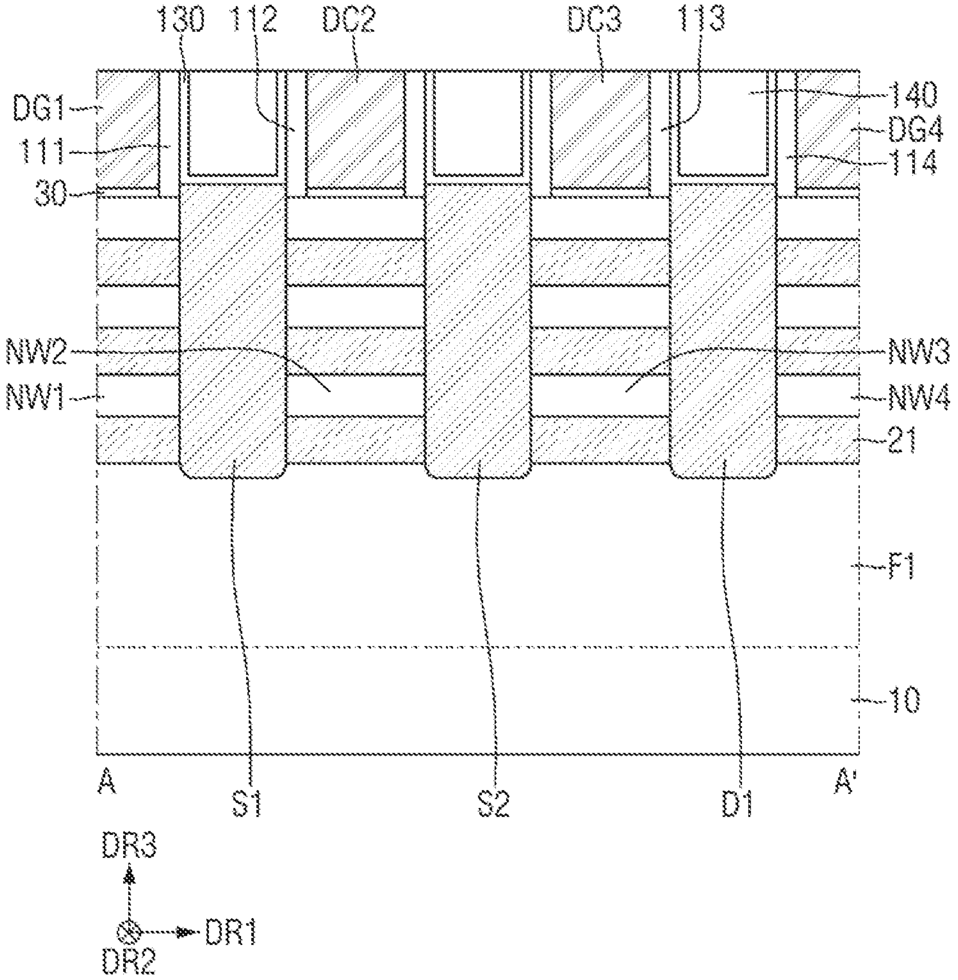
Figure 16:
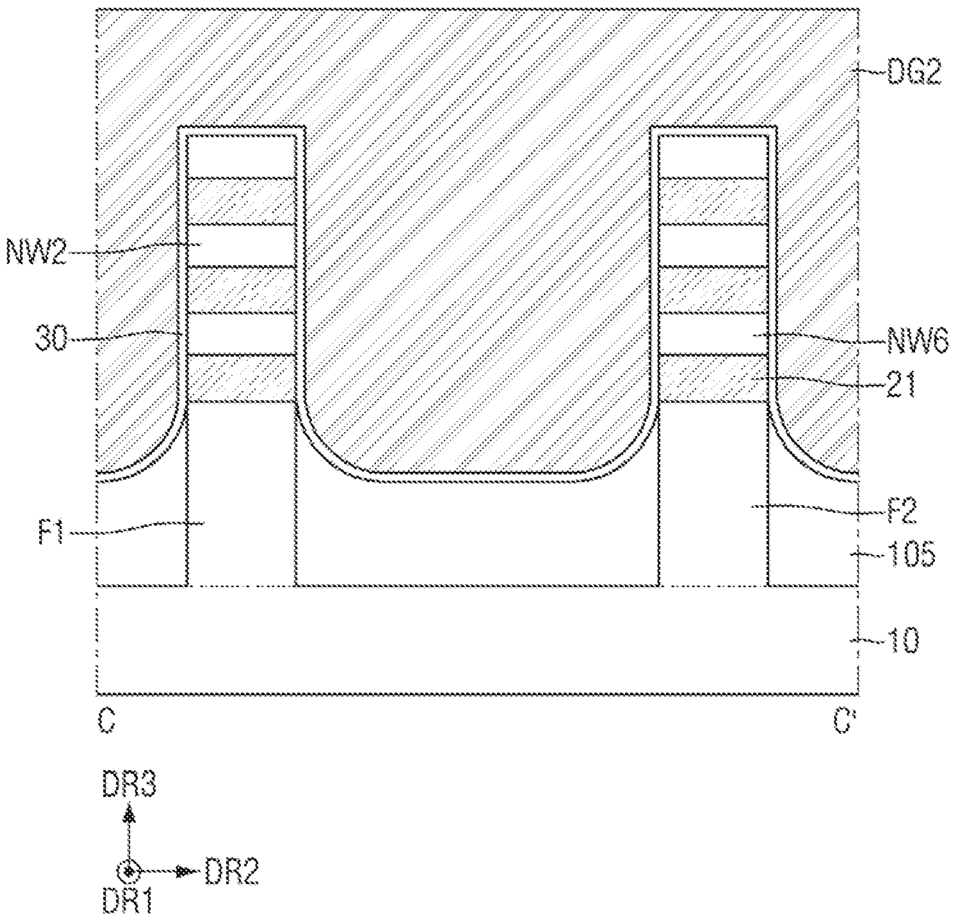
Figure 17:
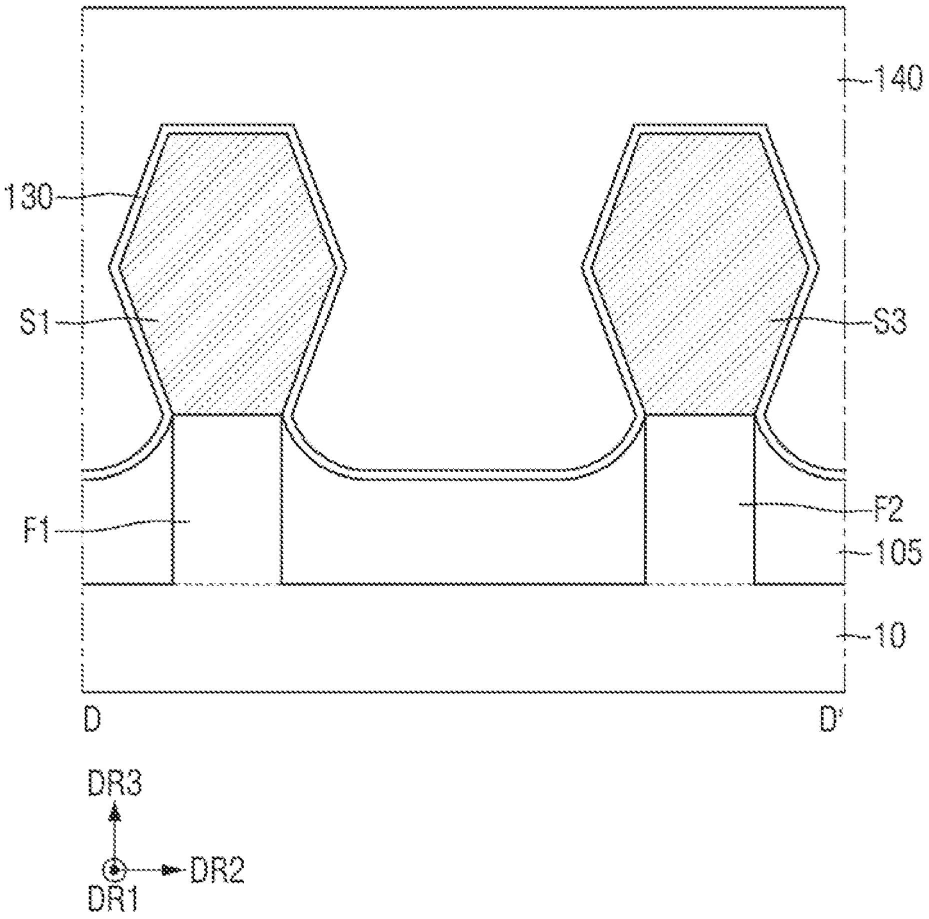

Referring to FIGS. 15 to 17, a first source region S1 may be formed inside the first source/drain trench (ST1 of FIG. 12), a second source region S2 may be formed inside the second source/drain trench (ST2 of FIG. 12), and a first drain region D1 may be formed inside the third source/drain trench (ST3 of FIG. 12). In addition, a third source region (S3 of FIG. 3) may be formed between the fifth plurality of nanosheets (NW5 of FIG. 3) and the sixth plurality of nanosheets (NW6 of FIG. 3). A second drain region (D2 in FIG. 3) may be formed between the sixth plurality of nanosheets (NW6 of FIG. 3) and the seventh plurality of nanosheets (NW7 of FIG. 3), and a fourth source region (S4 of FIG. 3) may be formed between the seventh plurality of nanosheets (NW7 of FIG. 3) and the eighth plurality of nanosheets (NW8 of FIG. 3).

Subsequently, a first etch stop layer 130 may be formed on the exposed surface of the field insulating layer 105, the exposed surface of each of the first to fourth source regions S1 to S4, the exposed surface of each of the first and second drain regions D1 and D2 and the exposed sidewalls of each of the first to fourth gate spacers 111, 112, 113 and 114. Then, a first upper interlayer insulating layer 140 may be formed on the first etch stop layer 130. Subsequently, a planarization process may be performed so that an upper surface of each of the first to fourth dummy gates DG1, DG2, DG3 and DG4 may be exposed.

Figure 18:
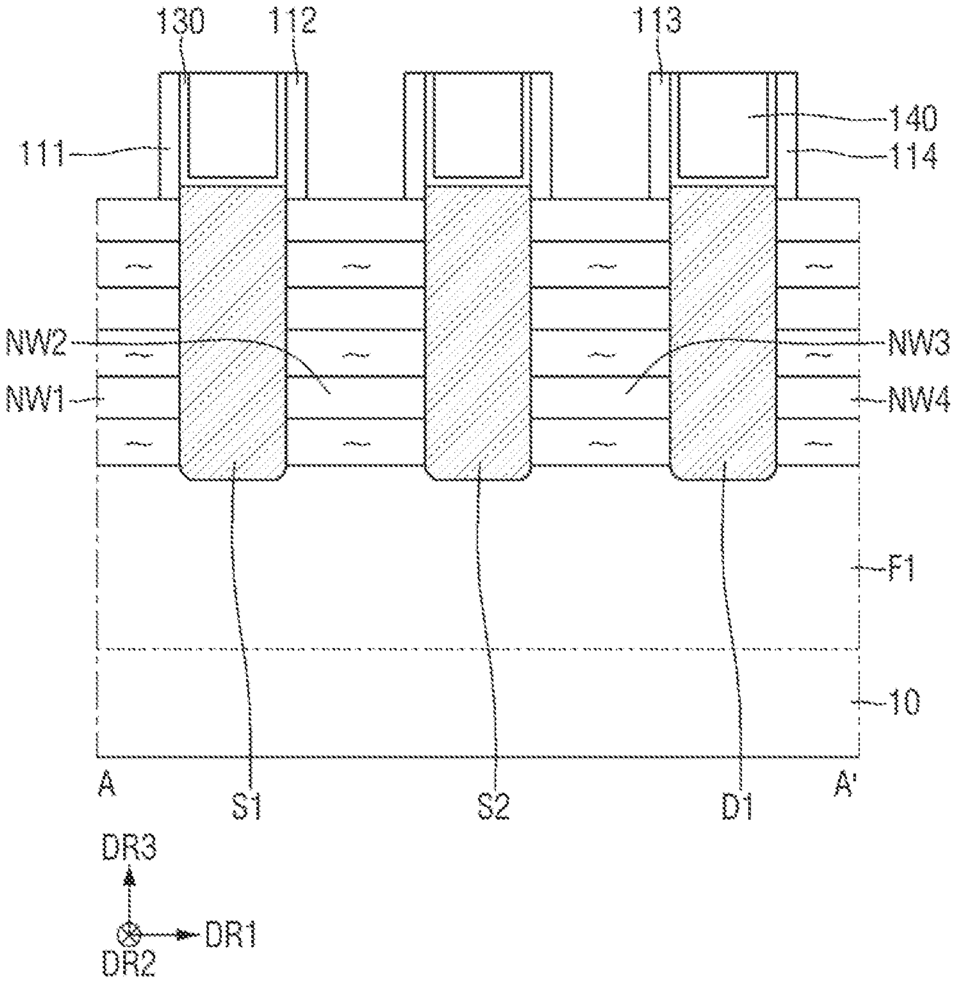
Figure 19:
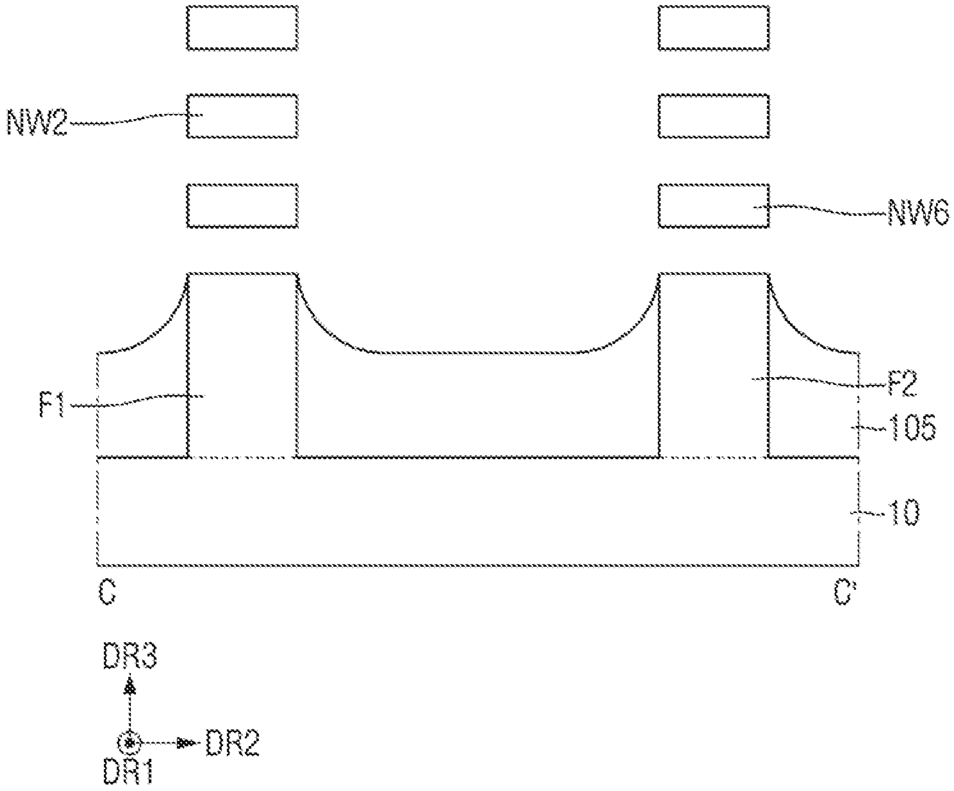

Referring to FIGS. 18 and 19, the first to fourth dummy gates DG1, DG2, DG3 and DG4, the first semiconductor layer 21 and the pad oxide layer 30 may be etched.

Figure 20:
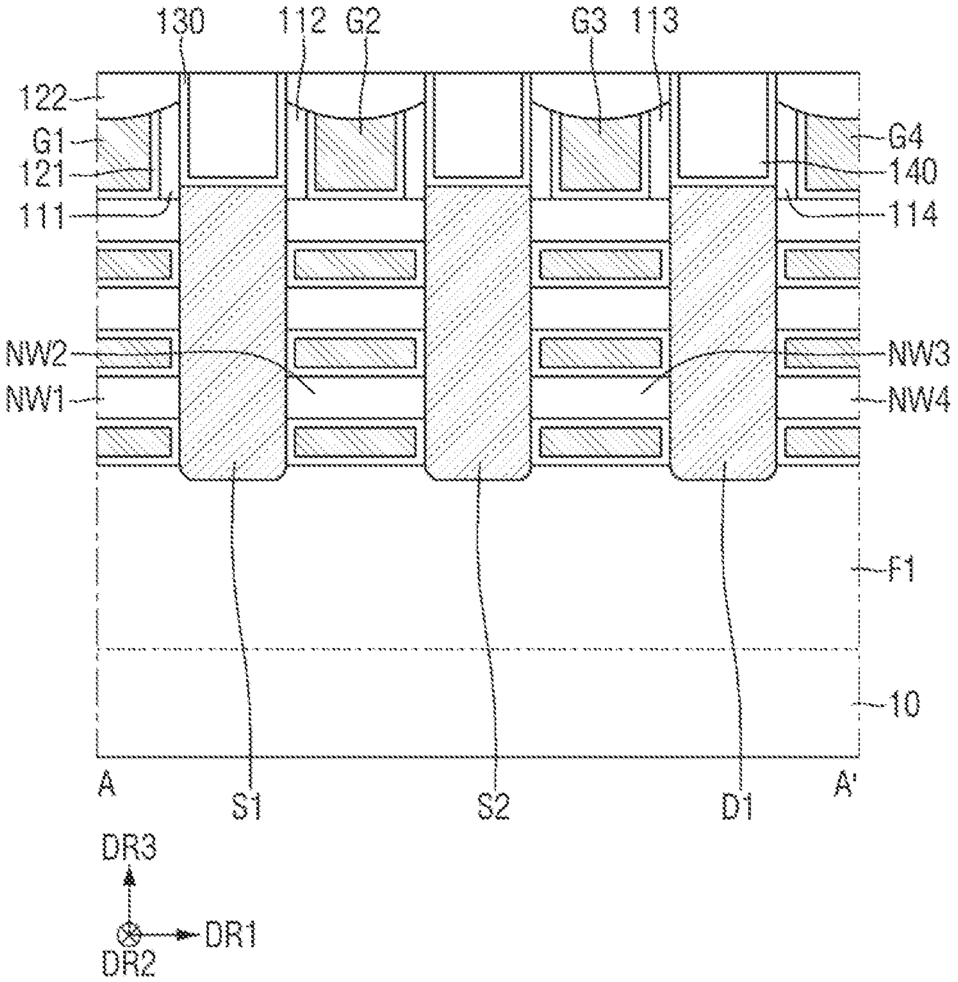
Figure 21:
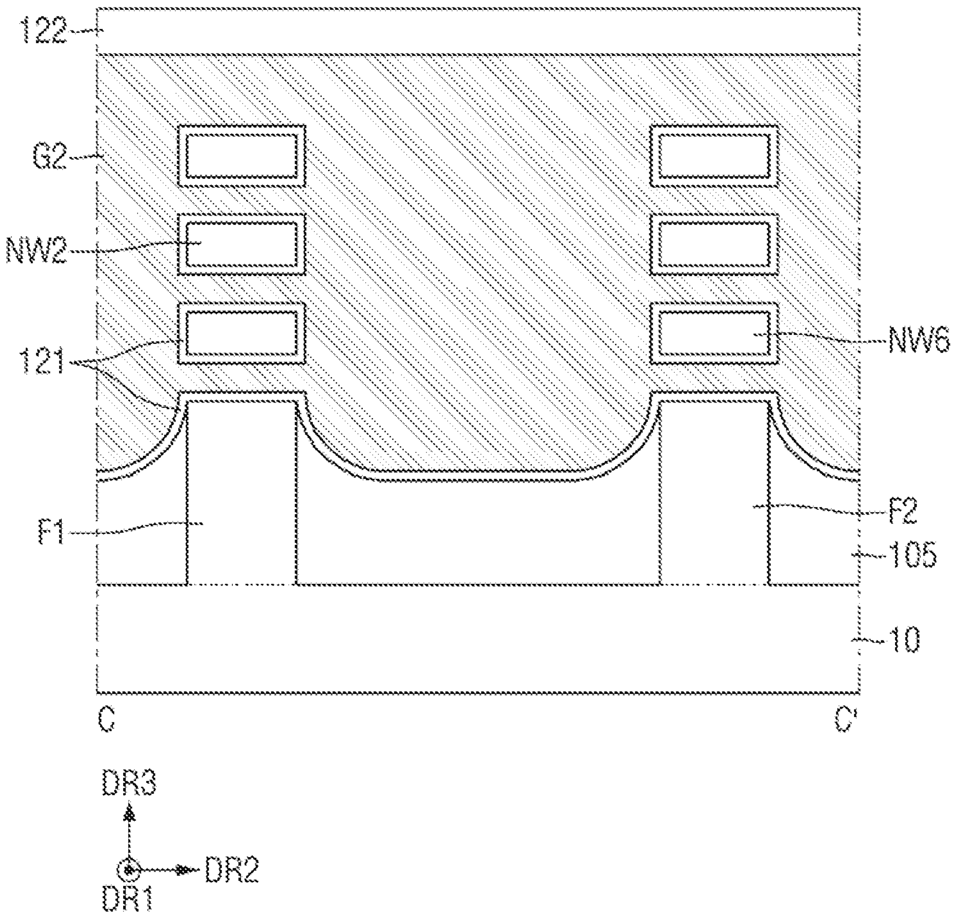
Figure 22:
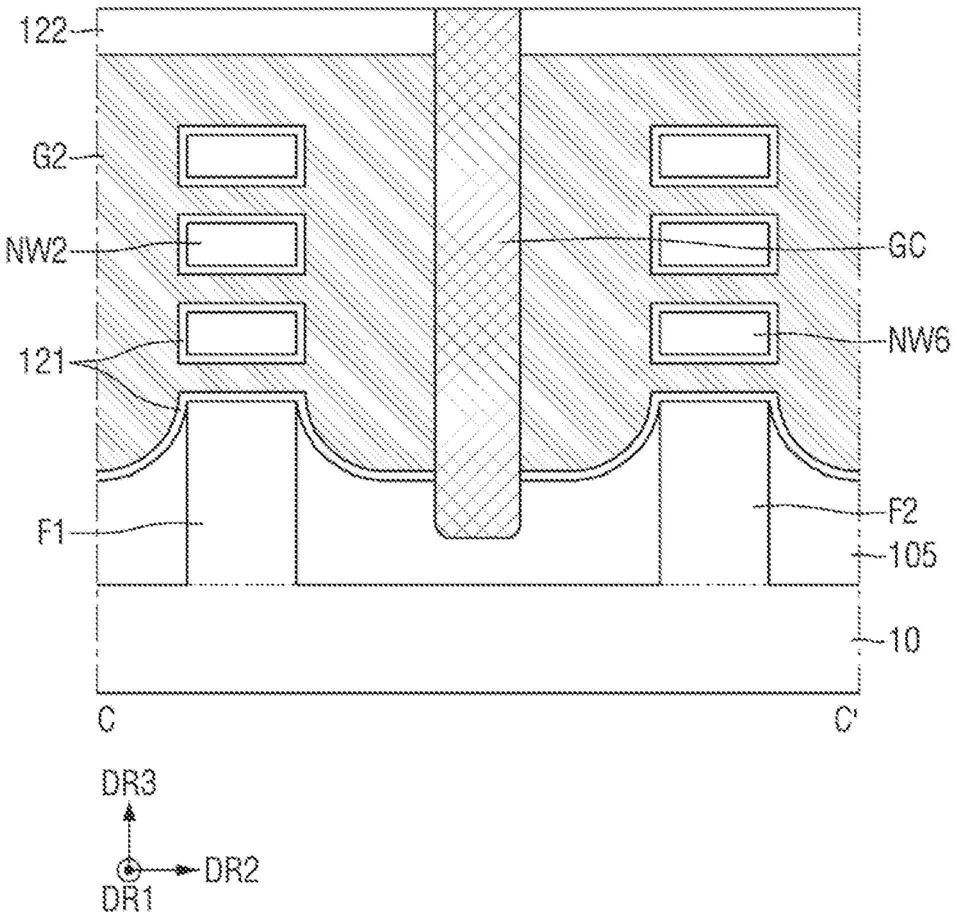
Figure 23:
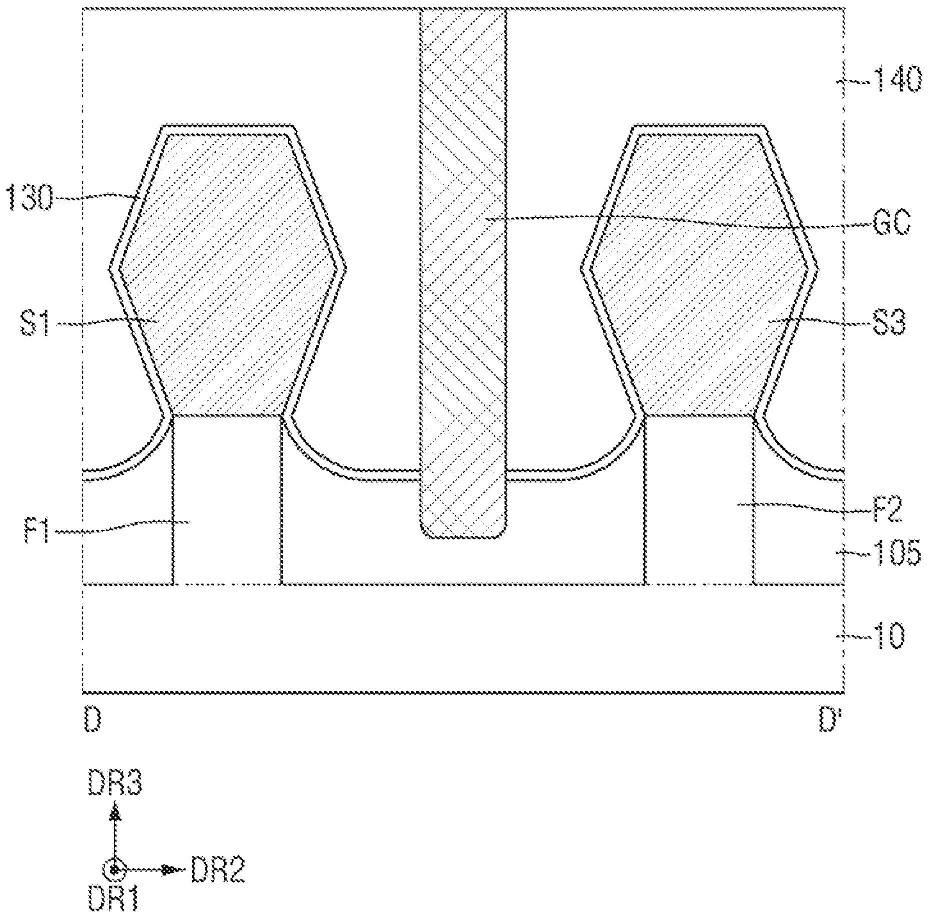
Figure 24:
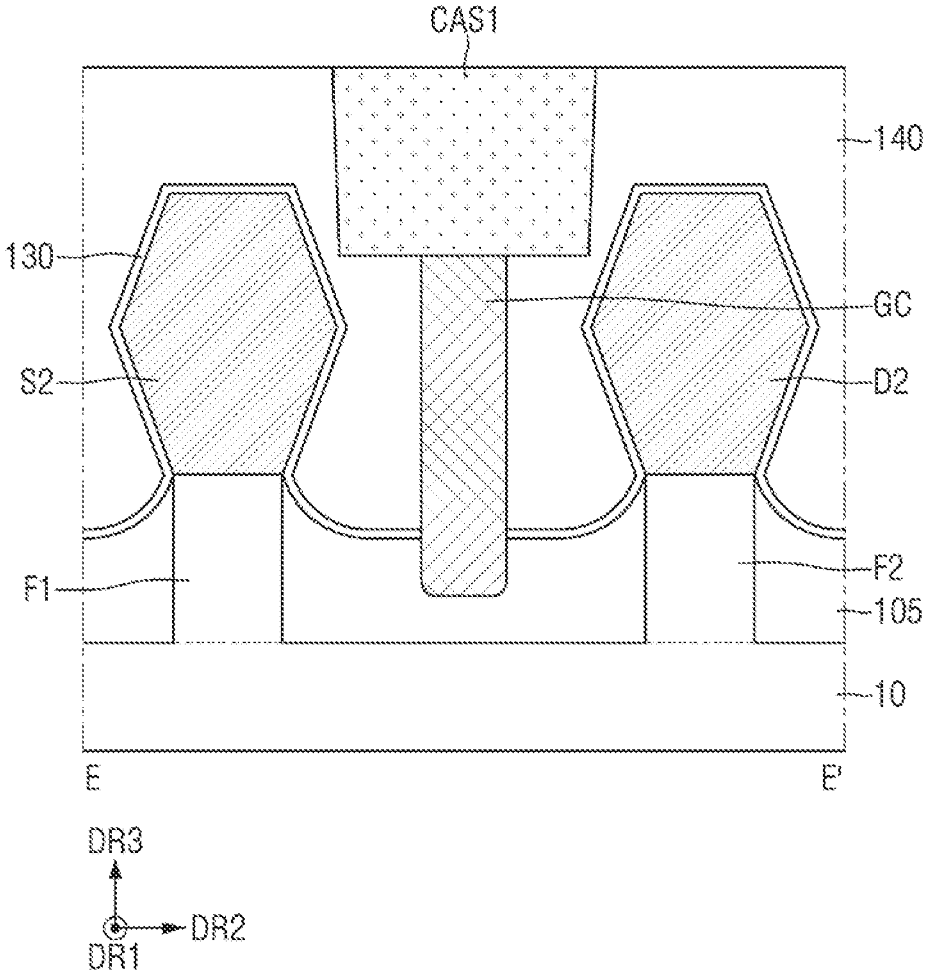
Figure 25:
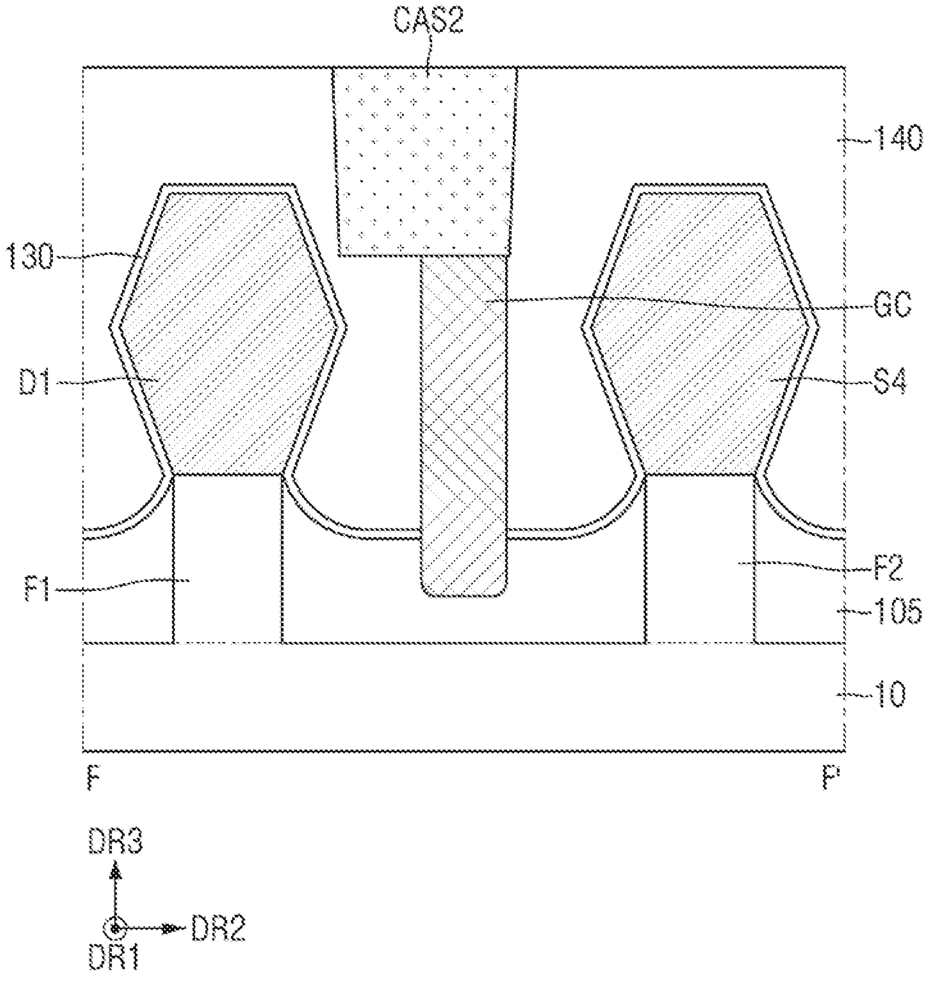
Figure 26:
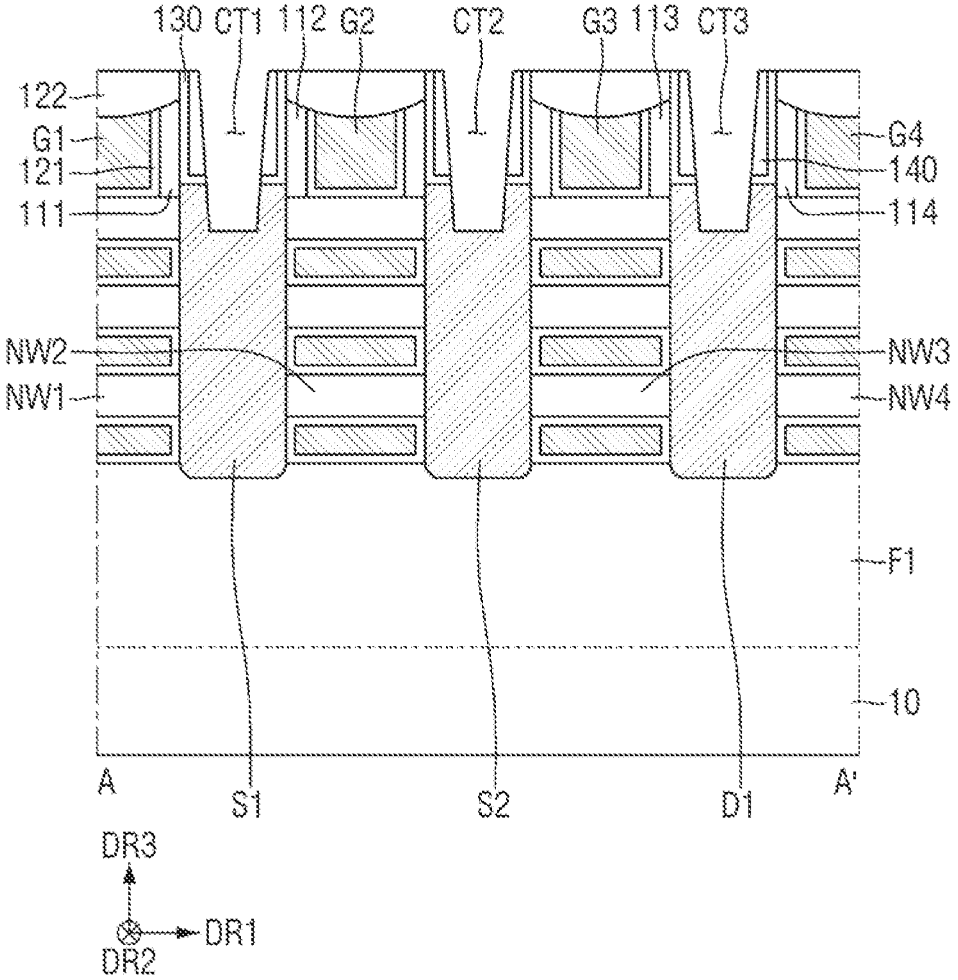
Figure 27:
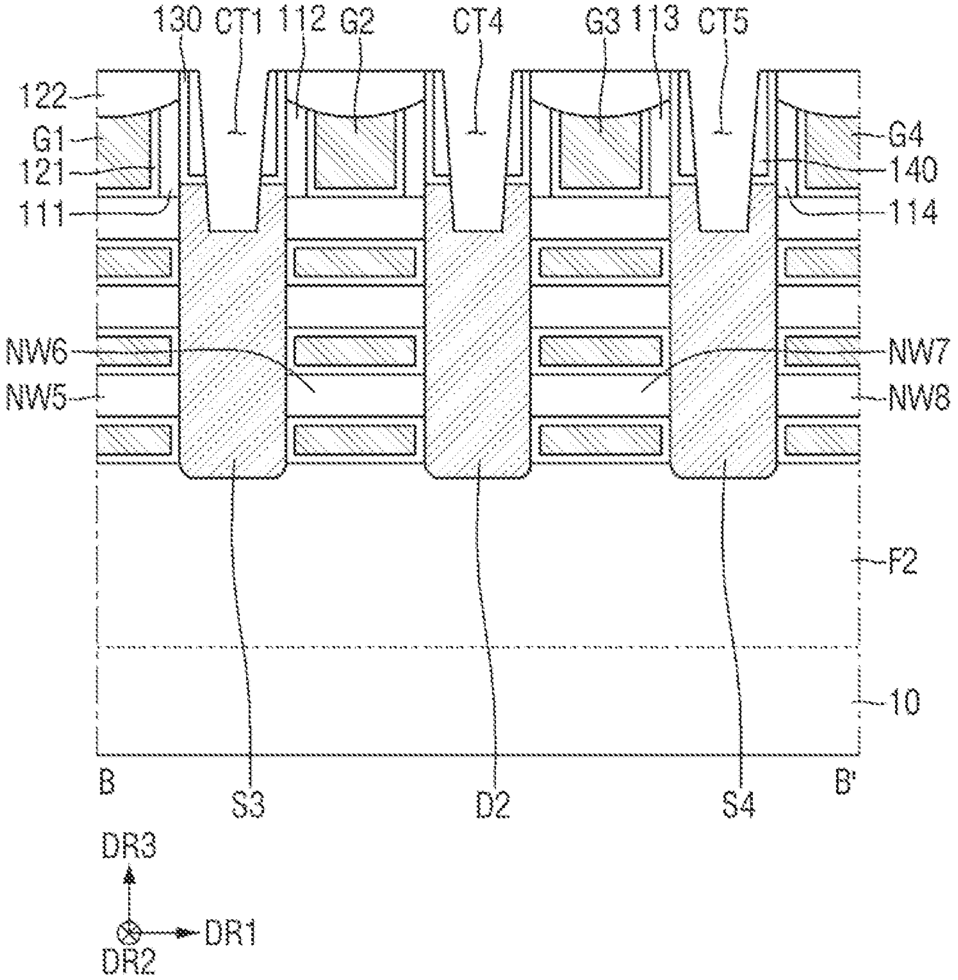
Figure 28:
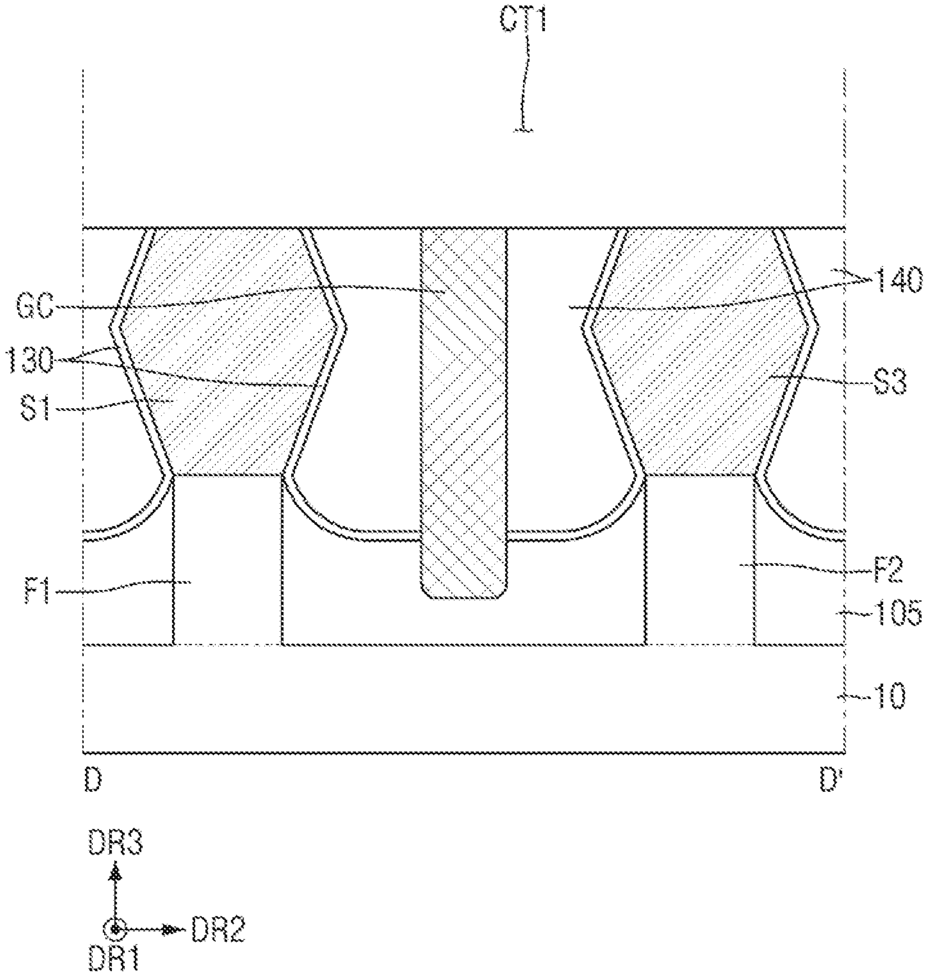
Figure 29:
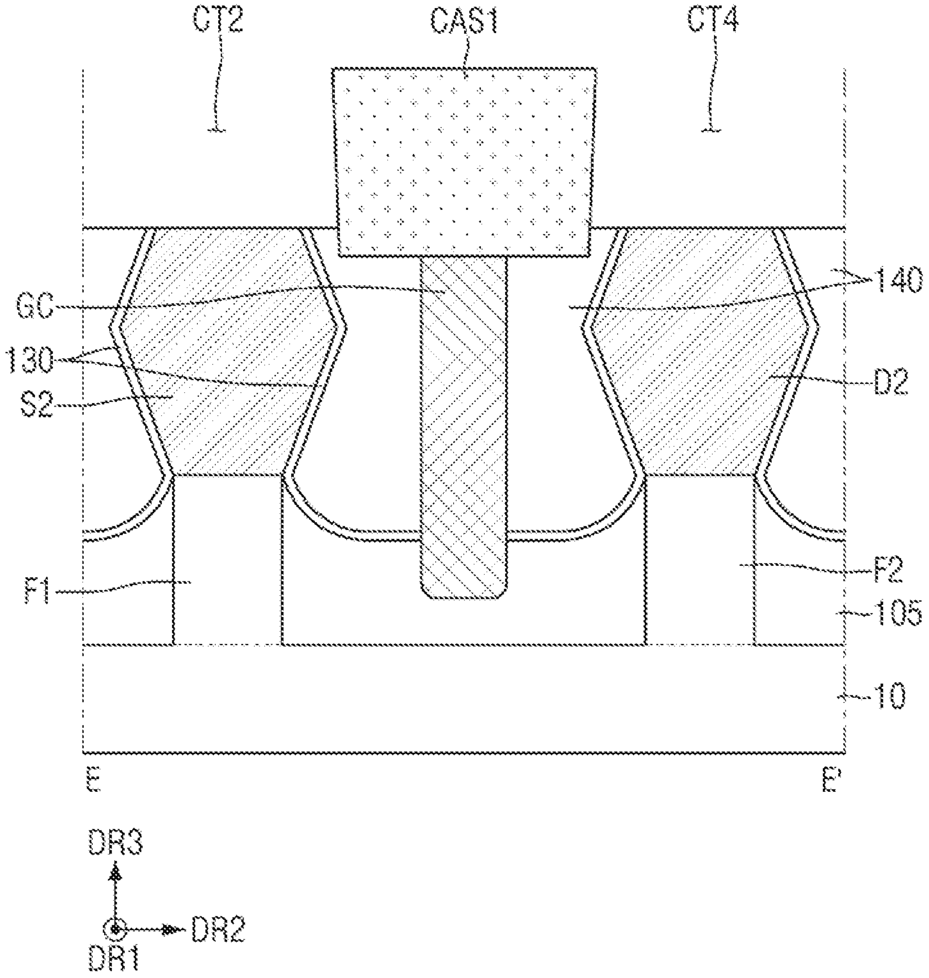
Figure 30:
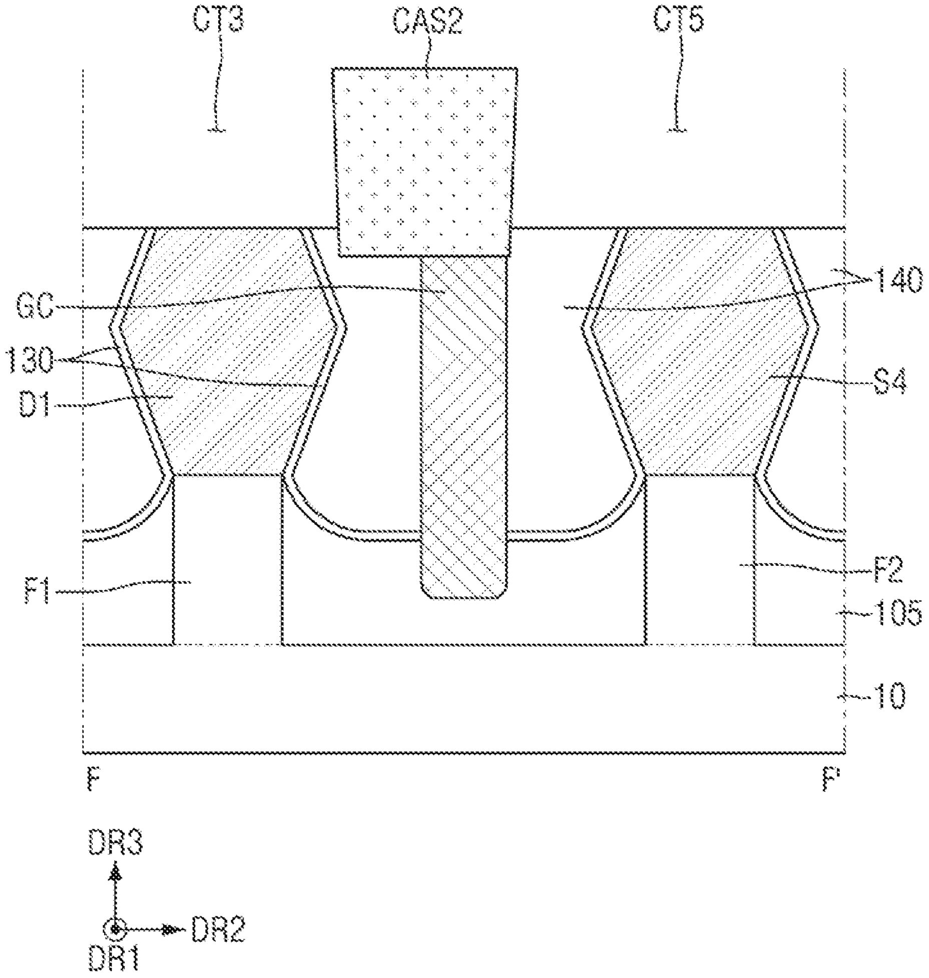

Referring to FIGS. 20 and 21, a gate insulating layer 121, first to fourth gate electrodes G1, G2, G3 and G4 and a capping pattern 122 may be sequentially formed on portions from which the first to fourth dummy gates DG1, DG2, DG3 and DG4, the first semiconductor layer 21 and the pad oxide layer 30 are etched.

Referring to FIGS. 22 to 25, a gate cut may be formed between the first active pattern F1 and the second active pattern F2. The gate cut GC SCF may be extended in the first horizontal direction DR1. For example, the gate cut GC may separate the second gate electrode G2 in the second horizontal direction DR2. The gate cut GC may be extended from each of the upper surface of the capping pattern 122 and the upper surface of the first upper interlayer insulating layer 140 to the inside of the field insulating layer 105.

Then, a first contact separation layer CAS1 and a second contact separation layer CAS2 may be formed inside the first upper interlayer insulating layer 140. For example, an upper surface of each of the first contact separation layer CAS1 and the second contact separation layer CAS2 may be formed on the same plane as the upper surface of the first upper interlayer insulating layer 140. For example, the first contact separation layer CAS1 may be formed between the second source region S2 and the second drain region D2. The second contact separation layer CAS2 may be formed between the first drain region D1 and the fourth source region S4.

Referring to FIGS. 26 to 30, first to fifth contact trenches CT1 to CT5 may be formed inside the first upper interlayer insulating layer 140. For example, the first contact trench CT1 may be formed on each of the first source region S1 and the third source region S3. The second contact trench CT2 may be formed on the second source region S2. The third contact trench CT3 may be formed on the first drain region D1. The fourth contact trench CT4 may be formed on the second drain region D2. For example, side surfaces of the first contact separation layer CAS1 may be exposed by the second contact trench CT2 and the fourth contact trench CT4. The fifth contact trench CT5 may be formed on the fourth source region S4. For example, side surfaces of the second contact separation layer CAS2 may be exposed by the third contact trench CT3 and the fifth contact trench CT5.

Figure 31:
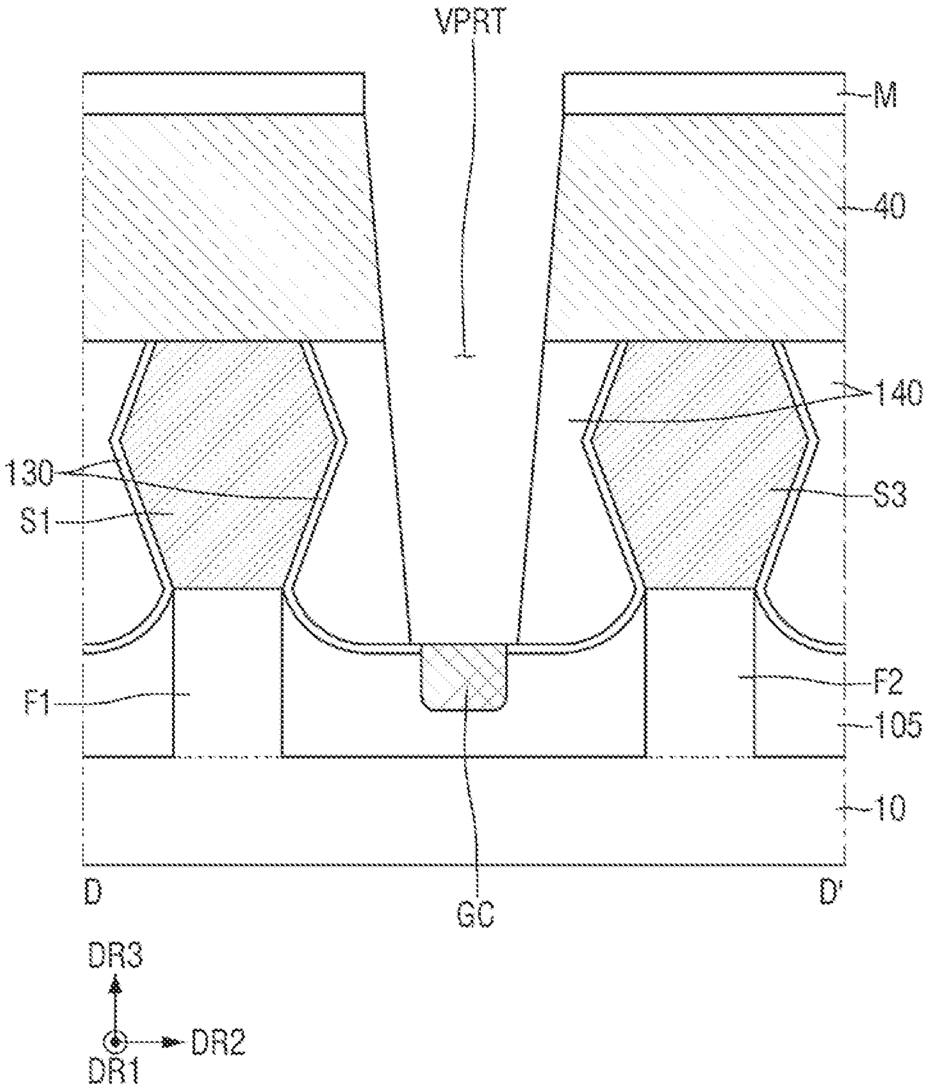
Figure 32:
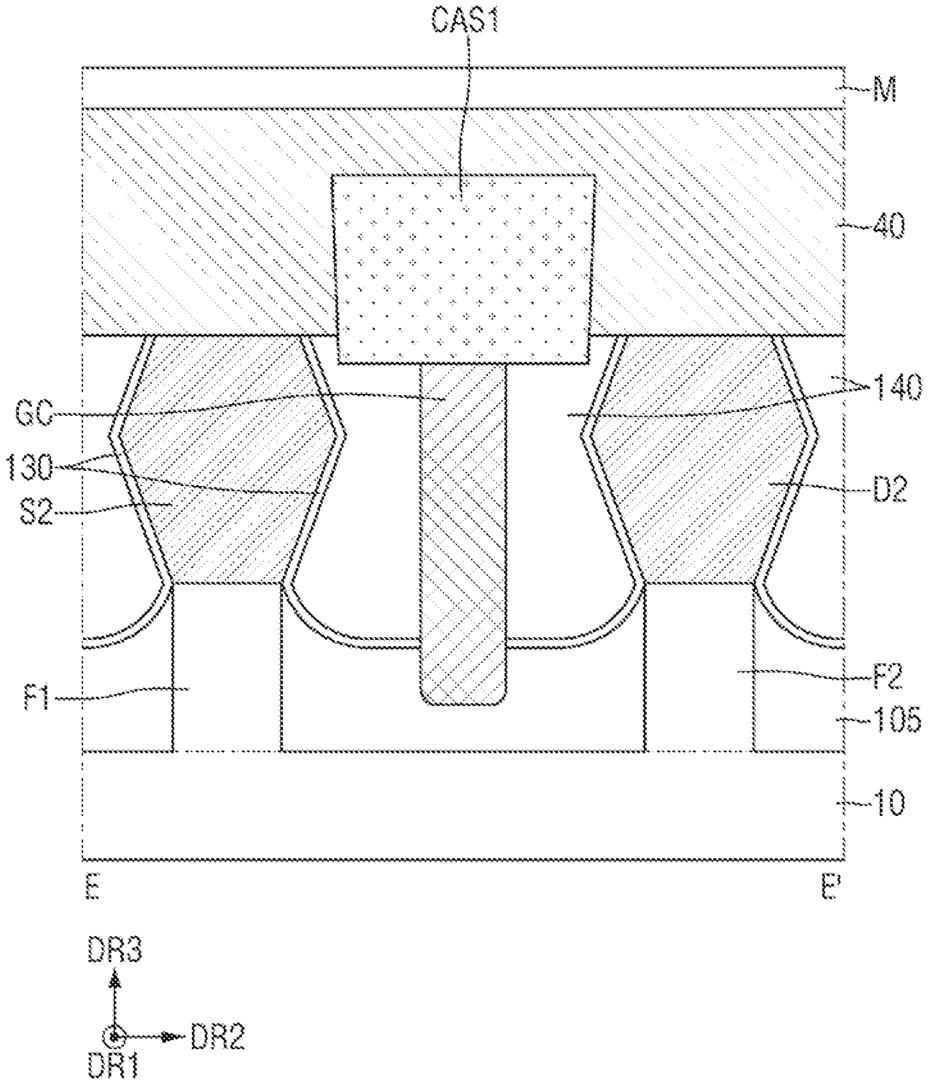
Figure 33:
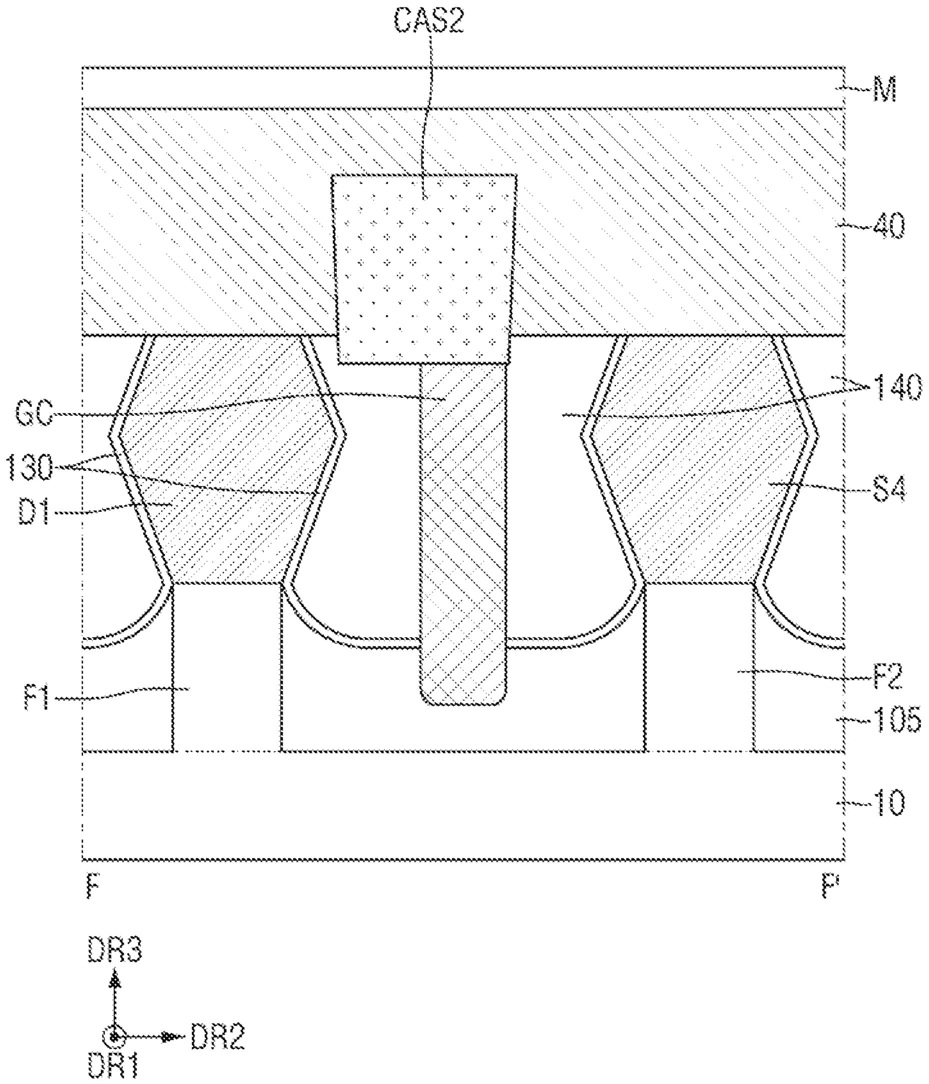

Referring to FIGS. 31 to 33, a passivation layer 40 may be formed on each of the first upper interlayer insulating layer 140, the first contact separation layer CAS1, the second contact separation layer CAS2, the first to fourth source regions S1 to S4 and the first and second drain regions D1 and D2. The passivation layer 40 may include, for example, a spin on hardmask (SOH). Subsequently, a mask pattern M may be formed on the passivation layer 40. The mask pattern M may expose a portion of the passivation layer 40 that is formed between the first source region S1 and the third source region S3.

Then, the passivation layer 40, the first upper interlayer insulating layer 140 and the gate cut GC may be etched using the mask pattern M as a mask to form a through via trench VPRT. For example, a lower surface of the through via trench VPRT may be defined by a portion of the gate cut GC and the first etch stop layer 130, which are formed on the upper surface of the field insulating layer 105.

Figure 34:
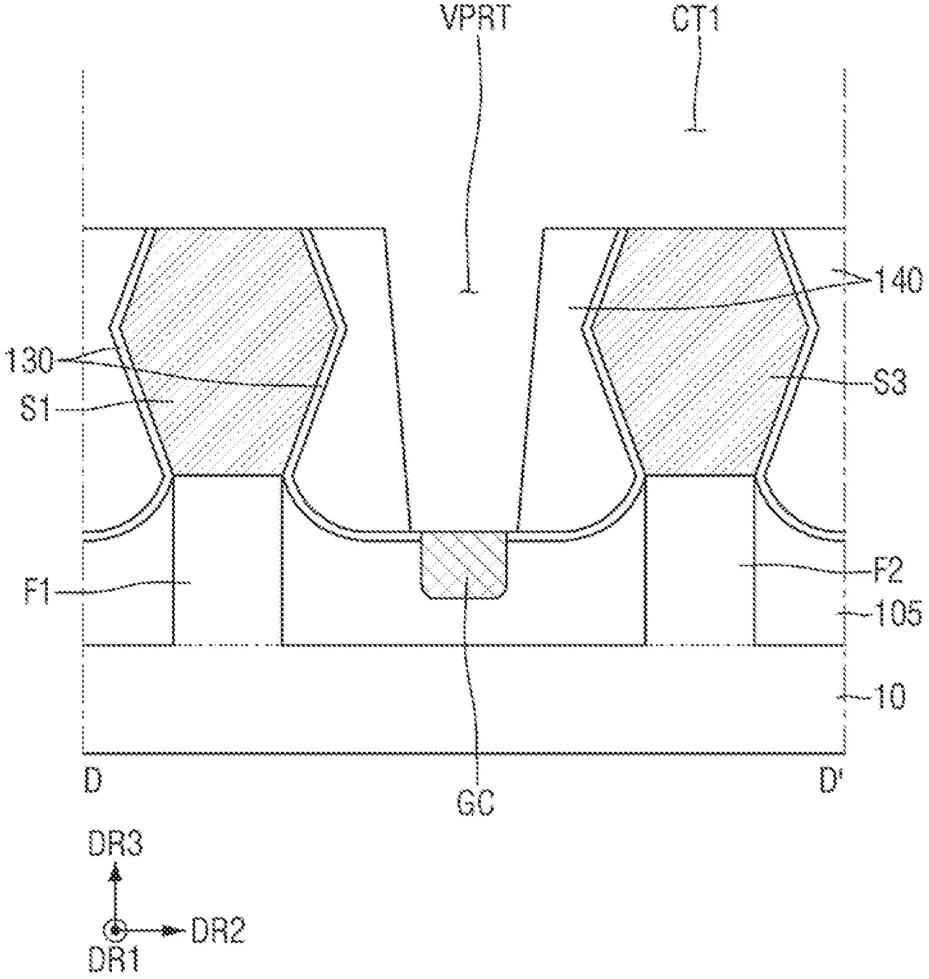
Figure 35:
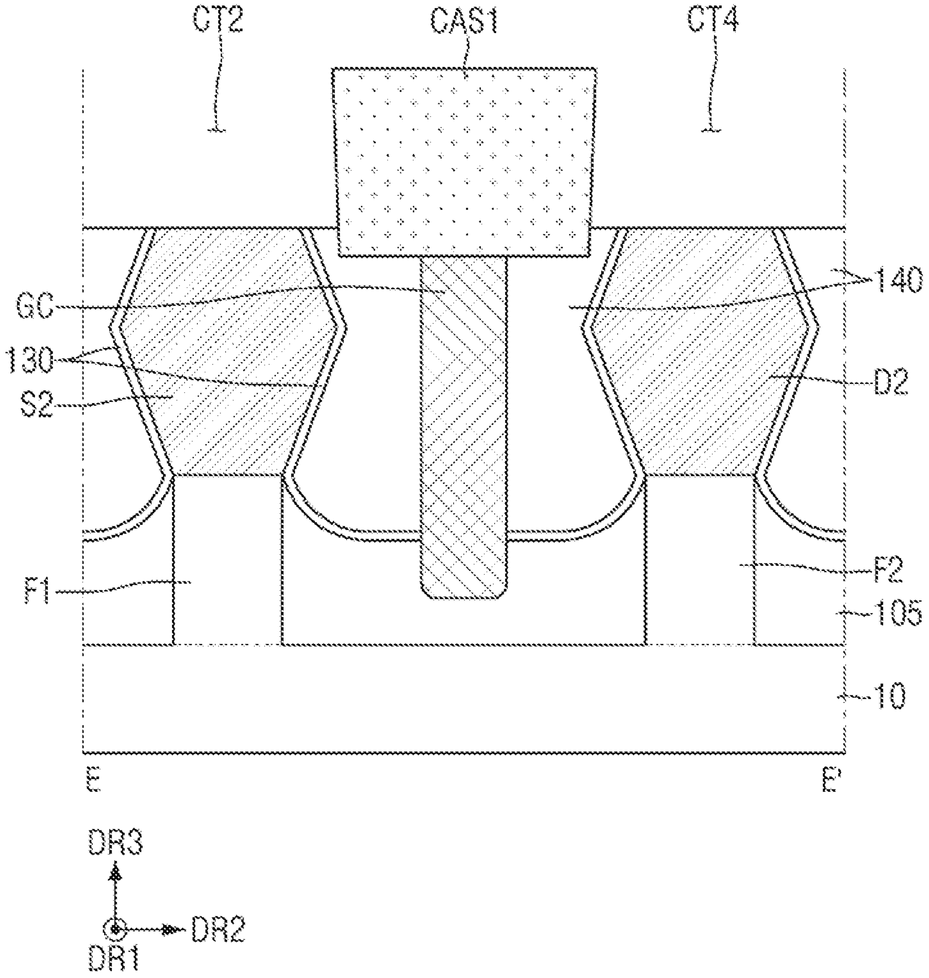
Figure 36:
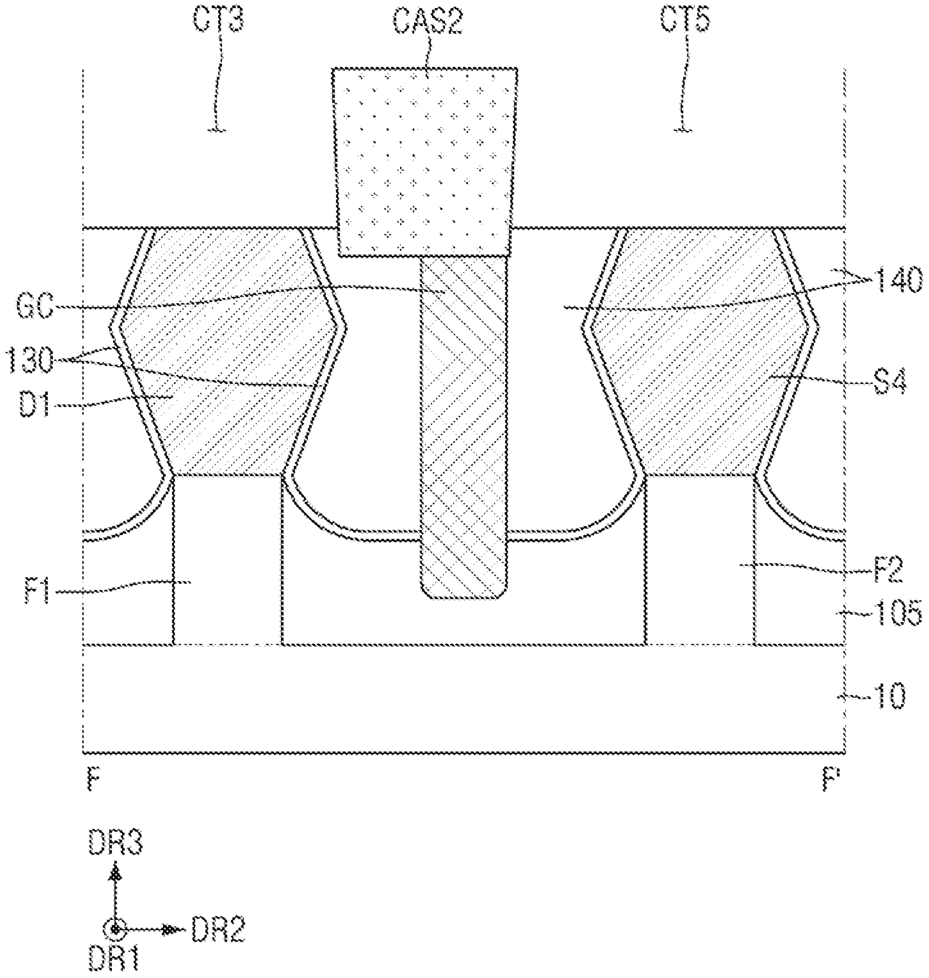
Figure 37:
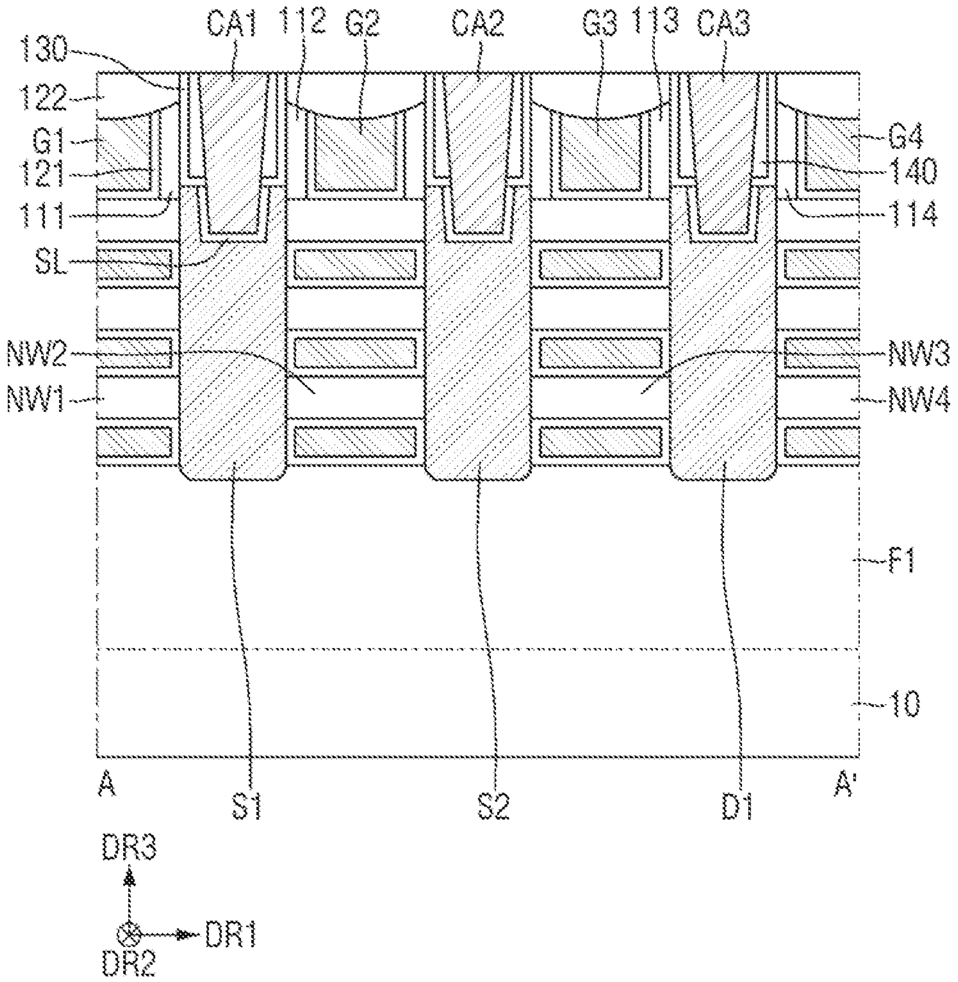
Figure 38:
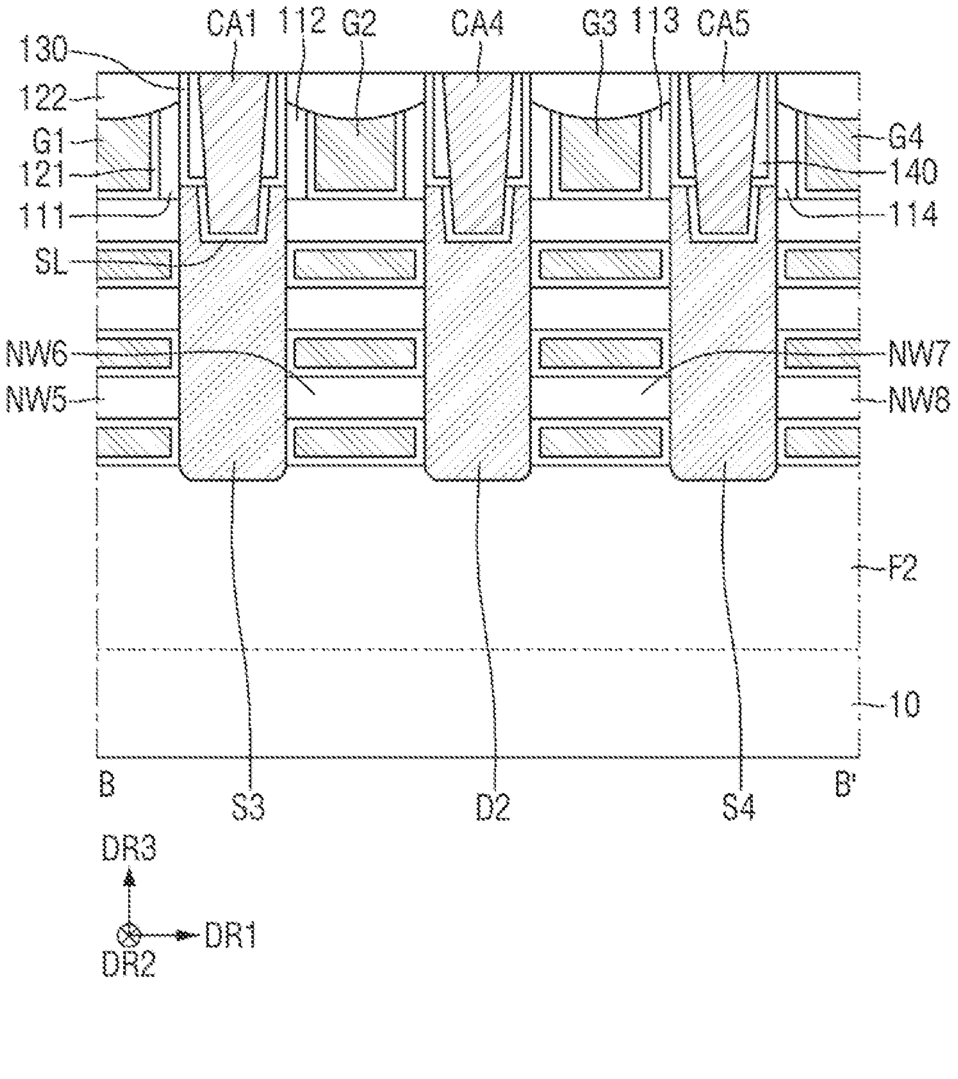
Figure 39:
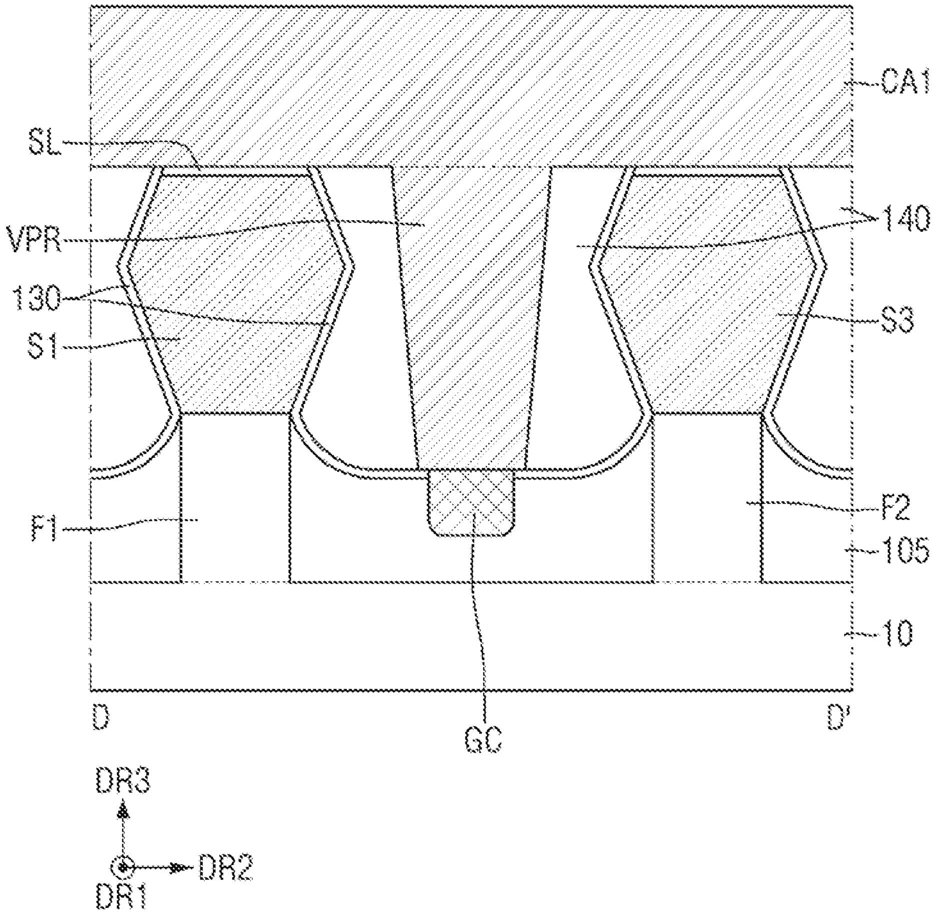
Figure 40:
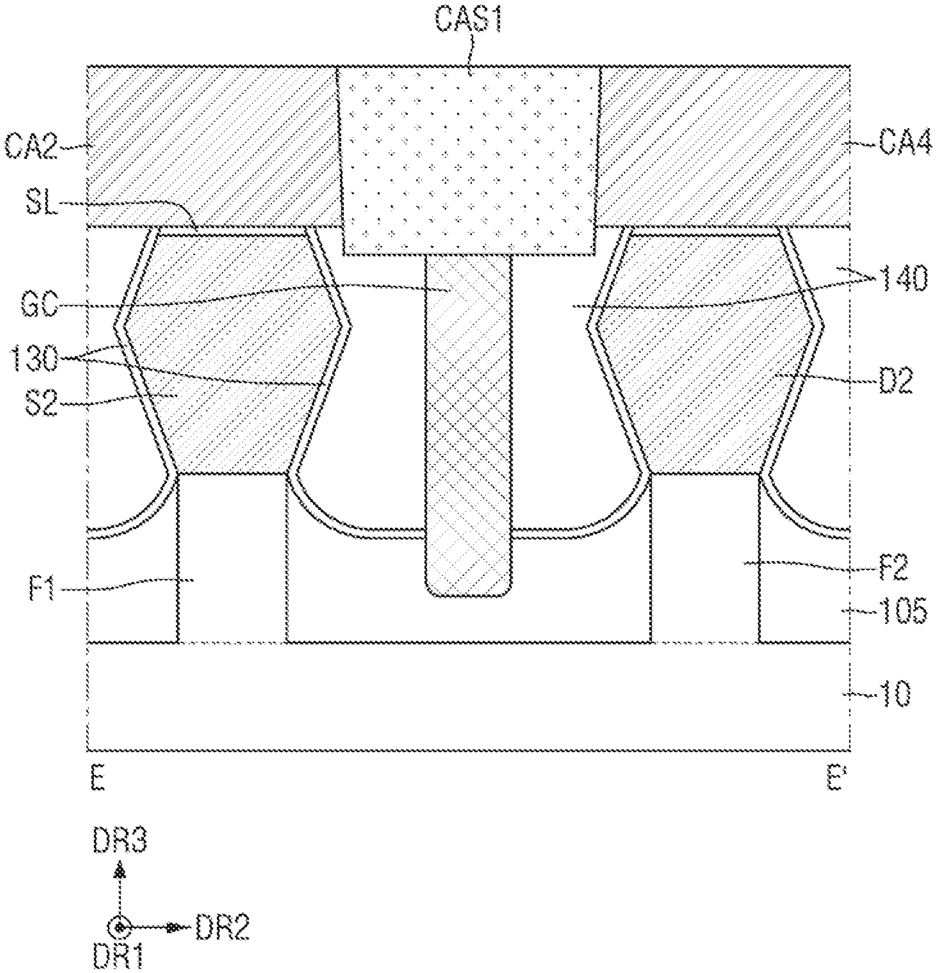
Figure 41:
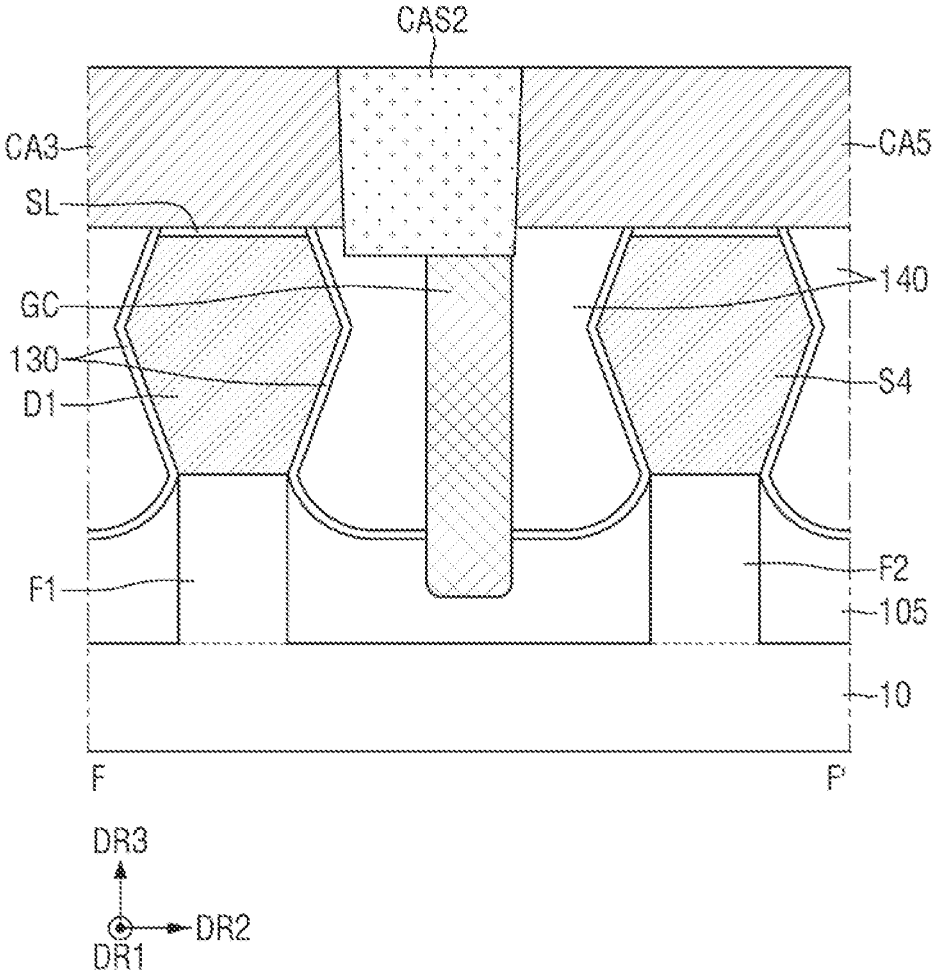
Figure 42:
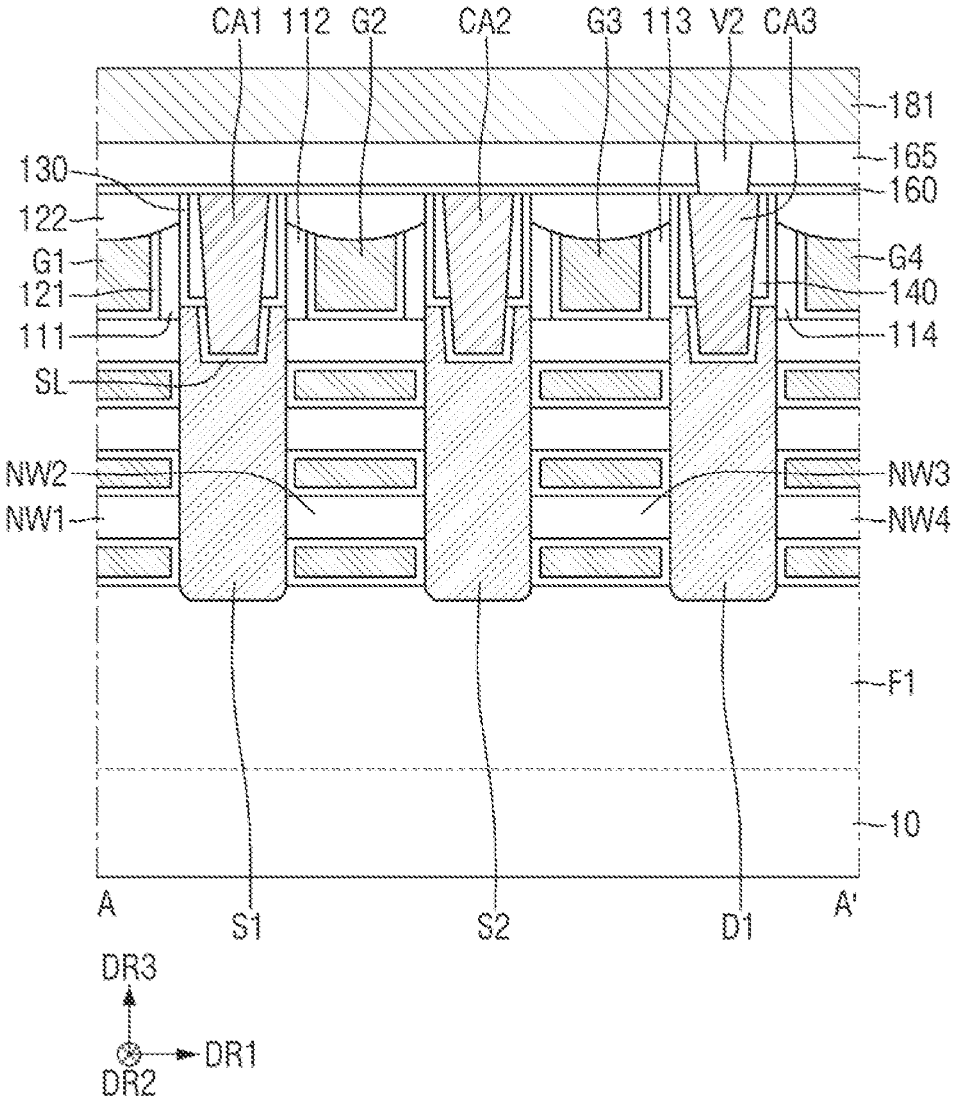
Figure 43:
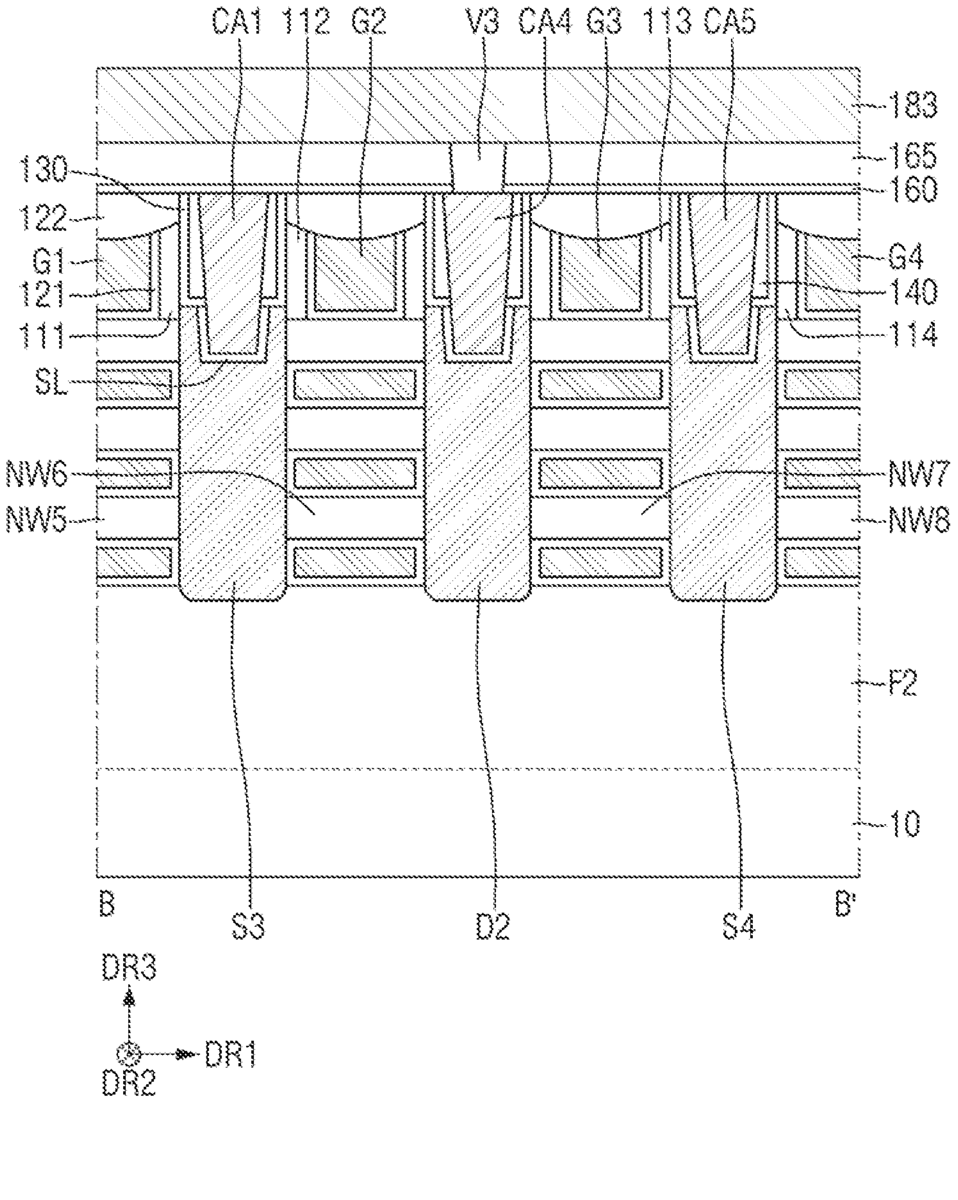
Figure 44:
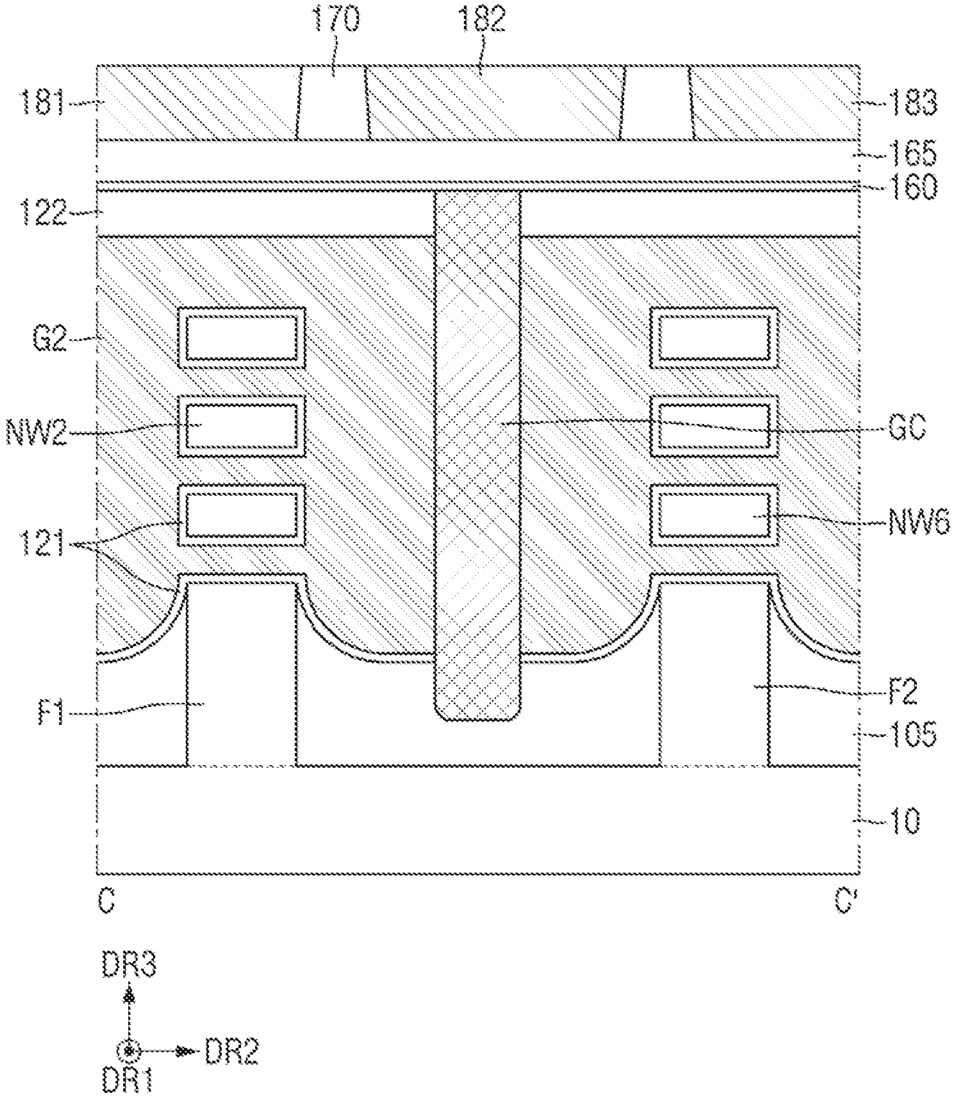
Figure 45:
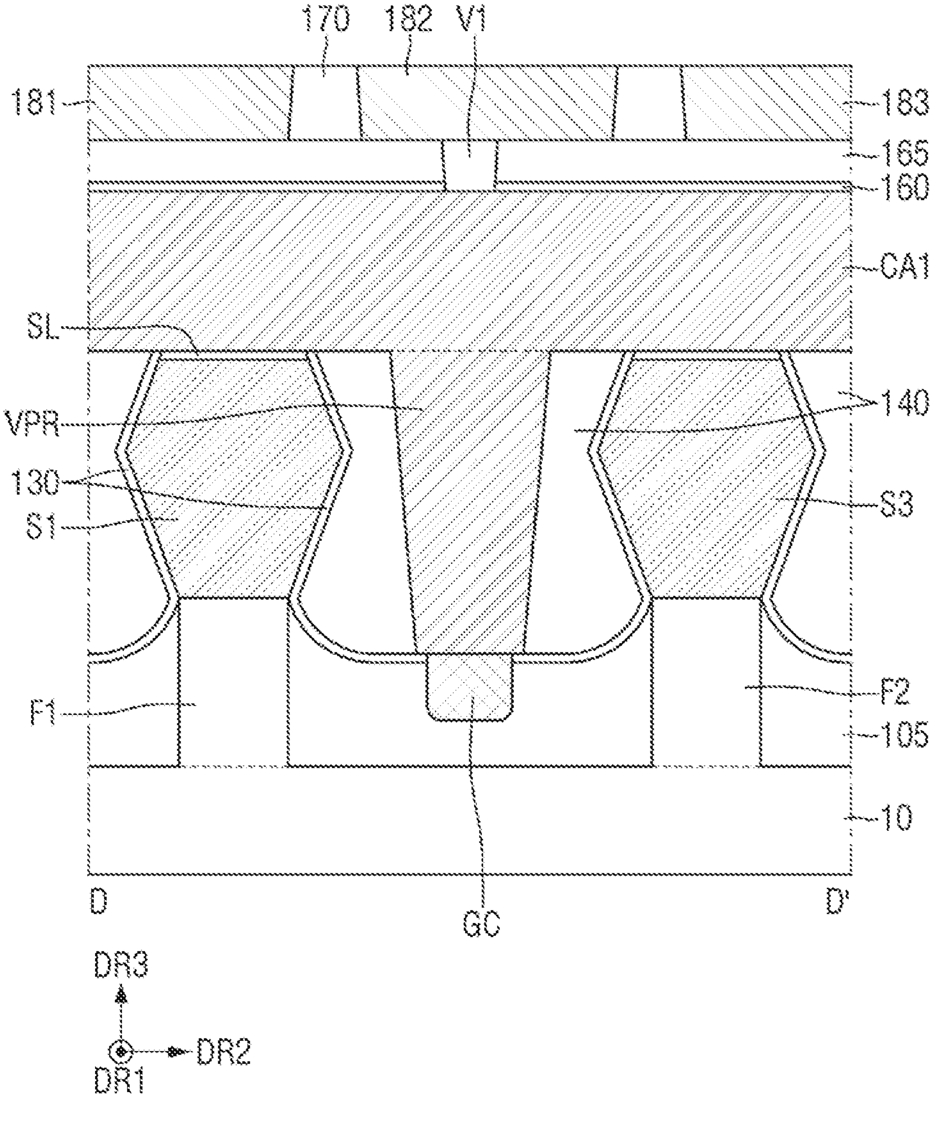
Figure 46:
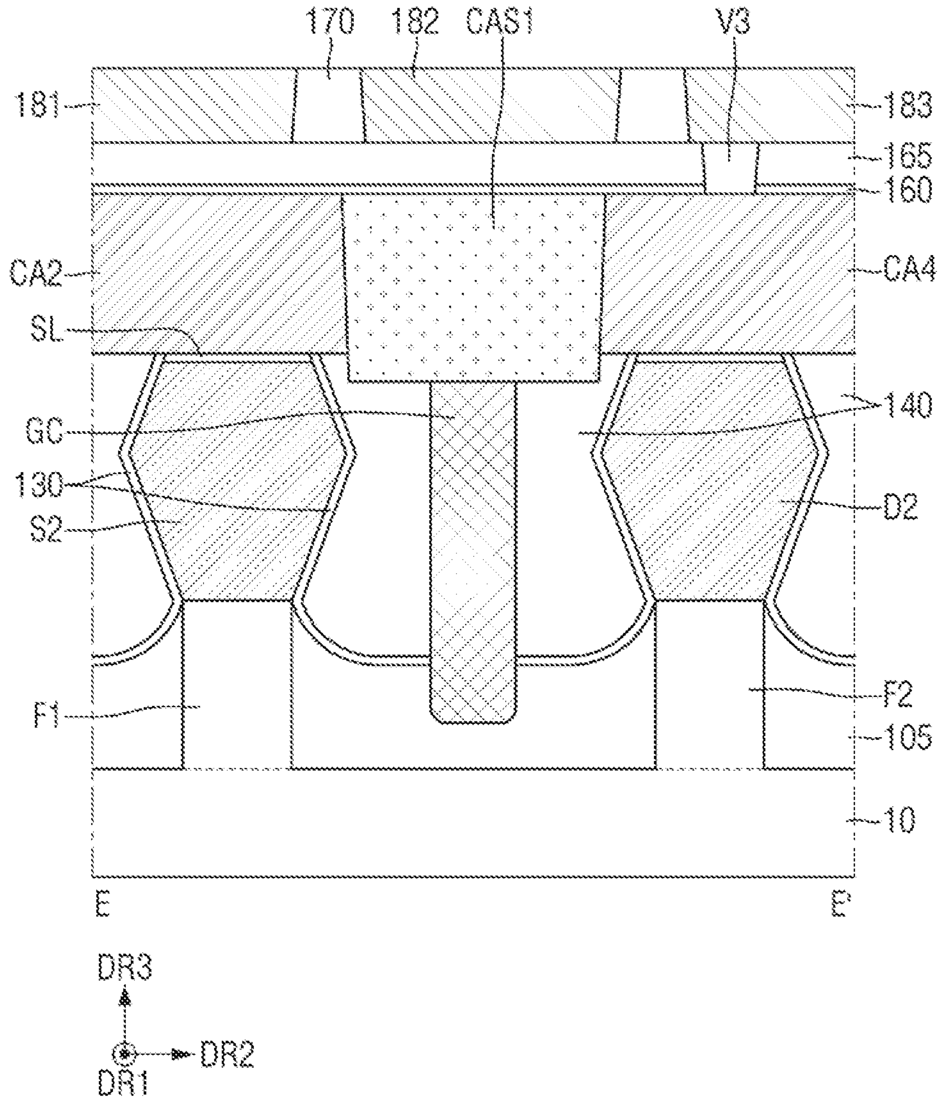
Figure 47:
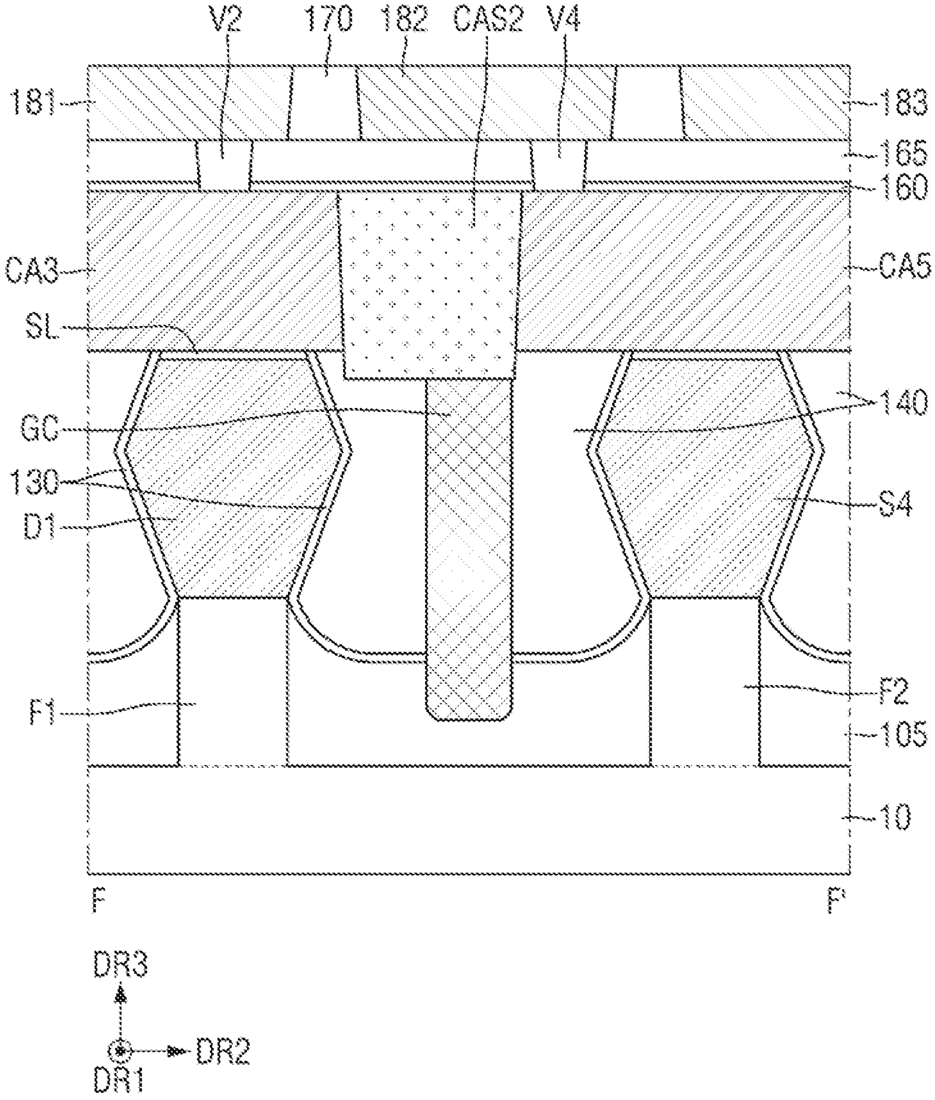

Referring to FIGS. 34 to 36, the mask pattern M and the passivation layer 40 may be removed. As a result, the first contact trench CT1 may be formed on the through via trench VPRT. In addition, second to fifth contact trenches CT2, CT3, CT4 and CT5 may be formed inside the first upper interlayer insulating layer 140.

Referring to FIGS. 37 to 41, a through via VPR may be formed in the through via trench (VPRT of FIG. 34), and a first contact CA1 may be formed inside the first contact trench (CT1 of FIG. 34). The through via VPR and the first contact CA1 may be formed through the same fabricating process. The through via VPR and the first contact CA1 may be integrally formed. In addition, the through via VPR and the first contact CA1 may include the same material as each other.

A second contact CA2 may be formed inside the second contact trench (CT2 of FIG. 35). A third contact CA3 may be formed inside the third contact trench (CT3 of FIG. 36). A fourth contact CA4 may be formed inside the fourth contact trench (CT4 of FIG. 35), and a fifth contact CA5 may be formed inside the fifth contact trench (CT5 of FIG. 36).

Referring to FIGS. 42 to 47, a second etch stop layer 160 and a second upper interlayer insulating layer 165 may be sequentially formed on an upper surface of each of the first upper interlayer insulating layer 140, the capping pattern 122, the gate cut GC, the first and second contact separation layers CAS1 and CAS2 and the first to fifth contacts CA1 to CA5. Subsequently, first to fourth vias V1, V2, V3 and V4 respectively connected to the first contact CA1, the third contact CA3, the fourth contact CA4 and the fifth contact CA5 by passing through the second upper interlayer insulating layer 165 and the second etch stop layer 160 in the vertical direction DR3 may be formed. Subsequently, a third upper interlayer insulating layer 170 and first to third upper wiring layers 181, 182 and 183 may be formed on the second upper interlayer insulating layer 165.

Figure 48:
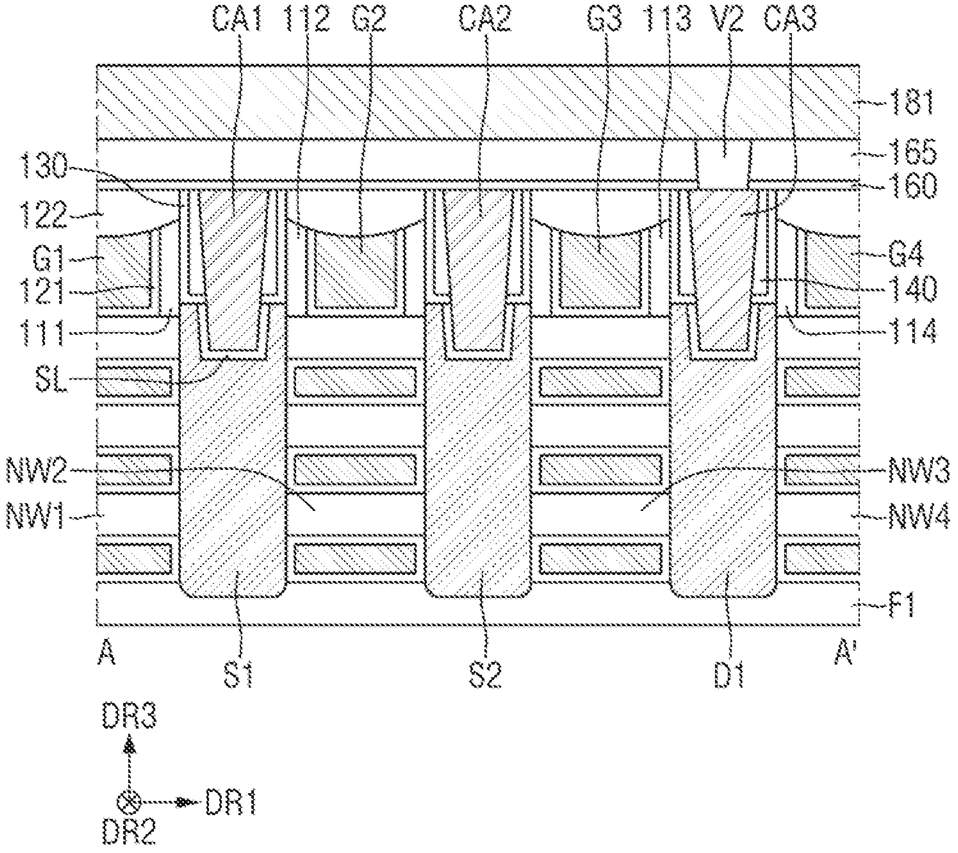
Figure 49:
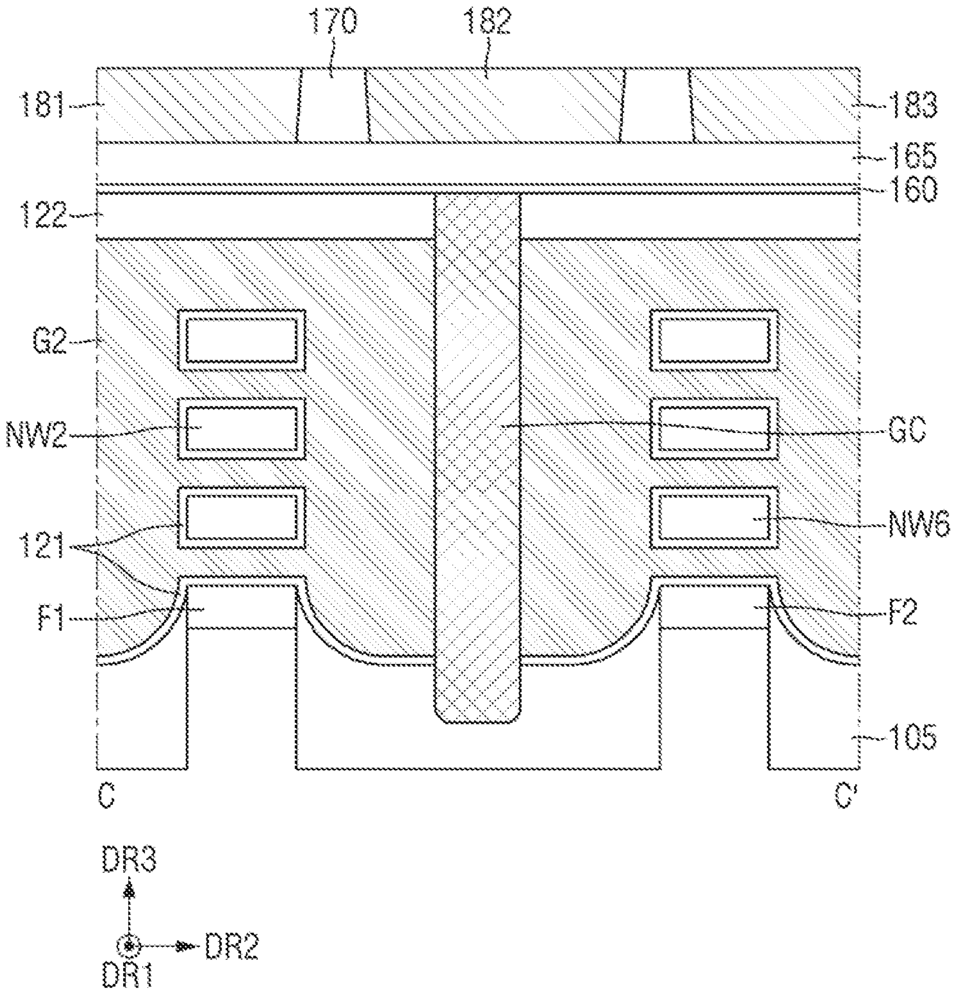
Figure 50:
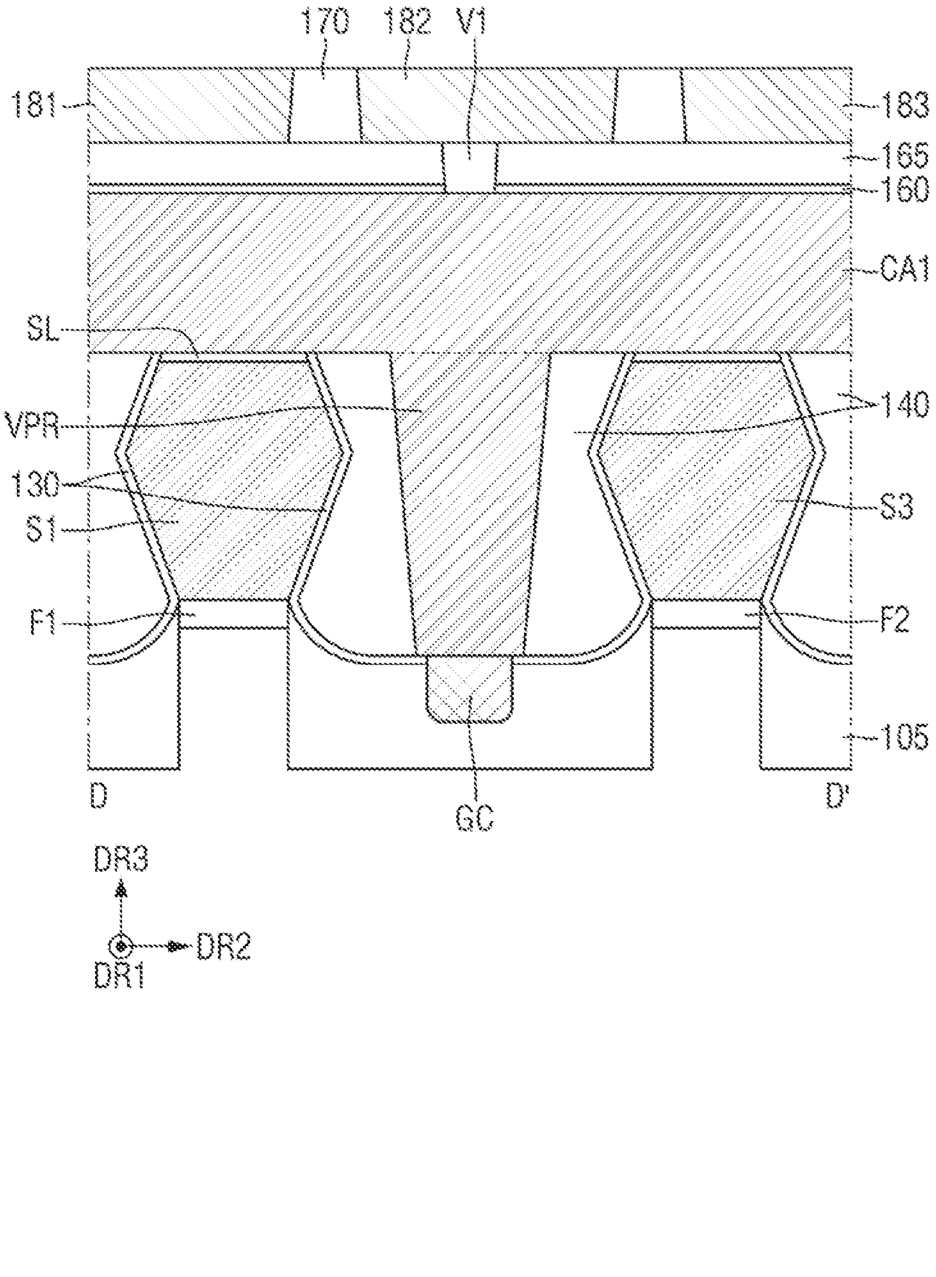

Referring to FIGS. 48 to 50, the substrate (10 of FIGS. 42 to 47) may be etched to expose the lower surface of the field insulating layer 105. A portion of the first active pattern F1 and a portion of the second active pattern F2 may be etched. For example, a lower surface of each of the first and second active patterns F1 and F2, which remain, may be formed to be higher than the upper surface of the field insulating layer 105 that is adjacent to the gate cut GC.

Figure 51:
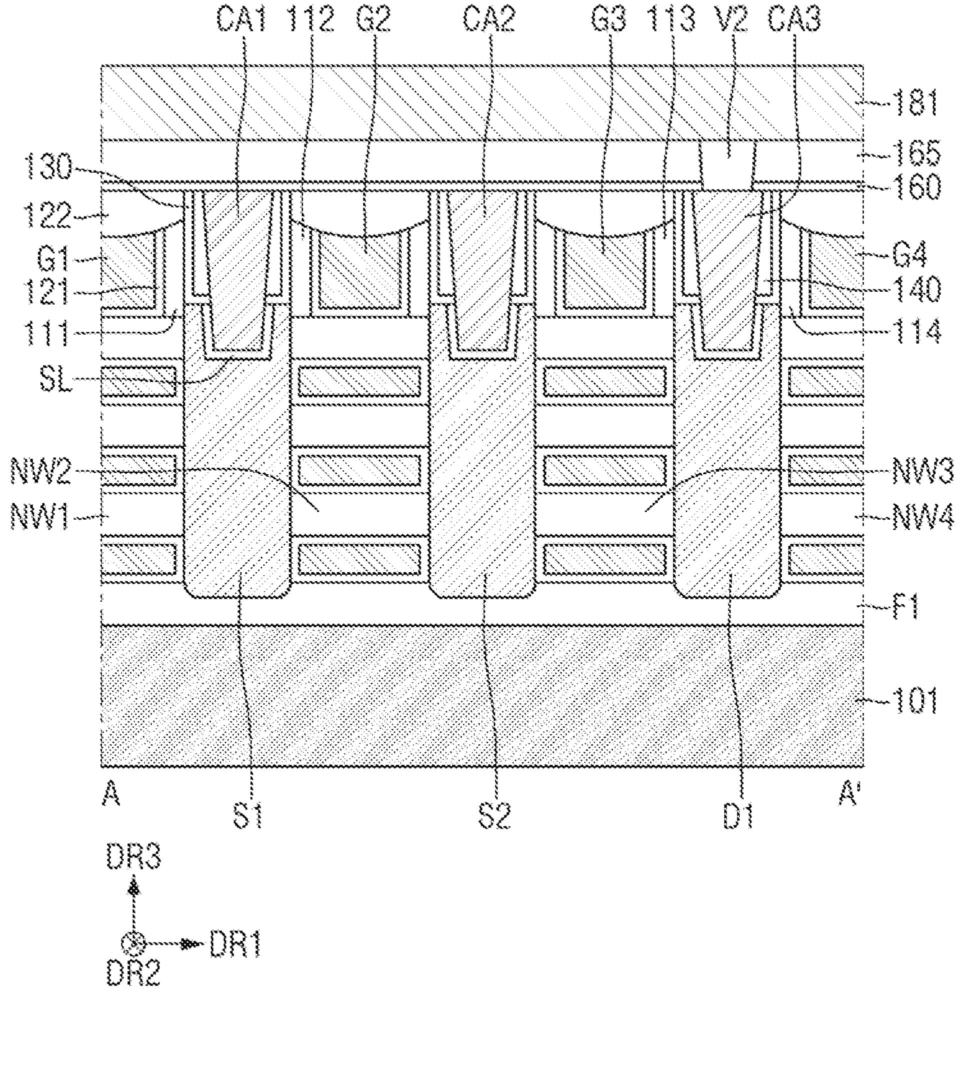
Figure 52:
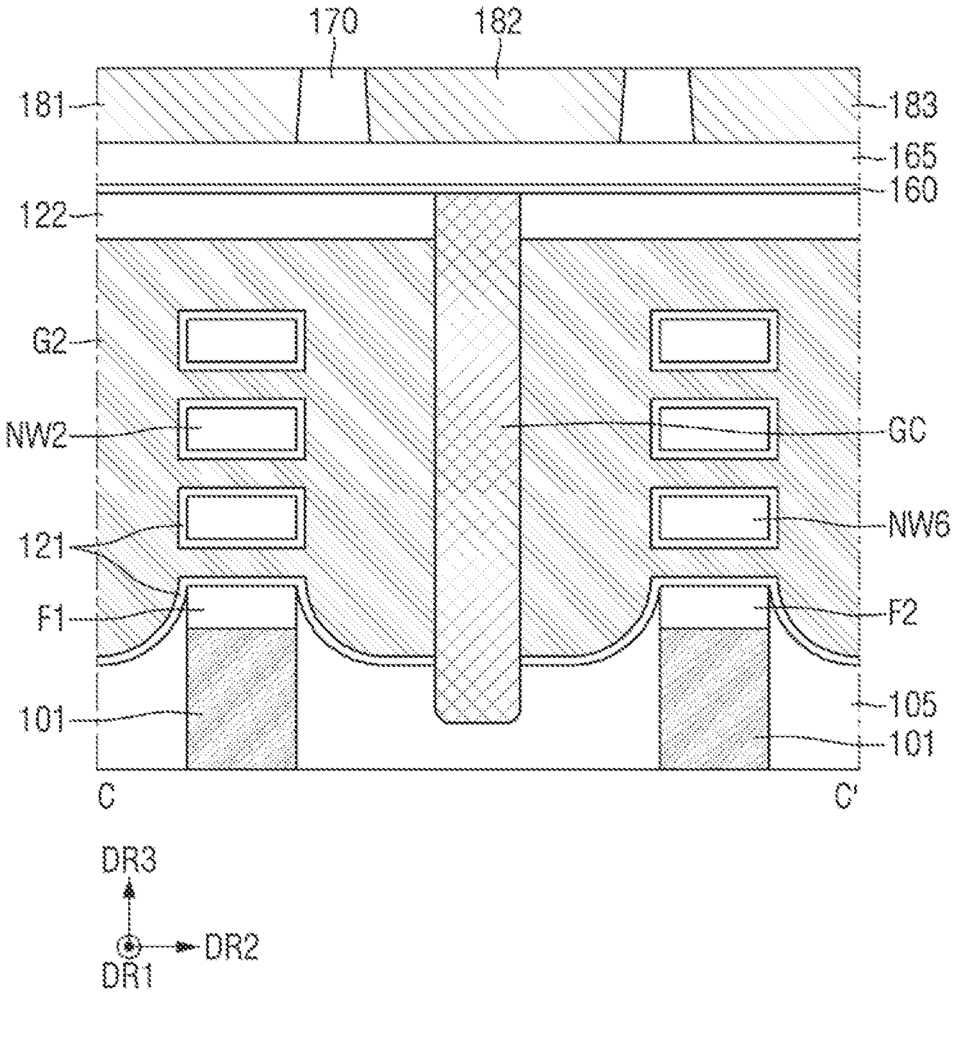
Figure 53:
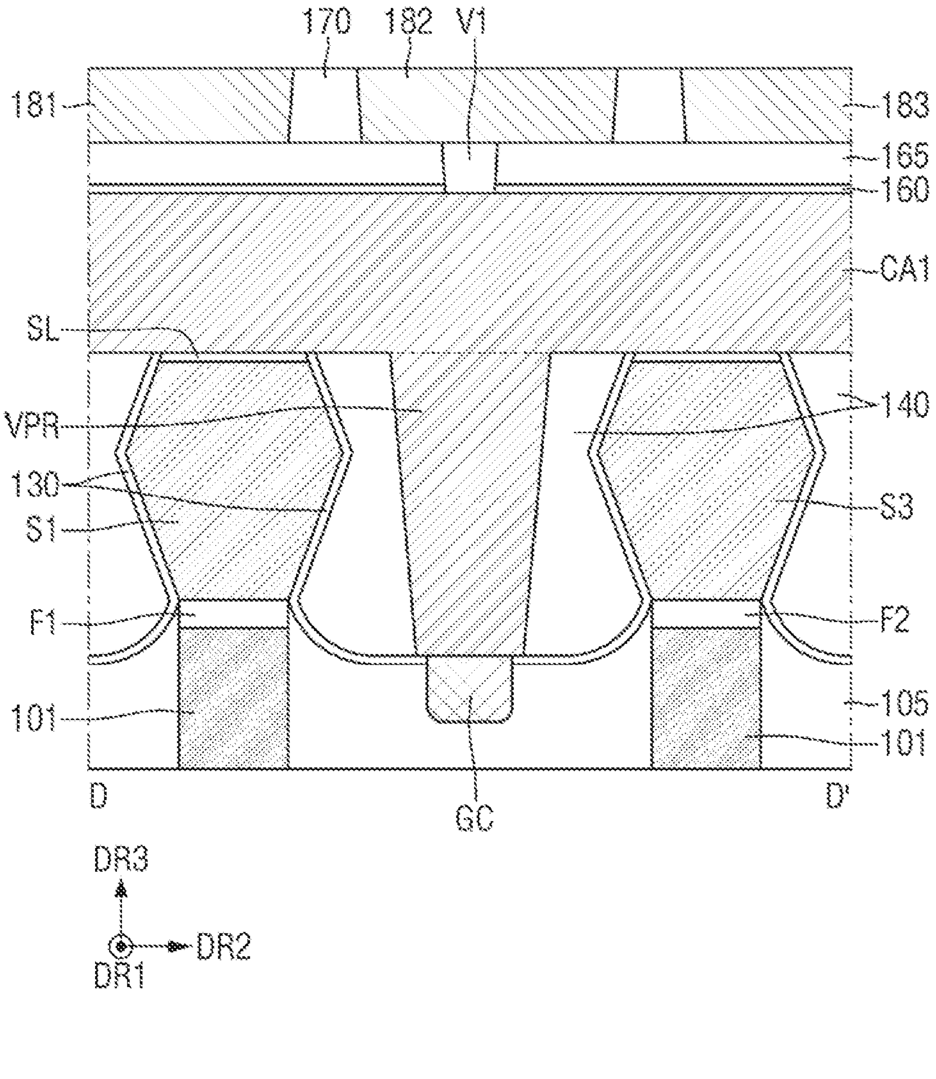

Referring to FIGS. 51 to 53, a lower insulating layer 101 may be formed in a portion from which each of the first active pattern F1 and the second active pattern F2 is partially etched. Subsequently, a planarization process may be performed so that a lower surface of the lower insulating layer 101 and the lower surface of the field insulating layer 105 may be formed on substantially the same plane.

Figure 54:
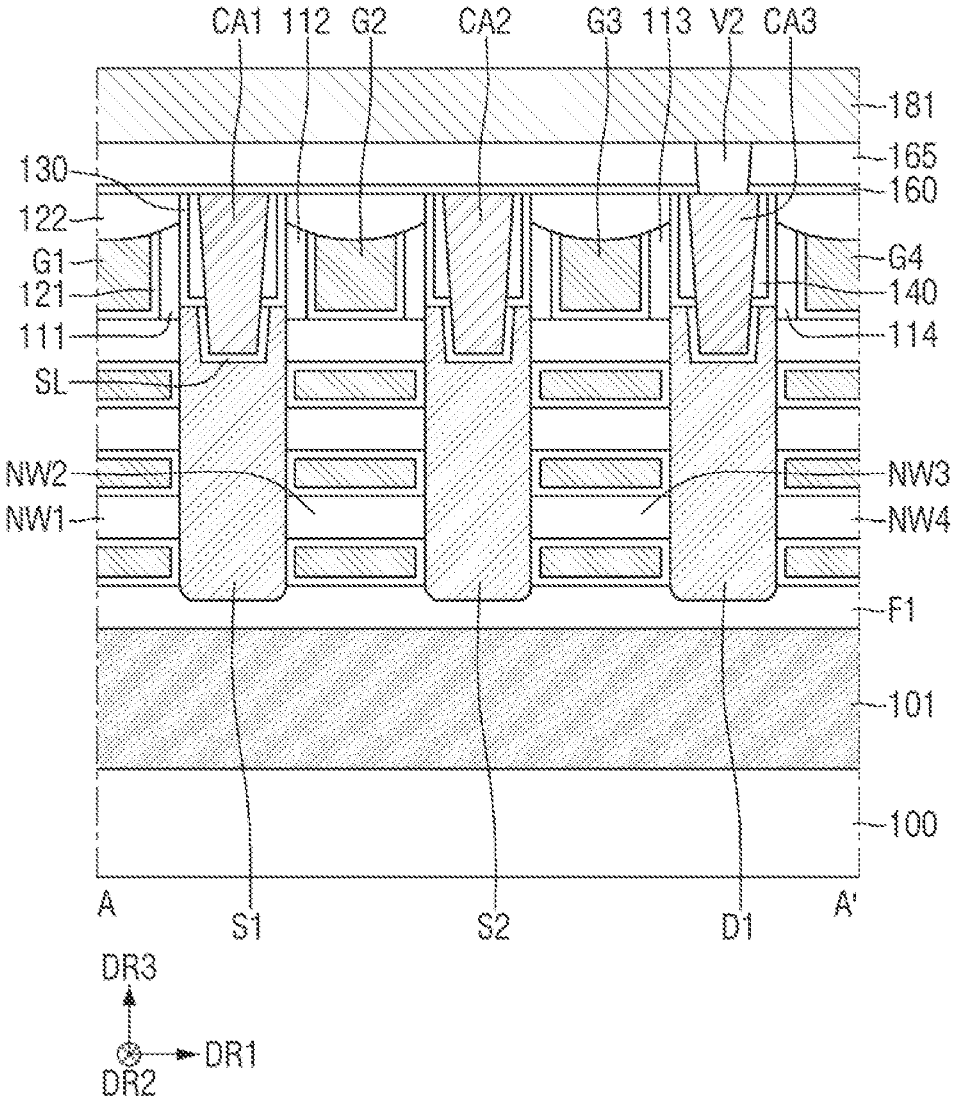
Figure 55:
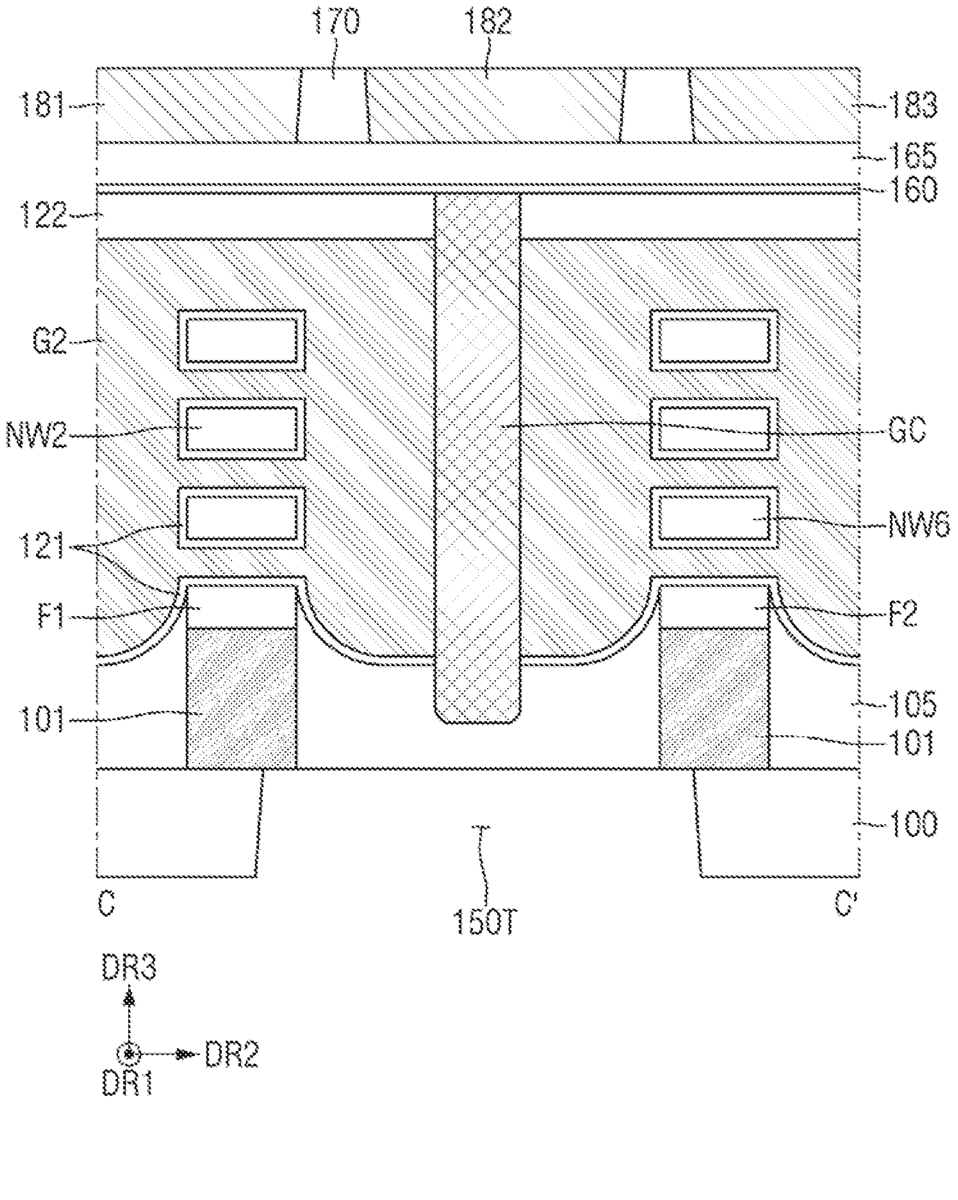
Figure 56:
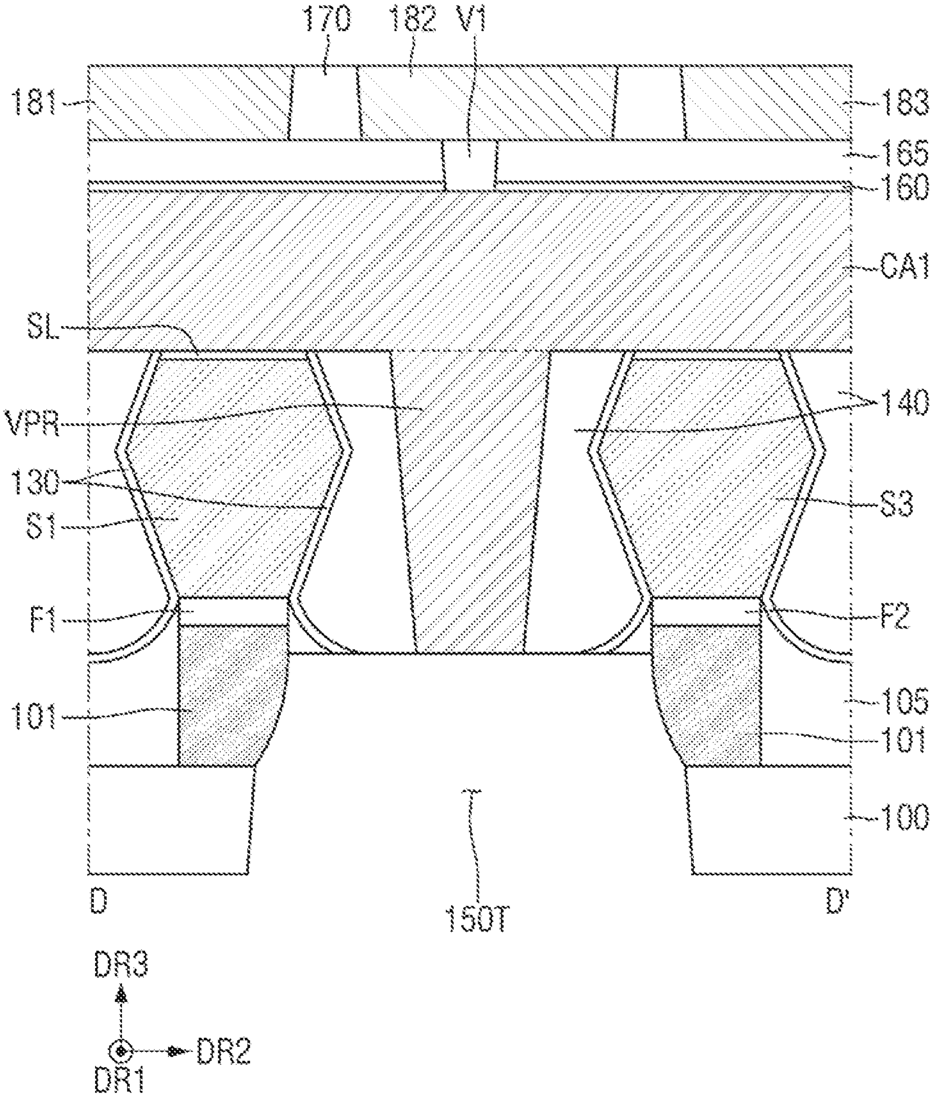

Referring to FIGS. 54 to 56, a lower interlayer insulating layer 100 may be formed on the lower surface of each of the lower insulating layer 101 and the field insulating layer 105. A lower wiring trench 150T may be formed inside the lower interlayer insulating layer 100. The lower wiring trench 150T may be extended in the first horizontal direction DR1 between the first active pattern F1 and the second active pattern F2.

For example, an upper surface of the lower wiring trench 150T may expose a lower surface of the through via VPR between the first source region S1 and the third source region S3. For example, both sidewalls of the lower wiring trench 150T in the second horizontal direction DR2 may be formed in the lower interlayer insulating layer 100 and the lower insulating layer 101 between the first source region S1 and the third source region S3. For example, the upper surface of the lower wiring trench 150T may be defined by the lower surface of the field insulating layer 105 in the remaining region except the region that is between the first source region S1 and the third source region S3.

Referring to FIGS. 2 to 7, a lower wiring layer 150 may be formed inside the lower wiring trench 150T. The lower wiring layer 150 may be extended in the first horizontal direction DR1 between the first active pattern F1 and the second active pattern F2. The lower wiring layer 150 may be connected to the through via VPR between the first source region S1 and the third source region S3. Through this fabricating process, the semiconductor device shown in FIGS. 2 to 7 may be fabricated.

Hereinafter, a semiconductor device according to embodiments of the present inventive concept will be described below with reference to FIGS. 57 and 58. The following description will be based on differences from the semiconductor device shown in FIGS. 1 to 7, and redundant descriptions may be omitted or briefly discussed.

Figure 57:
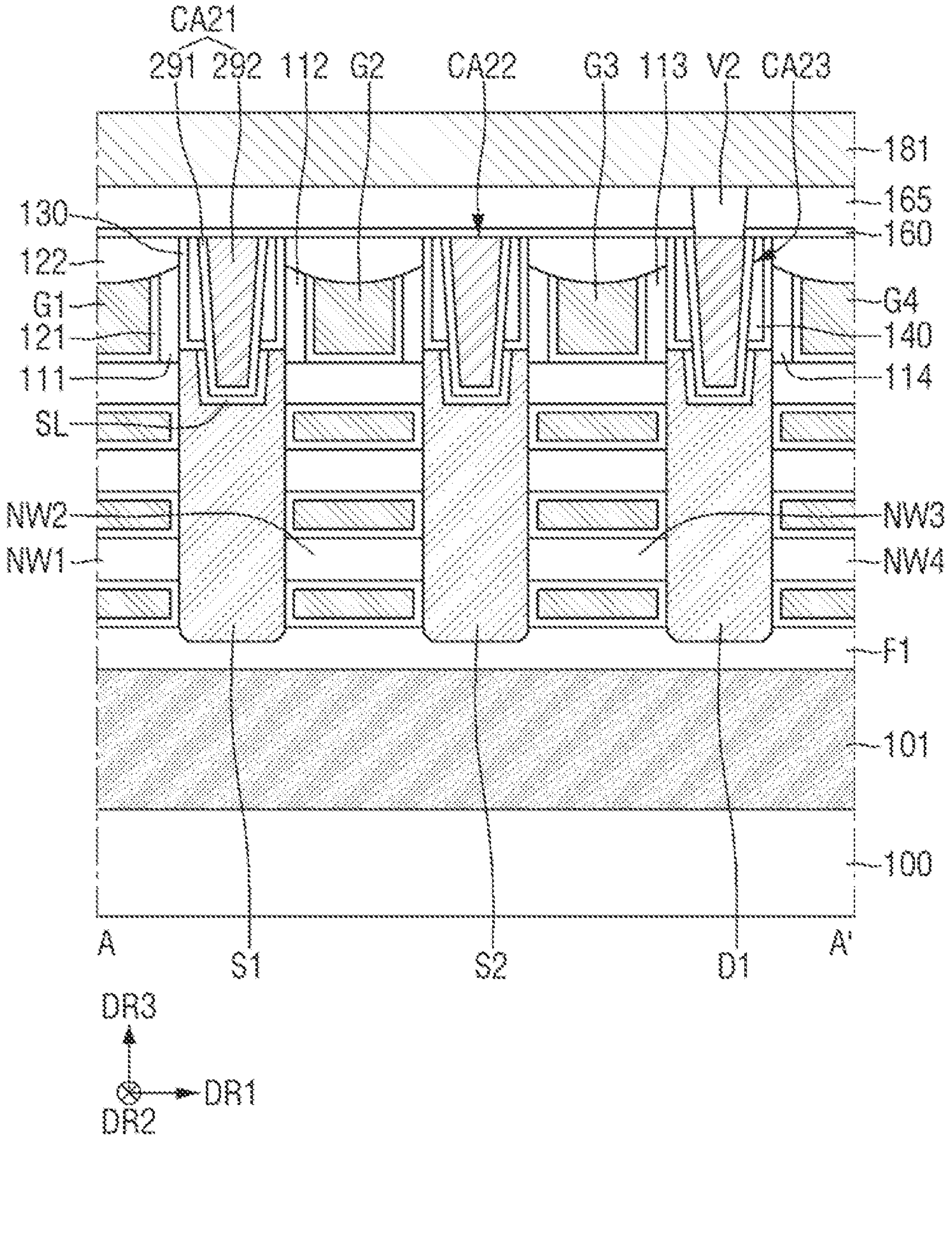
FIGS. 57 and 58 are cross-sectional views illustrating a semiconductor device according to embodiments of the present inventive concept.
Figure 58:
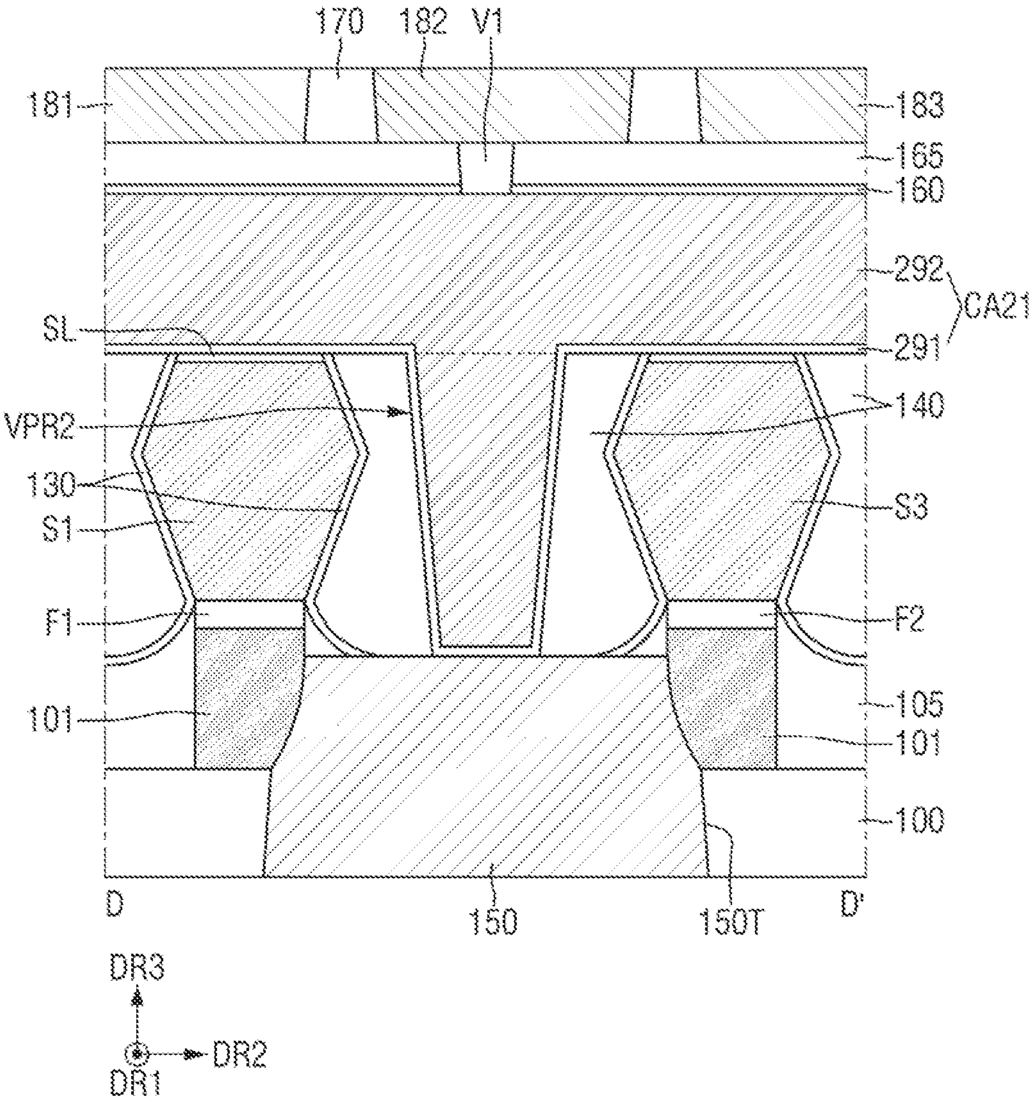

FIGS. 57 and 58 are cross-sectional views illustrating a semiconductor device according to embodiments of the present inventive concept.

Referring to FIGS. 57 and 58, in the semiconductor device according to embodiments of the present inventive concept, each of a through via VPR2 and first to third contacts CA21, CA22 and CA23 may be formed of a double layer. A fourth contact and a fifth contact may be also formed of a double layer.

For example, each of the through via VPR2 and the first to third contacts CA21, CA22 and CA23 may include a contact barrier layer 291 and a contact filling layer 292. The contact barrier layer 291 may form sidewalls and a bottom surface of each of the through via VPR2 and the first to third contacts CA21, CA22 and CA23, but the contact barrier layer 291 is not disposed between the through via VPR2 and the first contact CA21. The contact filling layer 292 may be disposed on the contact barrier layer 291 in each of the through via VPR2 and the first to third contacts CA21, CA22 and CA23. For example, an upper surface of the contact filling layer 292 of the through via VPR2 may be in contact with a lower surface of the contact filling layer 292 of the first contact CA21.

Each of the contact barrier layer 291 and the contact filling layer 292 may include a conductive material. The contact barrier layer 291 may include at least one of, for example, tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir) and/or rhodium (Rh). The contact filling layer 292 may include at least one of, for example, aluminum (Al), tungsten (W), cobalt (Co), ruthenium (Ru) and/or molybdenum (Mo).

Hereinafter, a semiconductor device according to embodiments of the present inventive concept will be described below with reference to FIG. 59. The following description will be based on differences from the semiconductor device shown in FIGS. 1 to 7.

Figure 59:
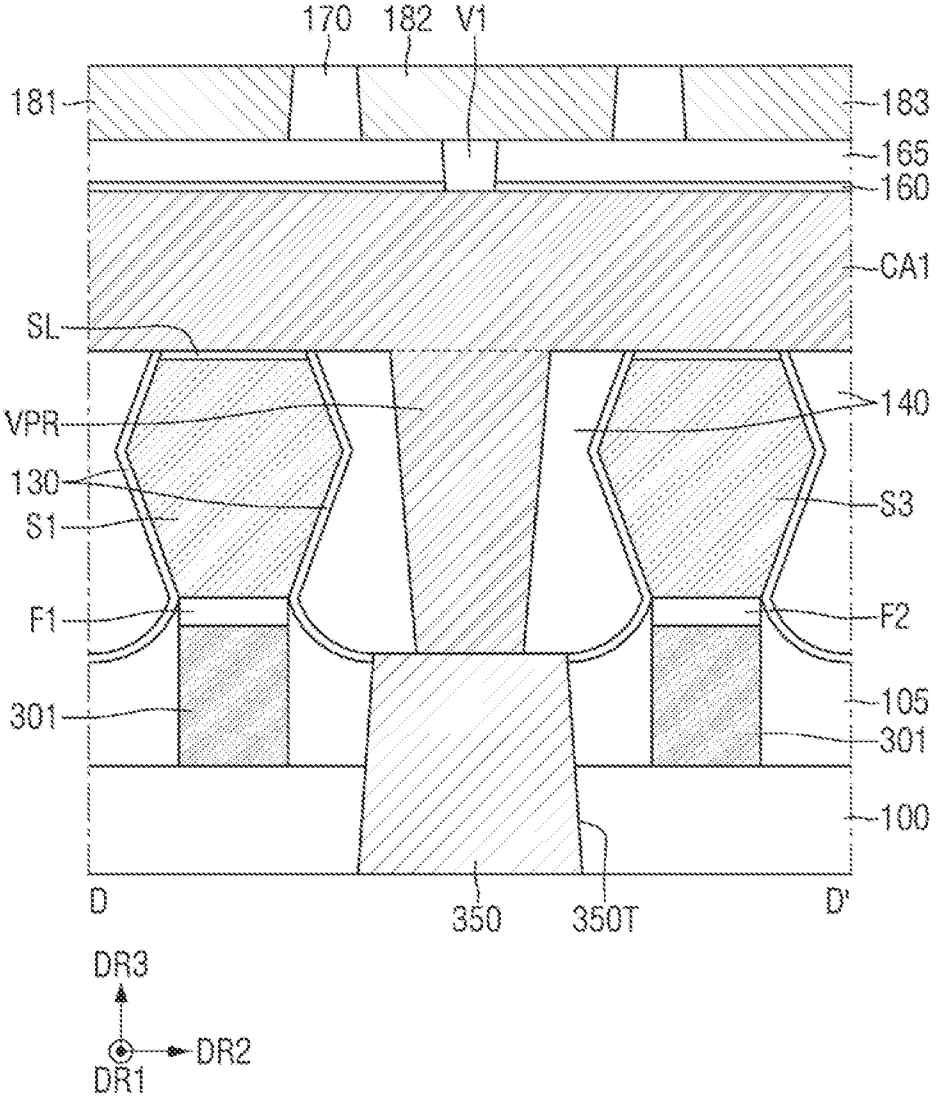
FIG. 59 is a cross-sectional view illustrating a semiconductor device according to embodiments of the present inventive concept.

FIG. 59 is a cross-sectional view illustrating a semiconductor device according to embodiments of the present inventive concept.

Referring to FIG. 59, in the semiconductor device according to embodiments of the present inventive concept, a lower wiring layer 350 may be spaced apart from a lower insulating layer 301 in the second horizontal direction DR2.

For example, the lower wiring trench 350T may be formed between the lower insulating layer 301 that is disposed below the first active pattern F1 and the lower insulating layer 301 that is disposed below the second active pattern F2. The lower wiring layer 350 may be disposed inside the lower wiring trench 350T. The lower wiring layer 350 may be spaced apart from each of the lower insulating layer 301 that is disposed below the first active pattern F1 and the lower insulating layer 301 that is disposed below the second active pattern F2 in the second horizontal direction DR2.

For example, the lower wiring layer 350 does not overlap each of the first active pattern F1 and the second active pattern F2 in the vertical direction DR3. In addition, the lower wiring layer 350 does not overlap each of the lower insulating layer 301 that is disposed below the first active pattern F1 and the lower insulating layer 301 that is disposed below the second active pattern F2 in the vertical direction DR3.

Hereinafter, a semiconductor device according to embodiments of the present inventive concept will be described below with reference to FIG. 60. The following description will be based on differences from the semiconductor device shown in FIGS. 1 to 7, and redundant descriptions may be omitted or briefly discussed.

Figure 60:
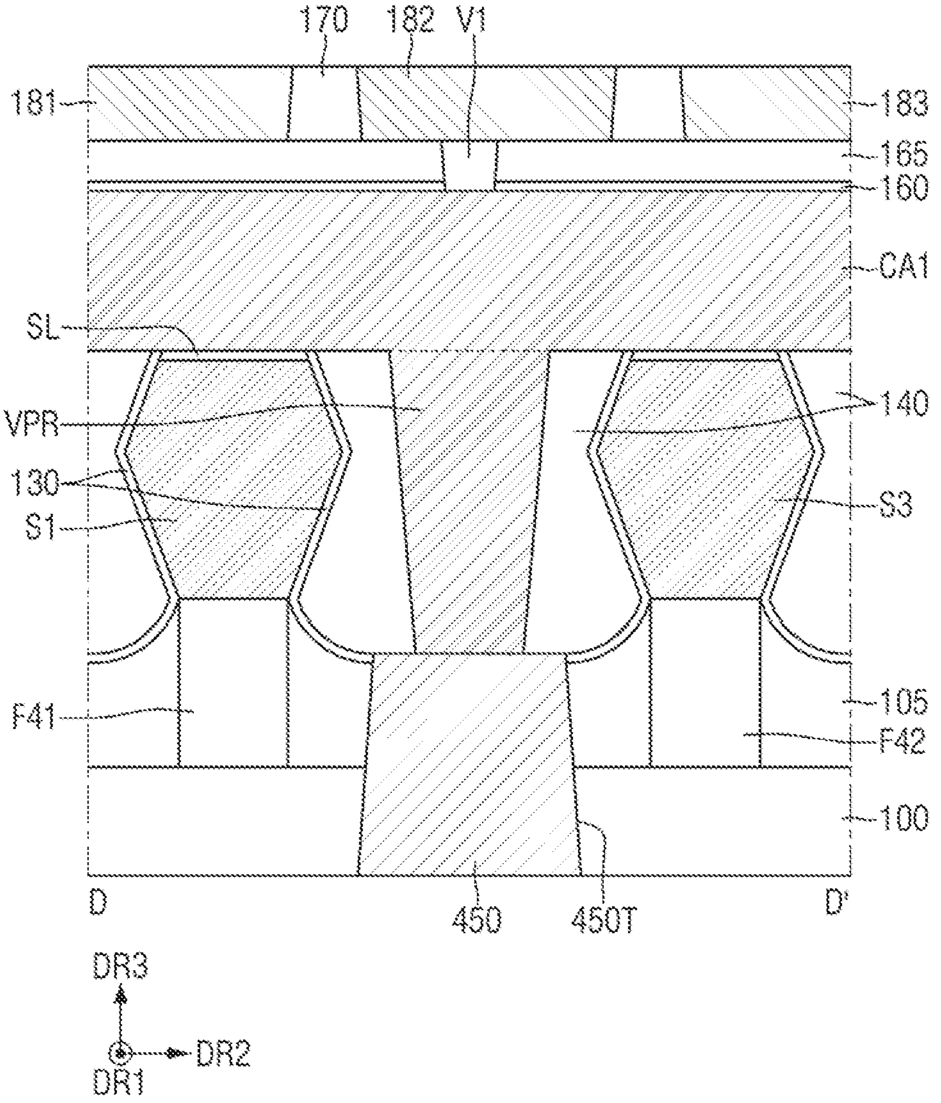
FIG. 60 is a cross-sectional view illustrating a semiconductor device according to embodiments of the present inventive concept.

FIG. 60 is a cross-sectional view illustrating a semiconductor device according to embodiments of the present inventive concept.

Referring to FIG. 60, in the semiconductor device according to embodiments of the present inventive concept, a lower wiring layer 450 may be spaced apart from each of a first active pattern F41 and a second active pattern F42 in the second horizontal direction DR2. In addition, a lower insulating layer (101 of FIGS. 2 to 7) is not disposed.

For example, a lower surface of each of the first active pattern F41 and the second active pattern F42 may be in contact with the upper surface of the lower interlayer insulating layer 100. A lower wiring trench 450T may be formed between the first active pattern F41 and the second active pattern F42. The lower wiring layer 450 may be disposed inside the lower wiring trench 450T. The lower wiring layer 450 may be spaced apart from each of the first active pattern F41 and the second active pattern F42 in the second horizontal direction DR2. For example, the lower wiring layer 450 does not overlap each of the first active pattern F41 and the second active pattern F42 in the vertical direction DR3.

Hereinafter, a semiconductor device according to embodiments of the present inventive concept will be described below with reference to FIG. 61. The following description will be based on differences from the semiconductor device shown in FIGS. 1 to 7, and redundant descriptions may be omitted or briefly discussed.

Figure 61:
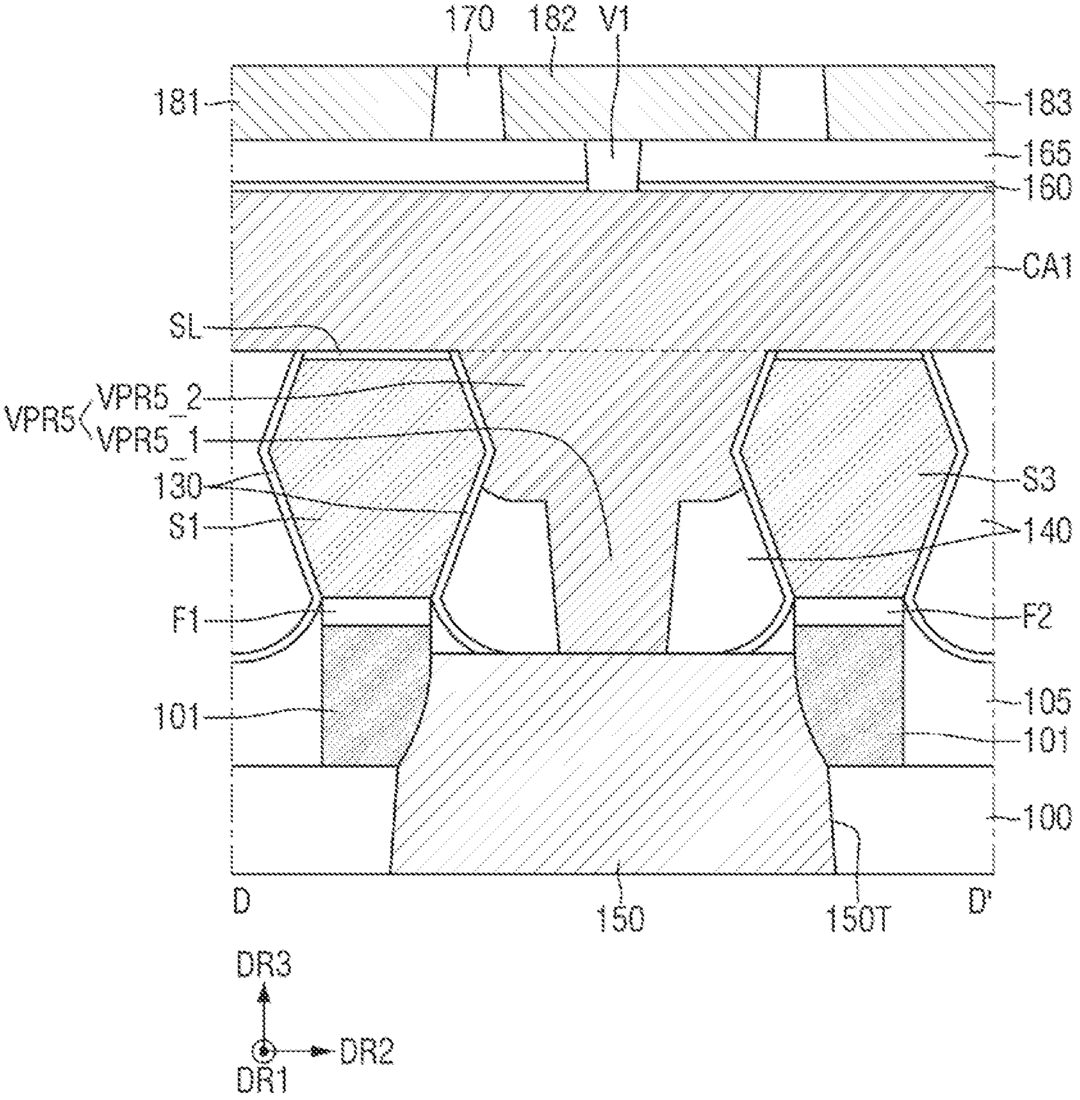
FIG. 61 is a cross-sectional view illustrating a semiconductor device according to embodiments of the present inventive concept.

FIG. 61 is a cross-sectional view illustrating a semiconductor device according to embodiments of the present inventive concept.

Referring to FIG. 61, in the semiconductor device according to embodiments of the present inventive concept, a portion of sidewalls of a through via VPR5 in the second horizontal direction DR2 may be in contact with the first etch stop layer 130.

For example, the through via VPR5 may include a first portion VPR5_1, which is in contact with the lower wiring layer 150, and a second portion VPR5_2, which is in contact with the first contact CA1. For example, sidewalls of the first portion VPR5_1 of the through via VPR5 in the second horizontal direction DR2 may be spaced apart from the first etch stop layer 130, which is disposed on the sidewalls of each of the first and third source regions S1 and S3, in the second horizontal direction DR2. A first upper interlayer insulating layer 140 may be disposed between the first etch stop layer 130 and the sidewall of the first portion VPR5_1 of the through via VPR5. For example, sidewalls of the second portion VPR5_2 of the through via VPR5 in the second horizontal direction DR2 may be in contact with the first etch stop layer 130 that is disposed on the sidewalls of each of the first source region S1 and the third source region S3.

Hereinafter, a semiconductor device according to embodiments of the present inventive concept will be described below with reference to FIG. 62. The following description will be based on differences from the semiconductor device shown in FIGS. 1 to 7, and redundant descriptions may be omitted or briefly discussed.

Figure 62:
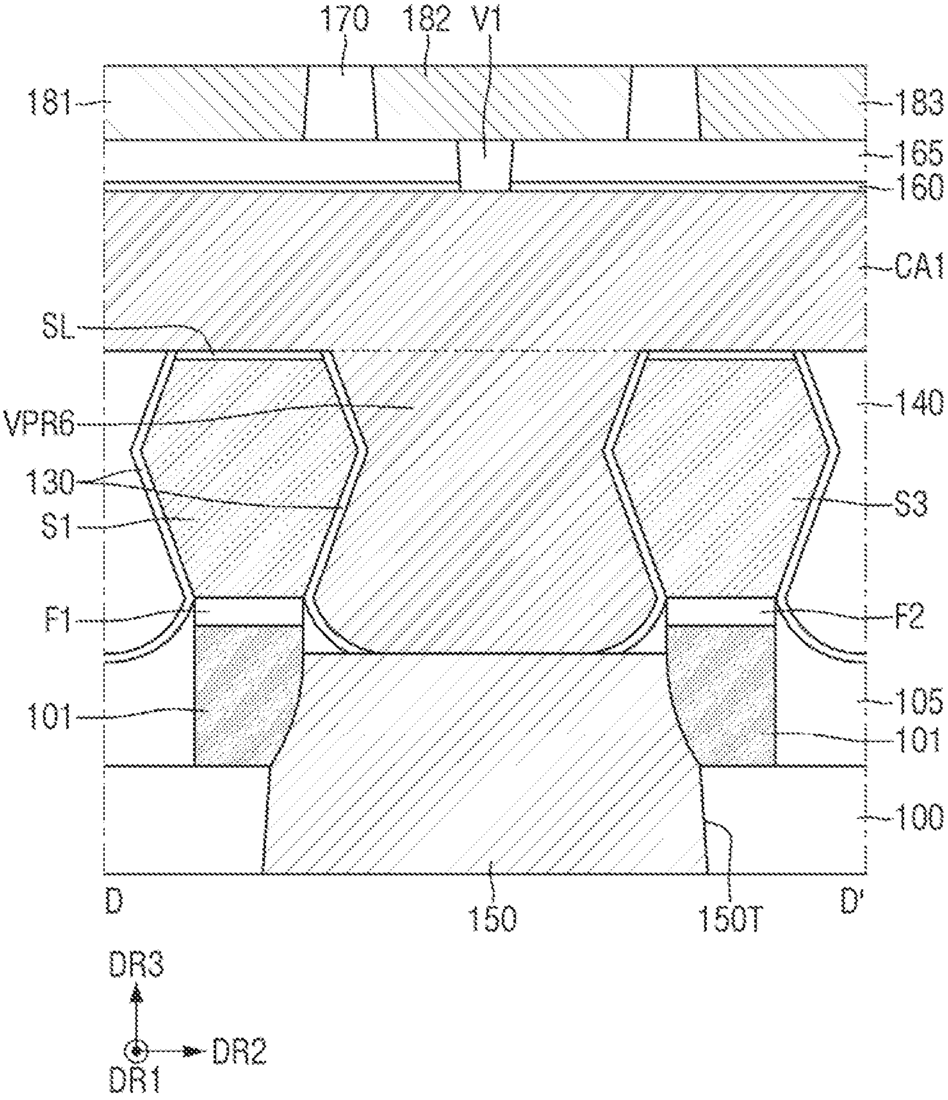
FIG. 62 is a cross-sectional view illustrating a semiconductor device according to embodiments of the present inventive concept.

FIG. 62 is a cross-sectional view illustrating a semiconductor device according to embodiments of the present inventive concept.

Referring to FIG. 62, in the semiconductor device according to embodiments of the present inventive concept, an entirety of sidewalls of a through via VPR6 may contact the first etch stop layer 130.

For example, the sidewalls of the through via VPR6 in the second horizontal direction DR2 may be entirely in contact with the first etch stop layer 130 between the first source region S1 and the third source region S3. For example, the first upper interlayer insulating layer 140 is not disposed between the sidewalls of the through via VPR6 and the first etch stop layer 130.

Hereinafter, a semiconductor device according to embodiments of the present inventive concept will be described below with reference to FIG. 62. The following description will be based on differences from the semiconductor device shown in FIGS. 1 to 7, and redundant descriptions may be omitted or briefly discussed.

Figure 63:
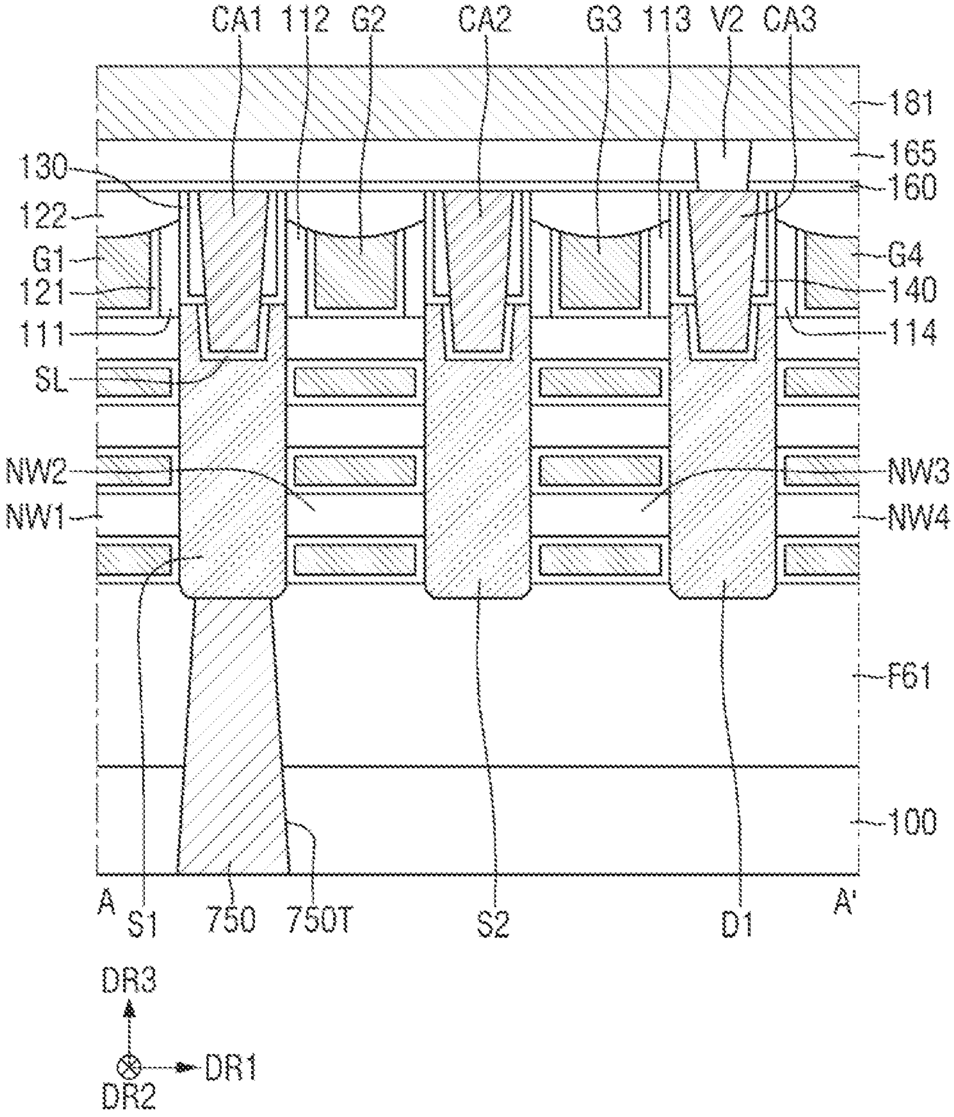
FIGS. 63 and 64 are cross-sectional views illustrating a semiconductor device according to embodiments of the present inventive concept.
Figure 64:
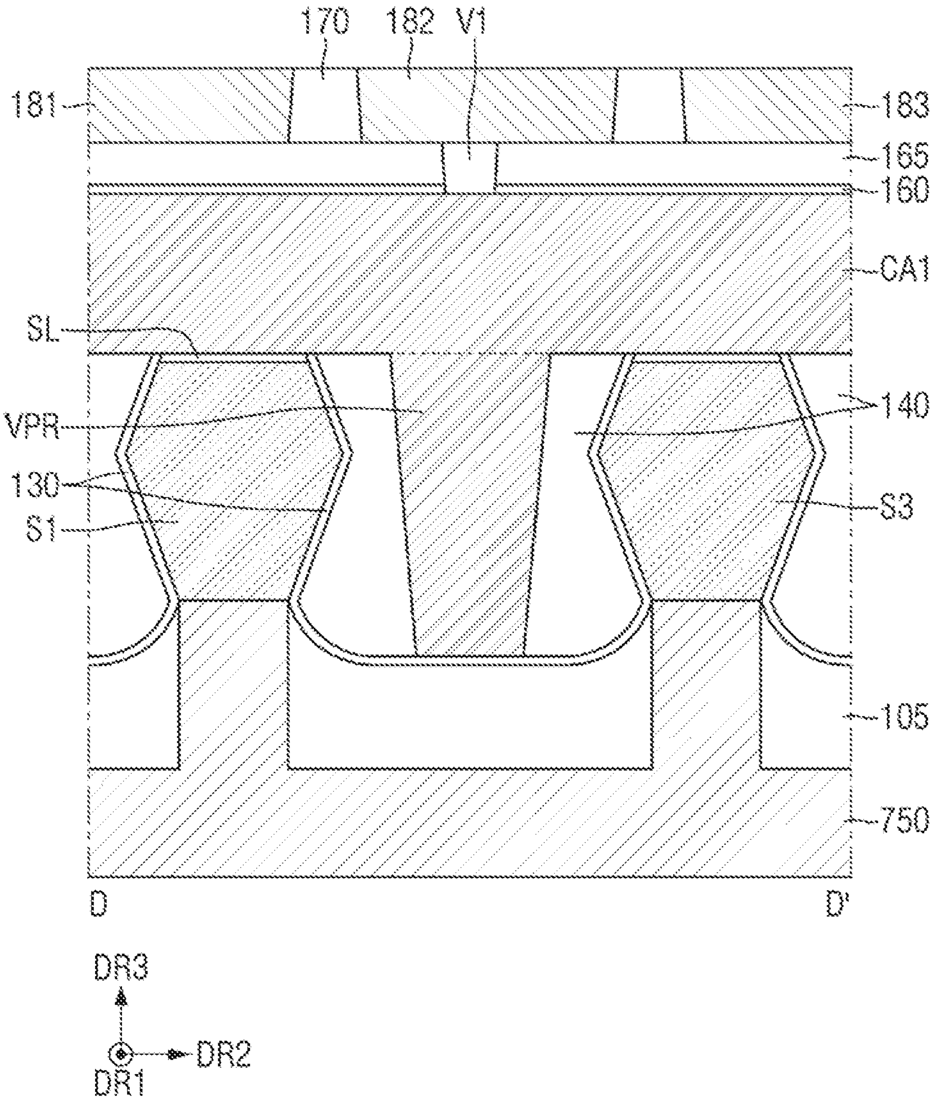

FIGS. 63 and 64 are cross-sectional views illustrating a semiconductor device according to embodiments of the present inventive concept.

Referring to FIGS. 63 and 64, in the semiconductor device according to embodiments of the present inventive concept, a lower wiring layer 750 may be extended in the second horizontal direction DR2.

For example, a lower wiring trench 750T may be formed inside the lower interlayer insulating layer 100. The lower wiring trench 750T may be extended in the second horizontal direction DR2 between the first gate electrode G1 and the second gate electrode G2. The lower wiring trench 750T may be extended in the vertical direction DR3 below each of the first source region S1 and the third source region S3. For example, an upper surface of the lower wiring trench 750T may be defined as a lower surface of each of the first source region S1 and the third source region S3 below each of the first source region S1 and the third source region S3.

For example, the lower wiring layer 750 may be disposed inside the lower wiring trench 750T. The lower wiring layer 750 may be extended in the second horizontal direction DR2 between the first gate electrode G1 and the second gate electrode G2. The lower wiring layer 750 may protrude in the vertical direction DR3 from the upper surface of the lower interlayer insulating layer 100 below each of the first source region S1 and the third source region S3. Sidewalls of the lower wiring layer 750, which protrude in the vertical direction DR3 from the upper surface of the lower interlayer insulating layer 100, may be surrounded by a first active pattern F61 and the field insulating layer 105. For example, the lower wiring layer 750 may be in contact with a lower surface of each of the first source region S1 and the third source region S3.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:

a lower interlayer insulating layer;

first and second active patterns extended in a first horizontal direction on the lower interlayer insulating layer, wherein the second active pattern is spaced apart from the first active pattern in a second horizontal direction that is different from the first horizontal direction;

a gate electrode extended in the second horizontal direction on the first and second active patterns;

a first source region disposed on a first side of the gate electrode and disposed on the first active pattern;

a second source region disposed on a second side of the gate electrode, which opposes the first side of the gate electrode in the first horizontal direction, and disposed on the first active pattern;

a third source region disposed on the first side of the gate electrode and disposed on the second active pattern;

a drain region disposed on the second side of the gate electrode and disposed on the second active pattern;

a first contact extended on the first side of the gate electrode in the second horizontal direction, wherein the first contact is connected to each of the first and third source regions;

a second contact extended on the second side of the gate electrode in the second horizontal direction, wherein the second contact is connected to the second source region;

a third contact extended on the second side of the gate electrode in the second horizontal direction, wherein the third contact is spaced apart from the second contact in the second horizontal direction, and the third contact is connected to the drain region;

a lower wiring layer disposed inside the lower interlayer insulating layer, wherein the lower wiring layer extends in the first horizontal direction between the first active pattern and the second active pattern, wherein at least a portion of the lower wiring layer protrudes from an upper surface of the lower interlayer insulating layer in a vertical direction below the first contact; and a through via disposed between the first source region and the third source region, wherein the through via connects the lower wiring layer with the first contact, wherein each of the second contact and the third contact is electrically insulated from the lower wiring layer between the second source region and the drain region.

2. The semiconductor device of claim 1, further comprising a gate cut extended in the first horizontal direction between the first active pattern and the second active pattern, wherein the gate cut separates the gate electrode in the second horizontal direction.

3. The semiconductor device of claim 1, wherein the first contact and the through via are integrally formed.

4. The semiconductor device of claim 3, wherein each of the first contact and the through via is formed of a single material.

5. The semiconductor device of claim 1, wherein an upper surface of the lower wiring layer is formed on the same plane as the upper surface of the lower interlayer insulating layer between the second source region and the drain region.

6. The semiconductor device of claim 1, wherein an upper surface of the lower wiring layer is formed on the same plane as the upper surface of the lower interlayer insulating layer below the gate electrode.

7. The semiconductor device of claim 1, wherein the lower wiring layer is spaced apart from each of the first and second active patterns.

8. The semiconductor device of claim 1, wherein the lower wiring layer overlaps each of the first and second active patterns in the vertical direction.

9. The semiconductor device of claim 1, further comprising:

a lower insulating layer disposed between the upper surface of the lower interlayer insulating layer and a lower surface of each of the first and second active patterns, wherein the lower insulating layer is in contact with the lower wiring layer; and a field insulating layer disposed on the upper surface of the lower interlayer insulating layer, wherein the field insulating layer at least partially surrounds each of sidewalls of the lower insulating layer, sidewalls of the first active pattern and sidewalls of the second active pattern.

10. The semiconductor device of claim 9, wherein an upper surface of the lower insulating layer is formed to be higher than an upper surface of the lower wiring layer between the first source region and the third source region.

11. The semiconductor device of claim 9, wherein the lower insulating layer is spaced apart from the lower wiring layer in the second horizontal direction.

12. The semiconductor device of claim 1, further comprising:

an etch stop layer disposed along sidewalls of the first source region in the second horizontal direction; and an upper interlayer insulating layer covering the etch stop layer, wherein the through via is spaced apart from the etch stop layer in the second horizontal direction.

13. A semiconductor device comprising:

a lower interlayer insulating layer;

first and second active patterns extended in a first horizontal direction on the lower interlayer insulating layer, wherein the second active pattern is spaced apart from the first active pattern in a second horizontal direction that is different from the first horizontal direction;

first to fourth gate electrodes extended in the second horizontal direction on the first and second active patterns, wherein the first to fourth gate electrodes are sequentially spaced apart from one another in the first horizontal direction;

a gate cut extended in the first horizontal direction between the first active pattern and the second active pattern, wherein the gate cut separates each of the first to fourth gate electrodes in the second horizontal direction;

a first source region disposed on the first active pattern and between the first gate electrode and the second gate electrode;

a second source region disposed on the first active pattern and between the second gate electrode and the third gate electrode;

a first drain region disposed on the first active pattern and between the third gate electrode and the fourth gate electrode;

a third source region disposed on the second active pattern and between the first gate electrode and the second gate electrode;

a second drain region disposed on the second active pattern and between the second gate electrode and the third gate electrode;

a fourth source region disposed on the second active pattern and between the third gate electrode and the fourth gate electrode;

a first contact extended in the second horizontal direction between the first gate electrode and the second gate electrode, wherein the first contact is connected to each of the first and third source regions;

a second contact extended in the second horizontal direction between the second gate electrode and the third gate electrode, wherein the second contact is connected to the second source region;

a third contact extended in the second horizontal direction between the third gate electrode and the fourth gate electrode, wherein the third contact is connected to the first drain region;

a fourth contact extended in the second horizontal direction between the second gate electrode and the third gate electrode, wherein the fourth contact is spaced apart from the second contact in the second horizontal direction, and the fourth contact is connected to the second drain region;

a fifth contact extended in the second horizontal direction between the third gate electrode and the fourth gate electrode, wherein the fifth contact is spaced apart from the third contact in the second horizontal direction, and the fifth contact is connected to the fourth source region;

a lower wiring layer disposed inside the lower interlayer insulating layer, wherein the lower wiring layer is extended in the first horizontal direction below the gate cut; and a through via crossing the gate cut, wherein the through via connects the lower wiring layer with the first contact, wherein each of the second contact and the fourth contact is electrically insulated from the lower wiring layer between the second gate electrode and the third gate electrode, and wherein each of the third contact and the fifth contact is electrically insulated from the lower wiring layer between the third gate electrode and the fourth gate electrode.

14. The semiconductor device of claim 13, wherein the gate cut is spaced apart from each of the second to fifth contacts in the second horizontal direction.

15. The semiconductor device of claim 13, wherein the gate cut is spaced apart from the lower wiring layer in a vertical direction between the second source region and the second drain region and between the first drain region and the fourth source region.

16. The semiconductor device of claim 13, wherein, below the second gate electrode, the gate cut is spaced apart from the lower wiring layer in a vertical direction.

17. The semiconductor device of claim 13, wherein the lower wiring layer does not overlap each of the first and second active patterns in a vertical direction.

18. The semiconductor device of claim 13, further comprising:

an etch stop layer disposed along sidewalls of the first source region in the second horizontal direction; and an upper interlayer insulating layer covering the etch stop layer, wherein at least a portion of the through via is in contact with the etch stop layer.

19. The semiconductor device of claim 13, wherein the first contact and the through via are integrally formed, wherein each of the first contact and the through via includes a contact barrier layer and a contact filling layer, wherein the contact barrier layer form sidewalls and a bottom surface of the first contact and sidewalls and a bottom surface of the through via, and the contact filling layer is disposed on the contact barrier layer, and wherein the contact filling layer of the through via is in contact with the contact filling layer of the first contact.

20. A semiconductor device comprising:

a lower interlayer insulating layer;

first and second active patterns extended in a first horizontal direction on the lower interlayer insulating layer, the second active pattern spaced apart from the first active pattern in a second horizontal direction different from the first horizontal direction;

a first plurality of nanosheets stacked to be spaced apart from each other in a vertical direction on the first active pattern;

a second plurality of nanosheets stacked to be spaced apart from each other in the vertical direction on the second active pattern;

a gate electrode extended in the second horizontal direction, which is different from the first horizontal direction, on the first and second active patterns, wherein the gate electrode at least partially surrounds the first and second plurality of nanosheets;

a gate cut extended in the first horizontal direction between the first active pattern and the second active pattern, wherein the gate cut separates the gate electrode in the second horizontal direction;

a first source region disposed on a first side of the gate electrode on the first active pattern;

a second source region disposed on a second side of the gate electrode, which opposes the first side of the gate electrode in the first horizontal direction, on the first active pattern;

a third source region disposed on the first side of the gate electrode on the second active pattern;

a drain region disposed on the second side of the gate electrode on the second active pattern;

a first contact extended on the first side of the gate electrode in the second horizontal direction, wherein the first contact is connected to each of the first and third source regions;

a second contact extended on the second side of the gate electrode in the second horizontal direction, wherein the second contact is connected to the second source region;

a third contact extended on the second side of the gate electrode in the second horizontal direction, wherein the third contact is spaced apart from the second contact in the second horizontal direction, and is connected to the drain region;

a lower wiring layer disposed inside the lower interlayer insulating layer, wherein the lower wiring layer extends in the first horizontal direction between the first active pattern and the second active pattern, wherein at least a portion of the lower wiring layer protrudes from an upper surface of the lower interlayer insulating layer in the vertical direction below the first contact, wherein the lower wiring layer overlaps each of the first and second active patterns in the vertical direction;

a through via disposed between the first source region and the third source region, wherein the through via is integrally formed with the first contact, wherein the through via crosses the gate cut, and connects the lower wiring layer with the first contact;

a lower insulating layer disposed between the upper surface of the lower interlayer insulating layer and a lower surface of each of the first and second active patterns, the lower insulating layer being in contact with the lower wiring layer; and a field insulating layer disposed on the upper surface of the lower interlayer insulating layer, wherein the field insulating layer at least partially surrounds each of sidewalls of the lower insulating layer, sidewalls of the first active pattern and sidewalls of the second active pattern, wherein each of the second contact and the third contact is electrically insulated from the lower wiring layer between the second source region and the drain region, and wherein an upper surface of the lower insulating layer is formed to be higher than an upper surface of the lower wiring layer between the first source region and the third source region.

* * * * *